US009991297B2

(12) United States Patent
Iizuka et al.

(10) Patent No.: US 9,991,297 B2
(45) Date of Patent: Jun. 5, 2018

(54) IMAGING DEVICE AND MANUFACTURING METHOD THEREOF

(71) Applicant: RENESAS ELECTRONICS CORPORATION, Tokyo (JP)

(72) Inventors: Koji Iizuka, Ibaraki (JP); Takahiro Tomimatsu, Ibaraki (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 0 days. days.

(21) Appl. No.: 15/200,803

(22) Filed: Jul. 1, 2016

(65) Prior Publication Data
US 2017/0040360 A1 Feb. 9, 2017

(30) Foreign Application Priority Data
Aug. 7, 2015 (JP) .................................. 2015-157098

(51) Int. Cl.
*H01L 27/148* (2006.01)
*H01L 27/146* (2006.01)
*H01L 21/00* (2006.01)

(52) U.S. Cl.
CPC .... *H01L 27/14605* (2013.01); *H01L 27/1461* (2013.01); *H01L 27/14645* (2013.01); *H01L 27/14689* (2013.01); *H01L 27/14698* (2013.01); *H01L 27/1462* (2013.01); *H01L 27/1463* (2013.01)

(58) Field of Classification Search
CPC ........... H01L 27/14605; H01L 27/1461; H01L 27/14698; H01L 27/14645; H01L 27/14689; H01L 27/1463; H01L 27/1462
See application file for complete search history.

(56) References Cited

U.S. PATENT DOCUMENTS

| 6,346,722 B1* | 2/2002 | Kawakami ........ H01L 27/14683 257/215 |
| 6,819,360 B1 | 11/2004 | Ide et al. |
| 8,183,657 B2* | 5/2012 | Kuwazawa ....... H01L 27/14609 257/443 |
| 2006/0065915 A1* | 3/2006 | Kuwazawa ....... H01L 27/14603 257/292 |
| 2006/0237629 A1* | 10/2006 | Oda ................... H01L 27/14818 250/208.1 |
| 2009/0140367 A1* | 6/2009 | Iwai ........................ H01L 31/10 257/462 |

FOREIGN PATENT DOCUMENTS

JP 2000-292685 A 10/2000

* cited by examiner

Primary Examiner — Su C Kim
(74) Attorney, Agent, or Firm — McDermott Will & Emery LLP

(57) ABSTRACT

An imaging device is provided, in which the dynamic range of still pictures can be suppressed from being decreased. In the imaging device, a photodiode including an n-type impurity region and a photodiode including an n-type impurity region are formed in a p-type well. An n-type impurity region is formed between the n-type impurity region on one side and that on the other side so as to contact each of the two. The impurity concentration of the last-formed n-type impurity region is set to be lower than those of the first-formed n-type impurity regions.

8 Claims, 56 Drawing Sheets

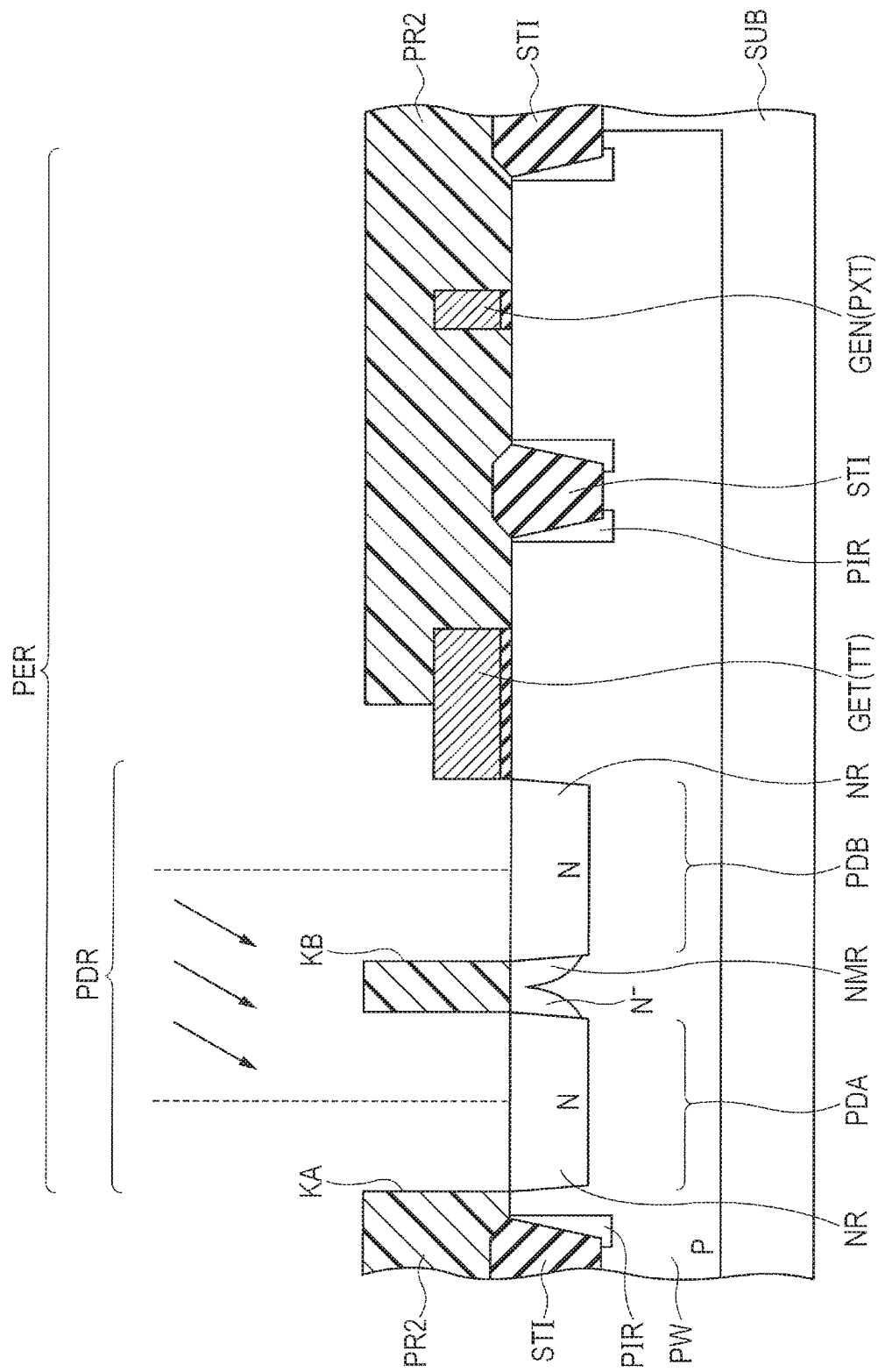

IMAGING DEVICE AND MANUFACTURING METHOD THEREOF

CROSS-REFERENCE TO RELATED APPLICATIONS

The disclosure of Japanese Patent Application No. 2015-157098 filed on Aug. 7, 2015 including the specification, drawings and abstract is incorporated herein by reference in its entirety.

BACKGROUND

The present invention relates to an imaging device and a manufacturing method thereof, and can be preferably used in an imaging device in which, for example, two photodiodes are formed per pixel.

Imaging devices include one in which two photodiodes are formed per pixel. In such an imaging device, electrons generated in the two photodiodes are used for adjusting a focus (auto focusing) and for still pictures. A focus is adjusted based on the difference between electrons generated, of the two photodiodes, in one photodiode and electrons generated in the other photodiode. Because every pixel can be used for auto focusing in principle, it is said that a focus can be quickly adjusted and in particular a moving picture can be smoothly taken.

On the other hand, a still picture is taken by adding electrons generated in one photodiode to those generated in the other photodiode. That is, a still picture is taken based on the sum of electrons generated in the two photodiodes. As one example of Patent Documents in which such an imaging device is disclosed, Patent Document 1 can be cited.

RELATED ART DOCUMENT

Patent Document

[Patent Document 1] Japanese Unexamined Patent Application Publication No. 2000-292685

SUMMARY

In a photodiode, a capacitance in which generated electrons can be stored is limited, the capacitance being referred to as the number of saturated electrons. When the number of generated electrons becomes larger than the number of saturated electrons, the electrons that cannot be stored may leak from the region where the photodiode is formed into other regions.

When a focus is adjusted or when a moving picture is taken, a timing (interval of time), at which an electron generated in a photodiode is transported by a transfer transistor, is relatively short, and hence an electron generated in the photodiode is transferred to a floating diffusion region by the transfer transistor before the number of saturated electrons is reached.

On the other hand, when a still picture is taken, the timing is relatively long, and hence the number of the generated electrons reaches the number of saturated electrons, and the electrons that cannot be stored may leak from the region where the photodiode is formed into other regions. As described above, a still picture is taken based on the sum of electrons generated in two photodiodes.

Accordingly, there is the problem that, if the number of the generated electrons becomes larger than the number of saturated electrons and if an electron leaks from the region where the photodiode is formed into another region, the data in the pixel cannot be used as data for still pictures and hence the dynamic range of still pictures is decreased.

Other problems and new characteristics will become clear from the description and accompanying drawings of the present specification.

An imaging device according to one embodiment includes: an element formation region of a first conductivity type; a photoelectric conversion first part including an impurity region first part of a second conductivity type; a photoelectric conversion second part including an impurity region second part of the second conductivity type; and an impurity region third part of the second conductivity type. The impurity region third part is formed between the photoelectric conversion first part and the photoelectric conversion second part so as to contact the impurity region first part and the impurity region second part. The impurity concentration of the impurity region third part is set to be lower than those of the impurity region first part and the impurity region second part.

A manufacturing method of an imaging device according to another embodiment is a manufacturing method of an imaging device provided with a photoelectric conversion first part and a photoelectric conversion second part, and includes the following steps. An element formation region of a first conductivity type is formed in a semiconductor substrate. A first mask member, having both a first opening exposing, in the element formation region, a region first part where the photoelectric conversion first part is to be formed and a second opening exposing, in the element formation region, a region second part where the photoelectric conversion second part is to be formed to be spaced apart from the photoelectric conversion first part, is formed. A first injection amount of first impurities of a second conductivity type are injected by using the first mask member as an injection mask. A second mask member, having a third opening continuously exposing, in the element formation region, the region first part, the region second part, and a region third part of the element formation region, located between the region first part and the region second part, is formed. A second injection amount of second impurities of the second conductivity type are injected by using the second mask member as an injection mask. An impurity region first part of the second conductivity type is formed in the region first part by the step of injecting the first impurities and the step of injecting the second impurities. An impurity region second part of the second conductivity type is formed in the region second part. An impurity region third part of the second conductivity type, having an impurity concentration lower than those of the impurity region first part and the impurity region second part, is formed in the region third part.

According to an imaging device of one embodiment, the dynamic range of still pictures can be suppressed from being decreased.

According to a manufacturing method of an imaging device of another embodiment, an imaging device can be manufactured, in which the dynamic range of still pictures can be suppressed from being decreased.

BRIEF DESCRIPTION OF THE DRAWINGS

FIG. 57 is a sectional view taken along Sectional Line LVII-LVII illustrated in FIG. 56, in Tenth Embodiment.

DETAILED DESCRIPTION

Figure 1:
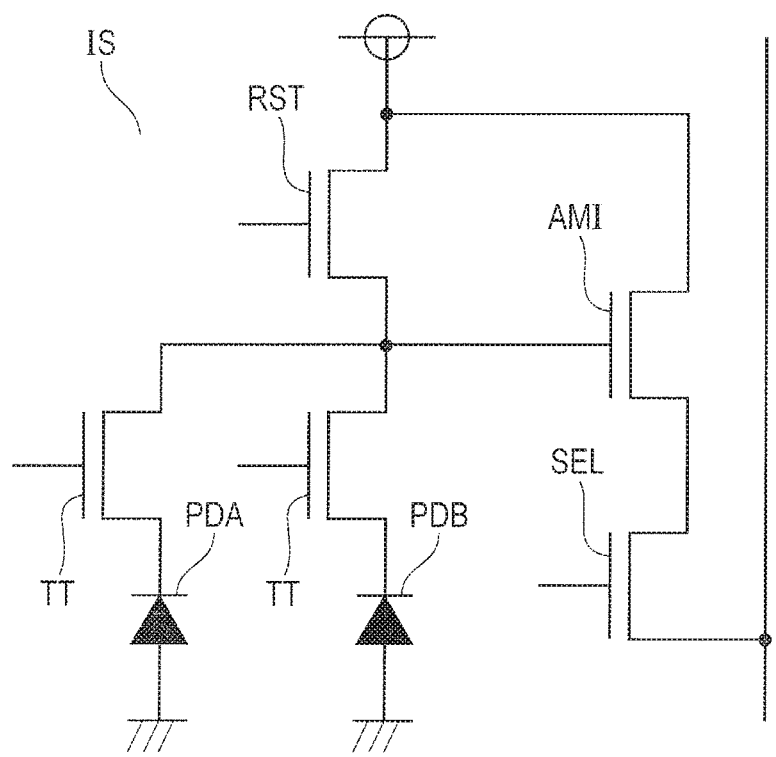
FIG. 1 is a circuit view of a pixel in an imaging device according to each embodiment.

The circuit of a pixel in an imaging device will be first described briefly. As illustrated in FIG. 1, one pixel in an imaging device IS has two photodiodes PD. The charges generated in the two photodiodes PD are to be controlled by five transistors including two transfer transistors TT, one amplifier transistor AMI, one select transistor SEL, and one reset transistor RST. Hereinafter, the structure of the pixel will be specifically described in each embodiment.

First Embodiment

Herein, a first example of an imaging device will be described, the imaging device being provided, between two photodiodes, with an n-type impurity region having a relatively low impurity concentration.

Figure 2:
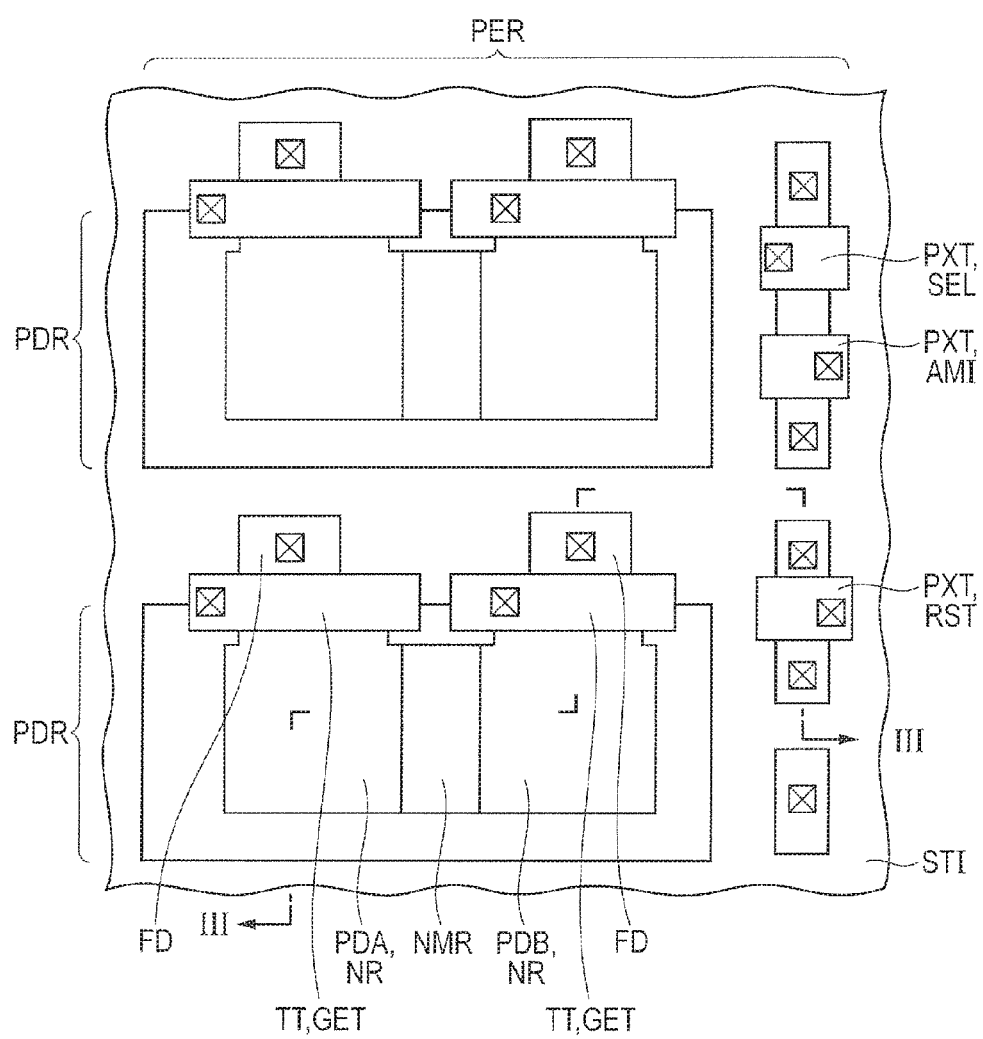
FIG. 2 is a plan view of an imaging device according to First Embodiment.
Figure 3:
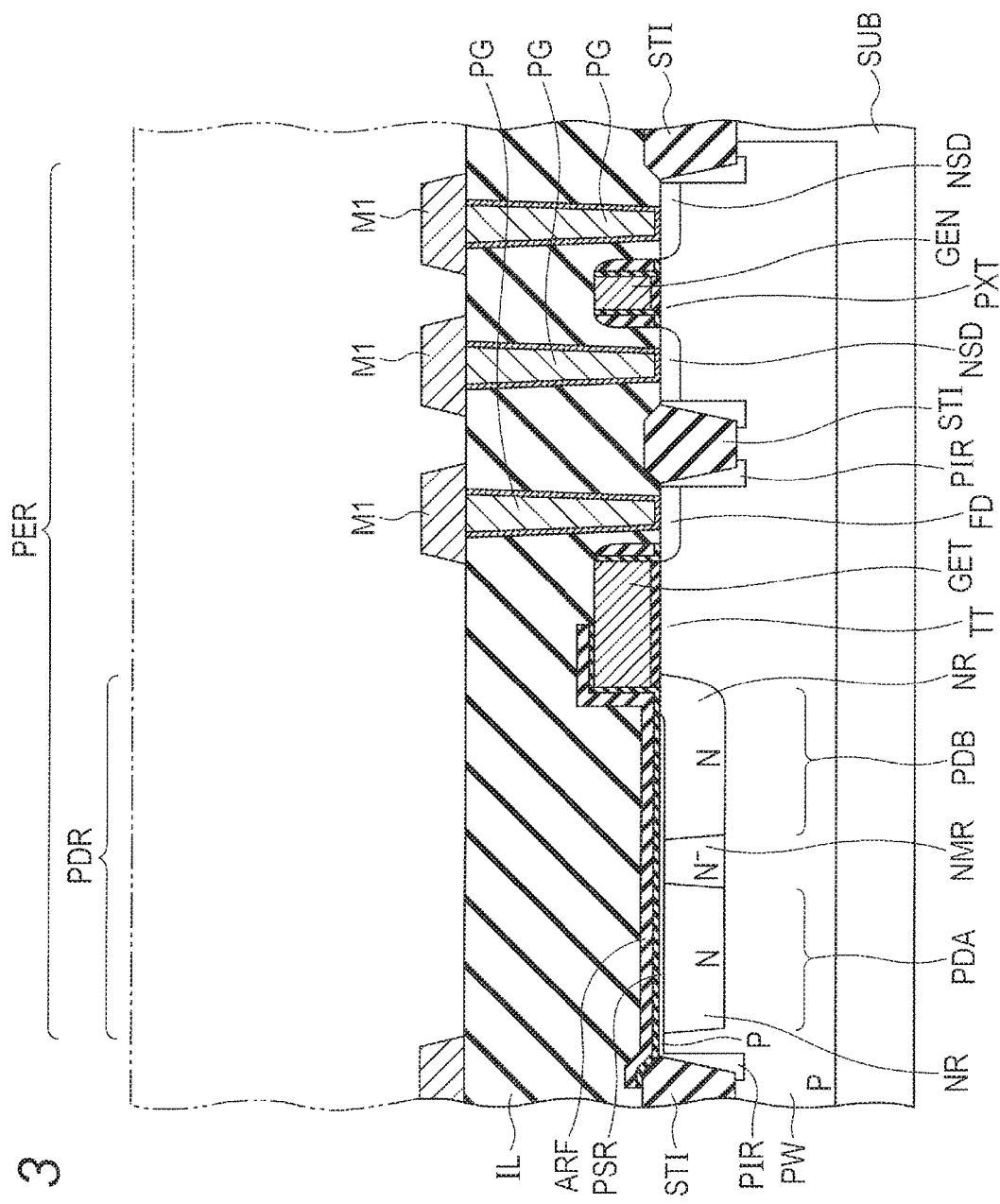
FIG. 3 is a sectional view taken along Sectional Line III-III illustrated in FIG. 2, in First Embodiment.

As illustrated in FIGS. 2 and 3, a pixel region PER is defined in the surface of a semiconductor substrate SUB by an isolation insulating film STI, and a p-type well PW (element formation region) is formed in the pixel region PER. A photodiode formation region PDR is defined in the p-type well PW. The amplifier transistor AMI, the select transistor SEL, and the reset transistor RST are formed in the pixel region PER as pixel transistors PXT. The pixel transistors PXT, such as the amplifier transistor AMI, are formed from a gate electrode GEN, source/drain regions NSD, and the like.

Both a photodiode PDA (photoelectric conversion first part) and a photodiode PDB (photoelectric conversion second part) are formed in one photodiode formation region PDR. Each of the photodiode PDA and the photodiode PDB includes an n-type impurity region NR. The photodiode PDA and the photodiode PDB are formed to be spaced apart from each other.

An n-type impurity region NMR is formed in a portion of the p-type well PW located between the photodiode PDA and the photodiode PDB. The n-type impurity region NMR is formed to contact each of the n-type impurity region NR on one side and that on the other side. The impurity concentration of the n-type impurity region NMR is set to be lower than that of the n-type impurity region NR. A p-type impurity region PSR is formed to contact the n-type impurity regions NR and NMR. An antireflection film ARF, etc., are formed to cover the photodiodes PDA and PDB (p-type impurity region PSR), etc.

A gate electrode GET of the transfer transistor TT and a floating diffusion region FD are formed in the lateral of the photodiode formation region PDR. The electrons generated in the photodiodes PDA and PDB are transferred to the floating diffusion region FD by the gate electrode GET. The transferred electrons are temporarily stored in the floating diffusion region FD.

A first interlayer insulating film IL1 is formed to cover the photodiodes PDA and PDB, the gate electrodes GET and GEN, and the like. A plurality of plugs PG are formed to penetrate the first interlayer insulating film. One plug PG is electrically coupled to the floating diffusion region FD. Another plug PG is electrically coupled to one of a pair of the source/drain regions NSD. Still another plug PG is electrically coupled to the other of the source/drain regions NSD. First wiring M1 is coupled to each of the plugs PG.

Further, a plurality of wiring and an interlayer insulating film (neither is illustrated) are formed to cover the first wiring M1. Furthermore, a passivation film, a color filter, a microlens, and the like (neither is illustrated) are formed to cover the interlayer insulating film (see the two-dot chain line frame). Main parts of the imaging device are constituted as described above.

Figure 4:
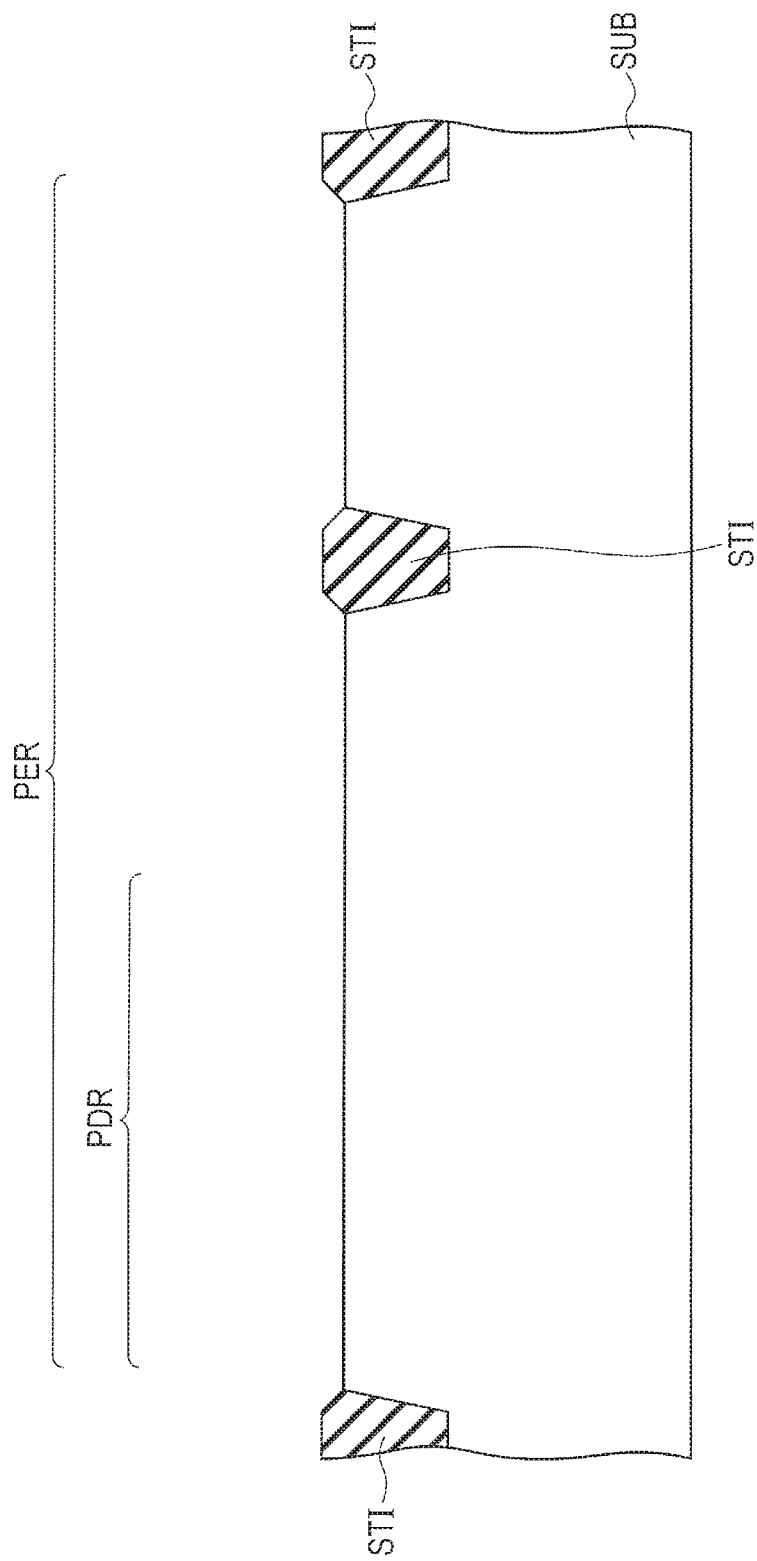
FIG. 4 is a sectional view illustrating one step of a manufacturing method of an imaging device, in First Embodiment.
Figure 5:
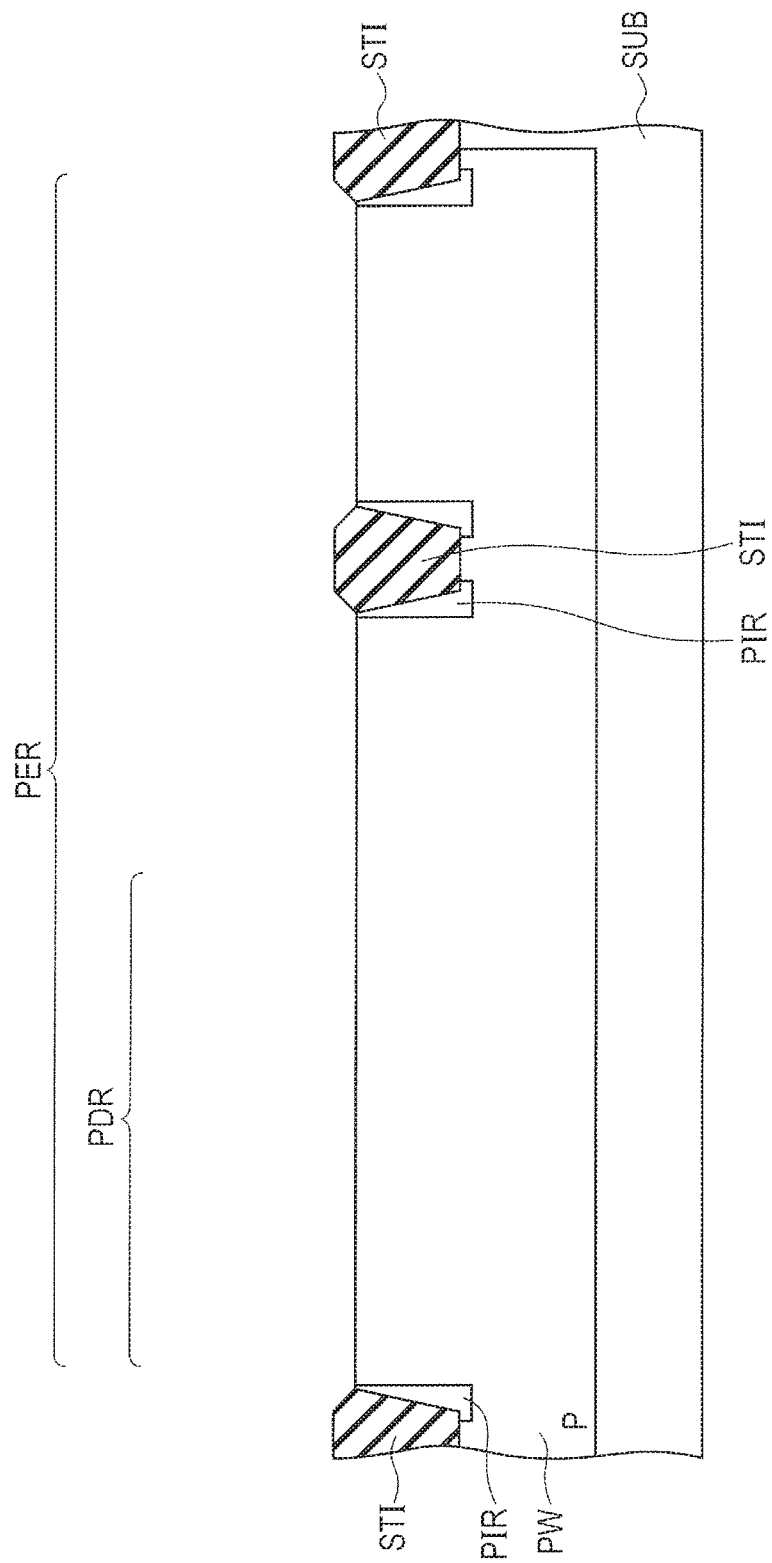
FIG. 5 is a sectional view illustrating a step performed after the step illustrated in FIG. 4, in First Embodiment.
Figure 6:
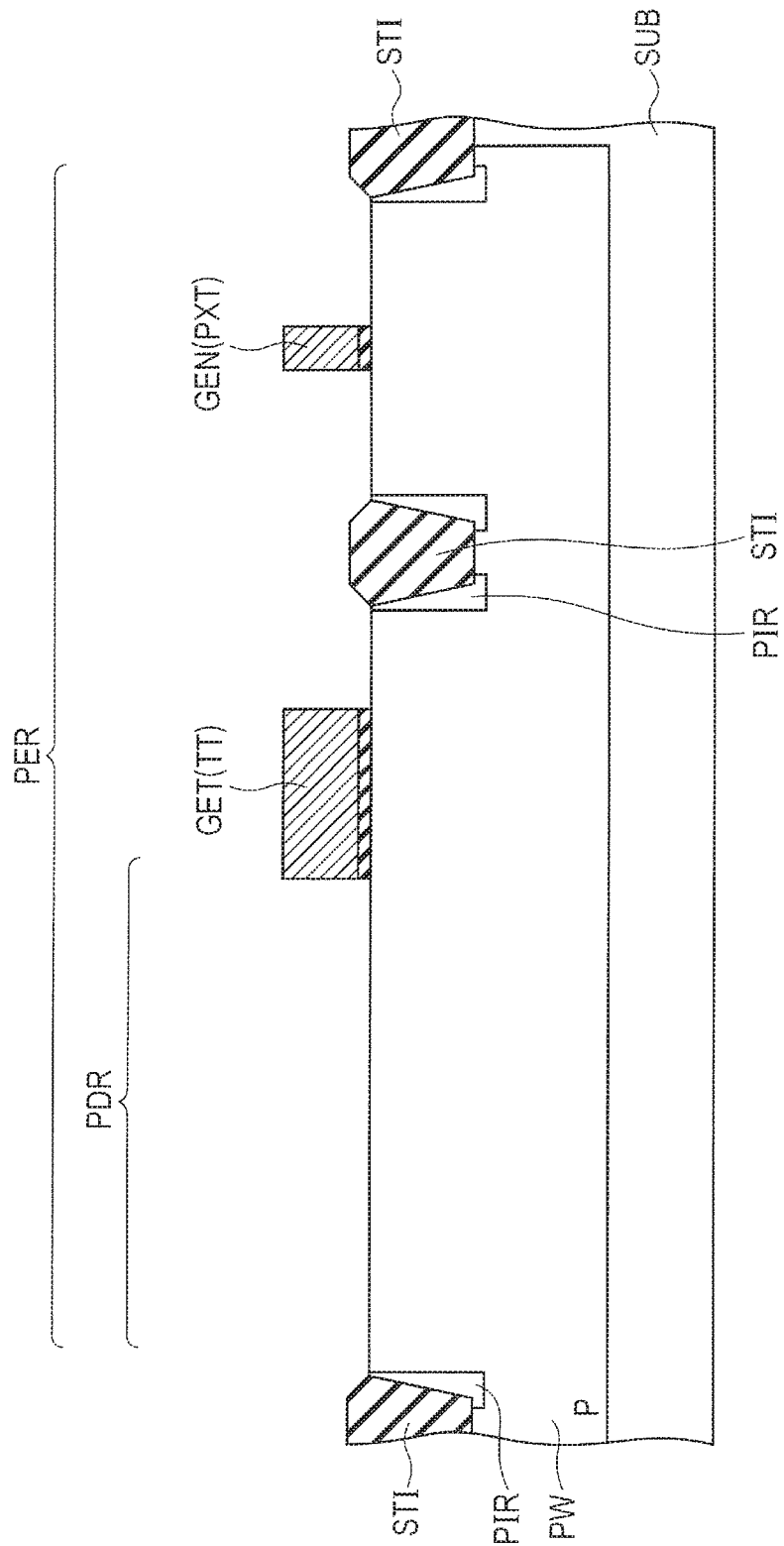
FIG. 6 is a sectional view illustrating a step performed after the step illustrated in FIG. 5, in First Embodiment.

Subsequently, an example of a manufacturing method of the aforementioned imaging device will be described. As illustrated in FIG. 4, the isolation insulating film STI is first formed, for example, by a trench isolation method. The pixel region PER, etc., are defined by the isolation insulating film STI. Subsequently, the p-type well PW, which will serve as an element formation region, is formed as illustrated in FIG. 5. Further, a p-type isolation injection region PIR is formed around the isolation insulating film STI. Subsequently, the gate electrode GET of the transfer transistor TT and the gate electrode GEN of the pixel transistor PXT are formed as illustrated in FIG. 6.

Figure 7:
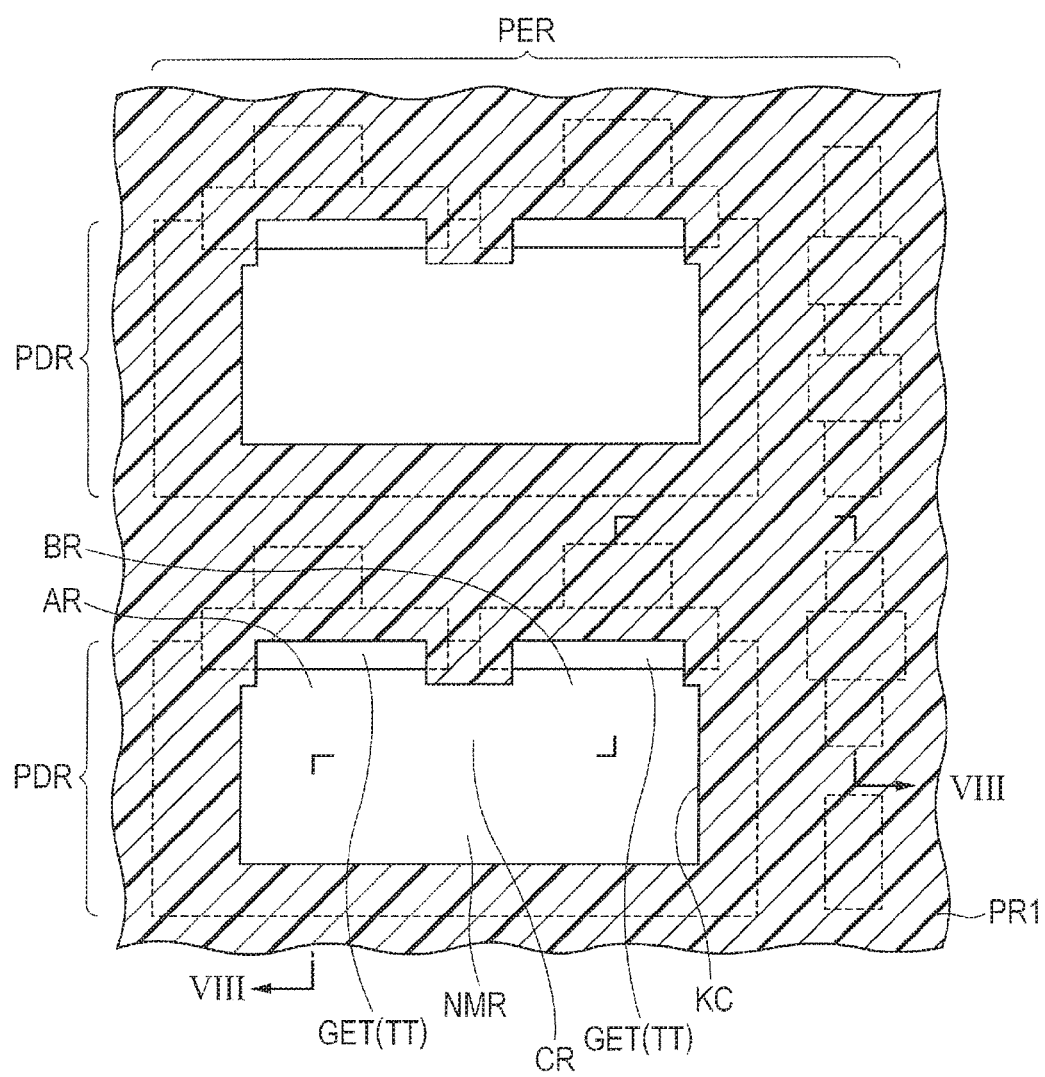
FIG. 7 is a plan view illustrating a step performed after the step illustrated in FIG. 6, in First Embodiment.
Figure 8:
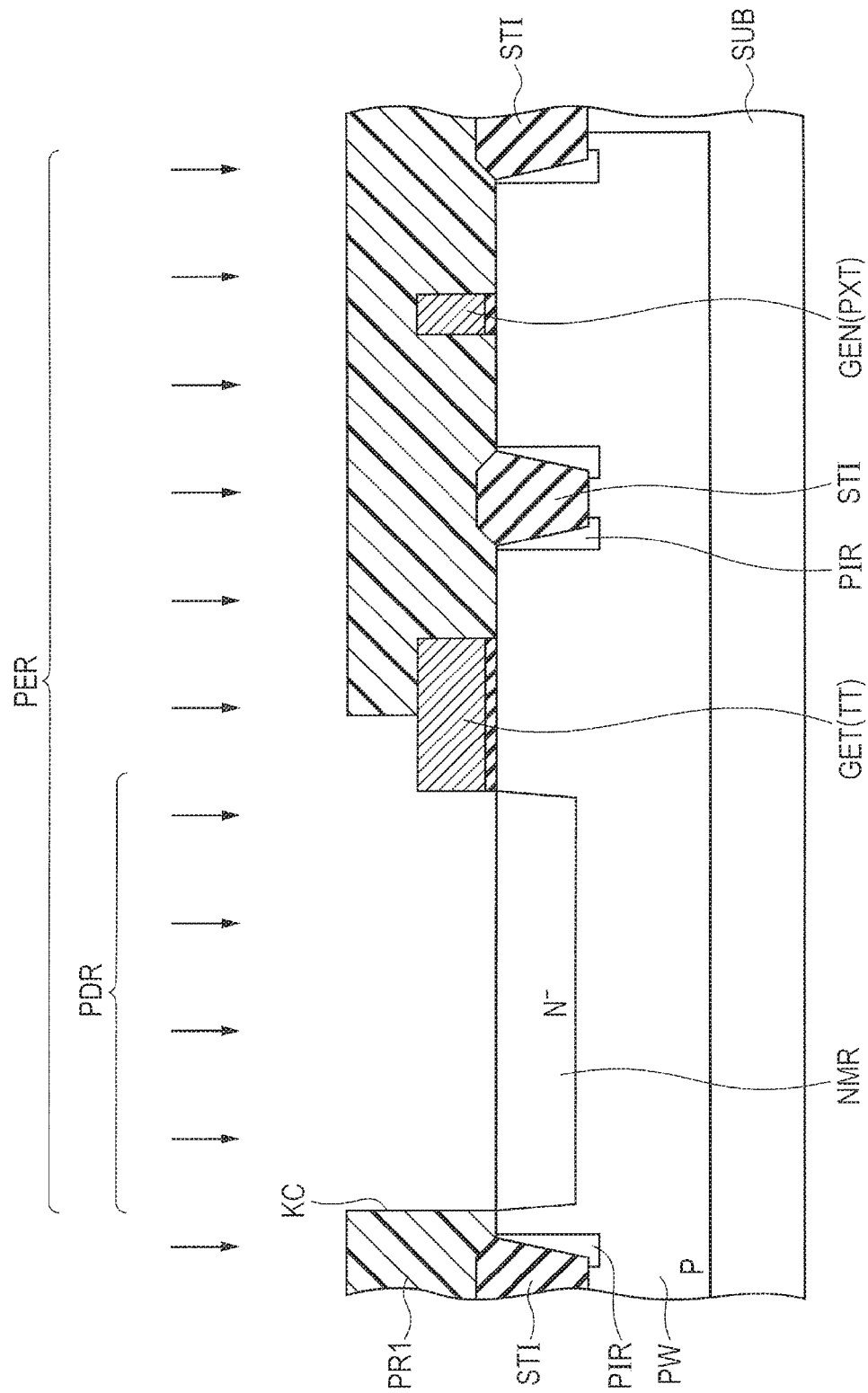
FIG. 8 is a sectional view taken along Sectional Line VIII-VIII illustrated in FIG. 7, in First Embodiment.

Subsequently, a photoresist pattern PR1 is formed by performing a predetermined photoengraving process, as illustrated in FIGS. 7 and 8. In the photoresist pattern PR1, an opening KC (third opening), continuously exposing a region AR (region first part) where the photodiode PDA is to be formed, a region BR (region second part) where the photodiode PDB is to be formed, and a region CR (region third part) located between the region AR and the region BR, is formed. Subsequently, a predetermined injection amount (second injection amount) of n-type impurities are injected by using the photoresist pattern PR1 as an injection mask. Thereby, the n-type impurity region NMR is formed in the exposed p-type wells PW (region AR, region BR, region CR). Thereafter, the photoresist pattern PR1 is removed.

Figure 9:
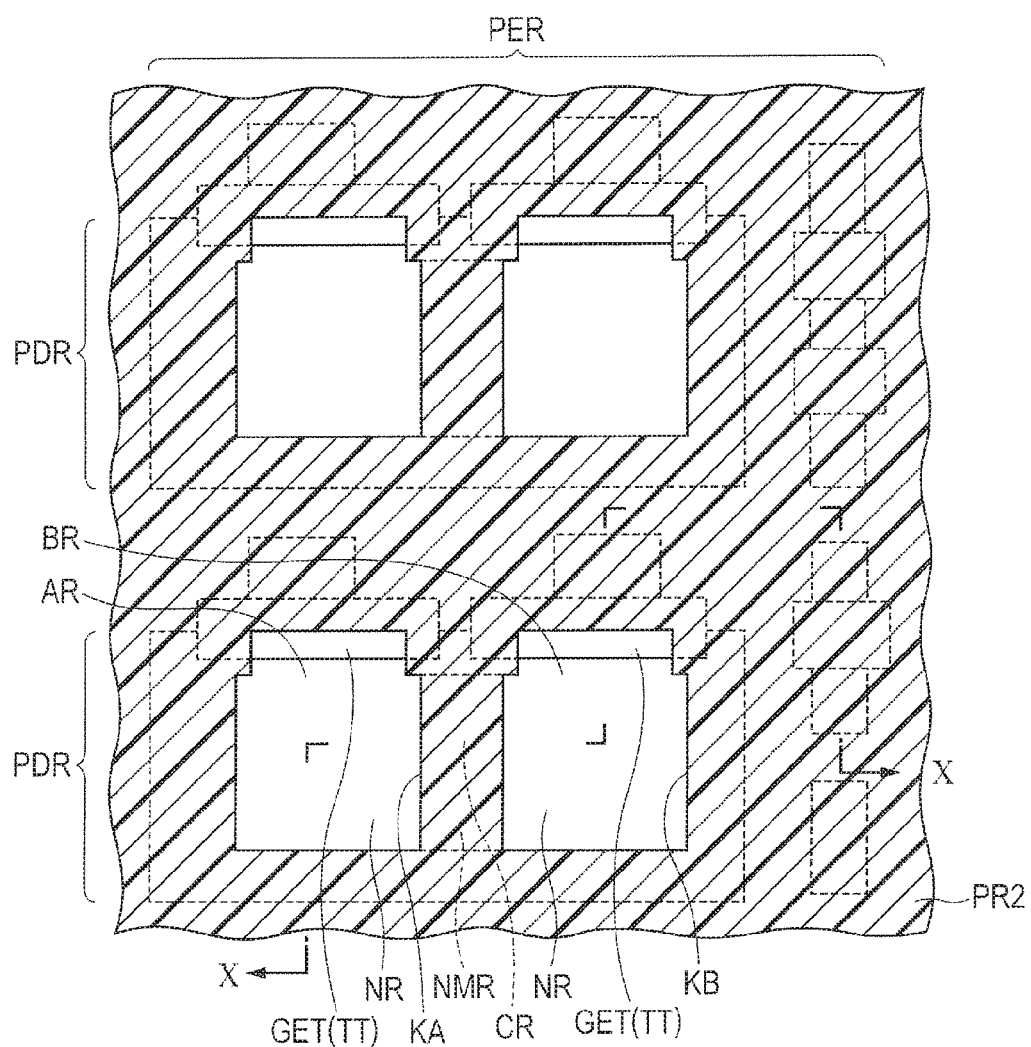
FIG. 9 is a plan view illustrating a step performed after the step illustrated in FIGS. 7 and 8, in First Embodiment.
Figure 10:
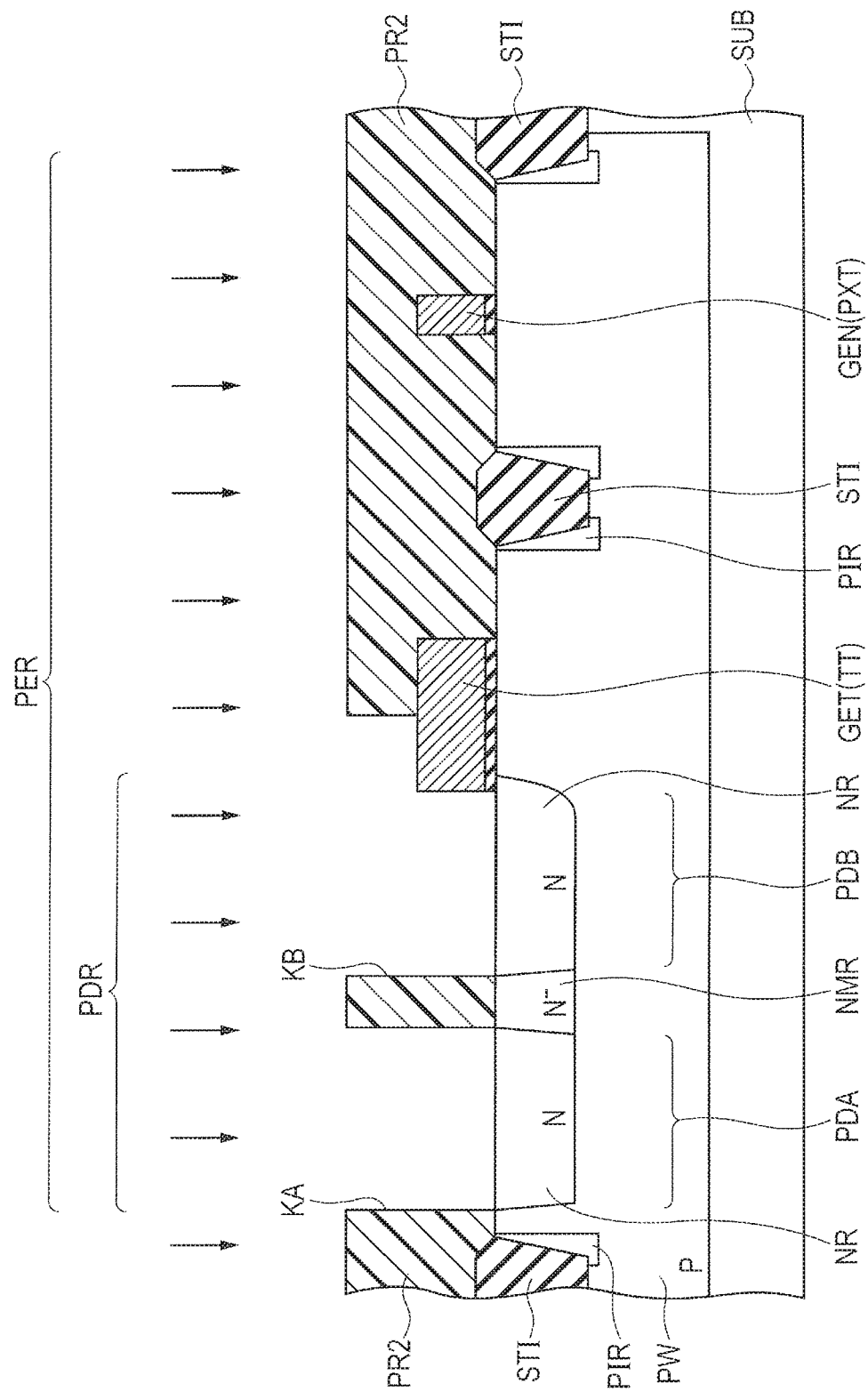
FIG. 10 is a sectional view taken along Sectional Line X-X illustrated in FIG. 9, in First Embodiment.

Subsequently, a photoresist pattern PR2 is formed by performing a predetermined photoengraving process, as illustrated in FIGS. 9 and 10. In the photoresist pattern PR2, an opening KA (first opening) exposing the region AR where the photodiode PDA is to be formed, and an opening KB (second opening) exposing the region BR where the photodiode PDB is to be formed, are formed to be spaced apart from each other.

Subsequently, another predetermined injection amount (first injection amount) of n-type impurities are injected by using the photoresist pattern PR2 as an injection mask. Thereby, the n-type impurity region NR is formed in each of the exposed p-type wells PW (region AR, region BR) in conjunction with the first injection. The impurity concentration of the n-type impurity region NR becomes higher than that of the n-type impurity region NMR. Alternatively, the step, in which n-type impurities are injected by using the photoresist pattern PR1 as an injection mask, may be performed after the step, in which n-type impurities are injected by using the photoresist pattern PR2 as an injection mask, is performed.

Figure 11:
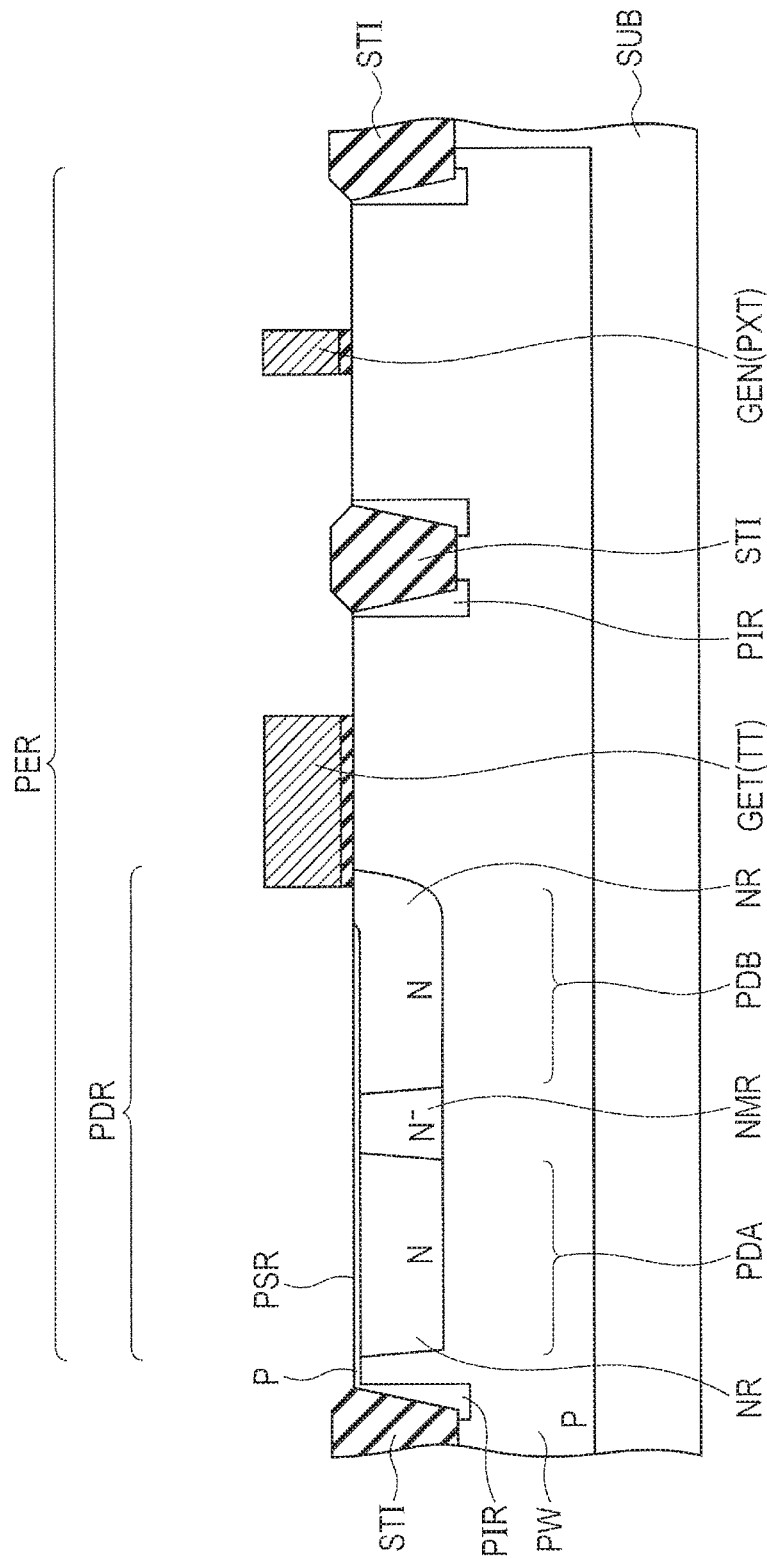
FIG. 11 is a sectional view illustrating a step performed after the step illustrated in FIGS. 9 and 10, in First Embodiment.
Figure 12:
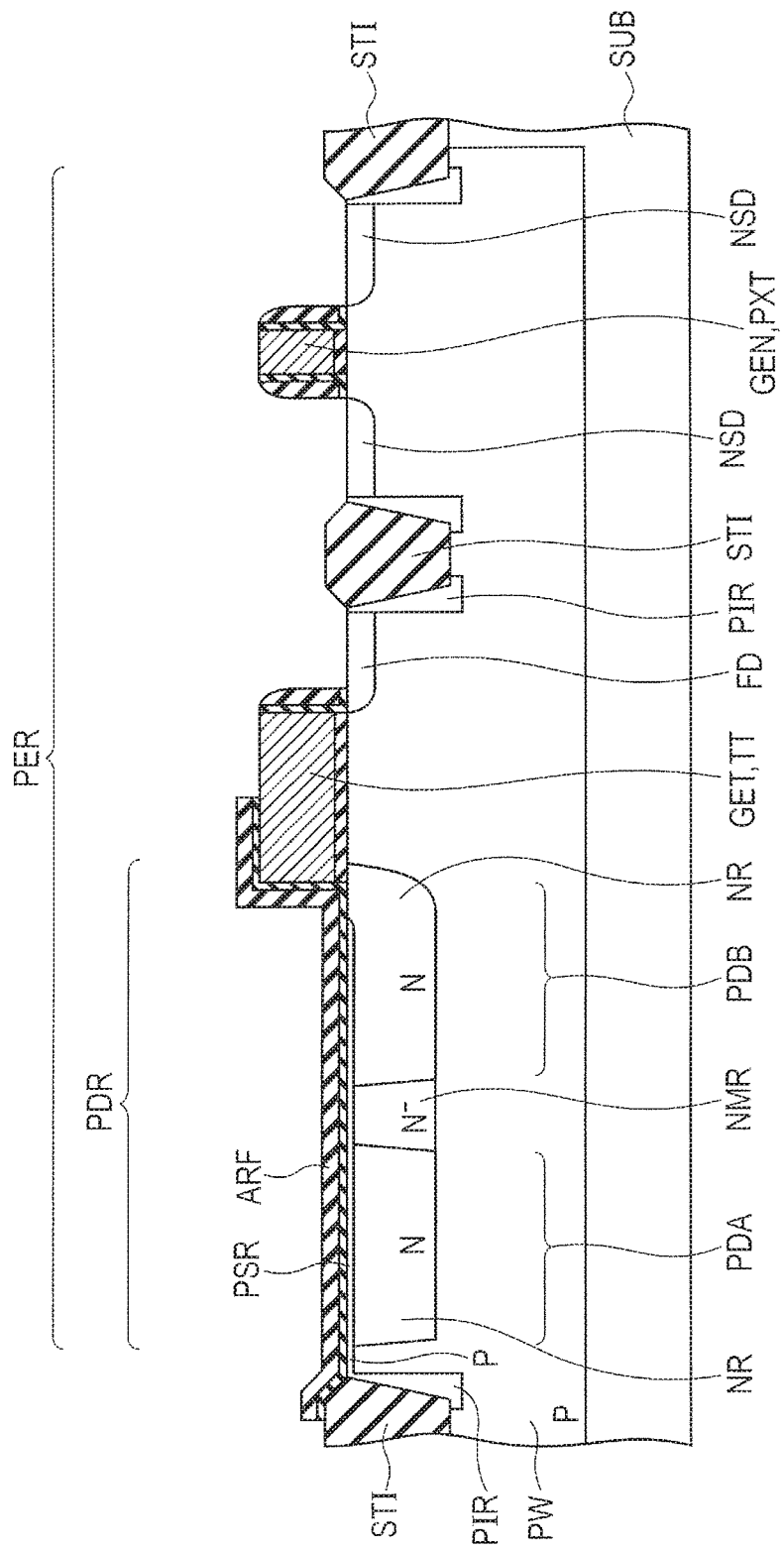
FIG. 12 is a sectional view illustrating a step performed after the step illustrated in FIG. 11, in First Embodiment.

After the n-type impurity region NR is formed, the photoresist pattern PR2 is removed. Subsequently, the p-type impurity region PSR is formed in the photodiode formation region PDR by injecting p-type impurities, as illustrated in FIG. 11. Subsequently, the antireflection film ARF, etc., are formed in the photodiode formation region PDR, as illustrated in FIG. 12. Further, the floating diffusion region FD and the source/drain regions NSD of the pixel transistor PXT are formed by injecting n-type impurities. The photodiodes PDA and PDB, the transfer transistor TT, and the pixel transistors PXT, such as an amplifier transistor, are thus formed in the pixel region PER.

Figure 13:
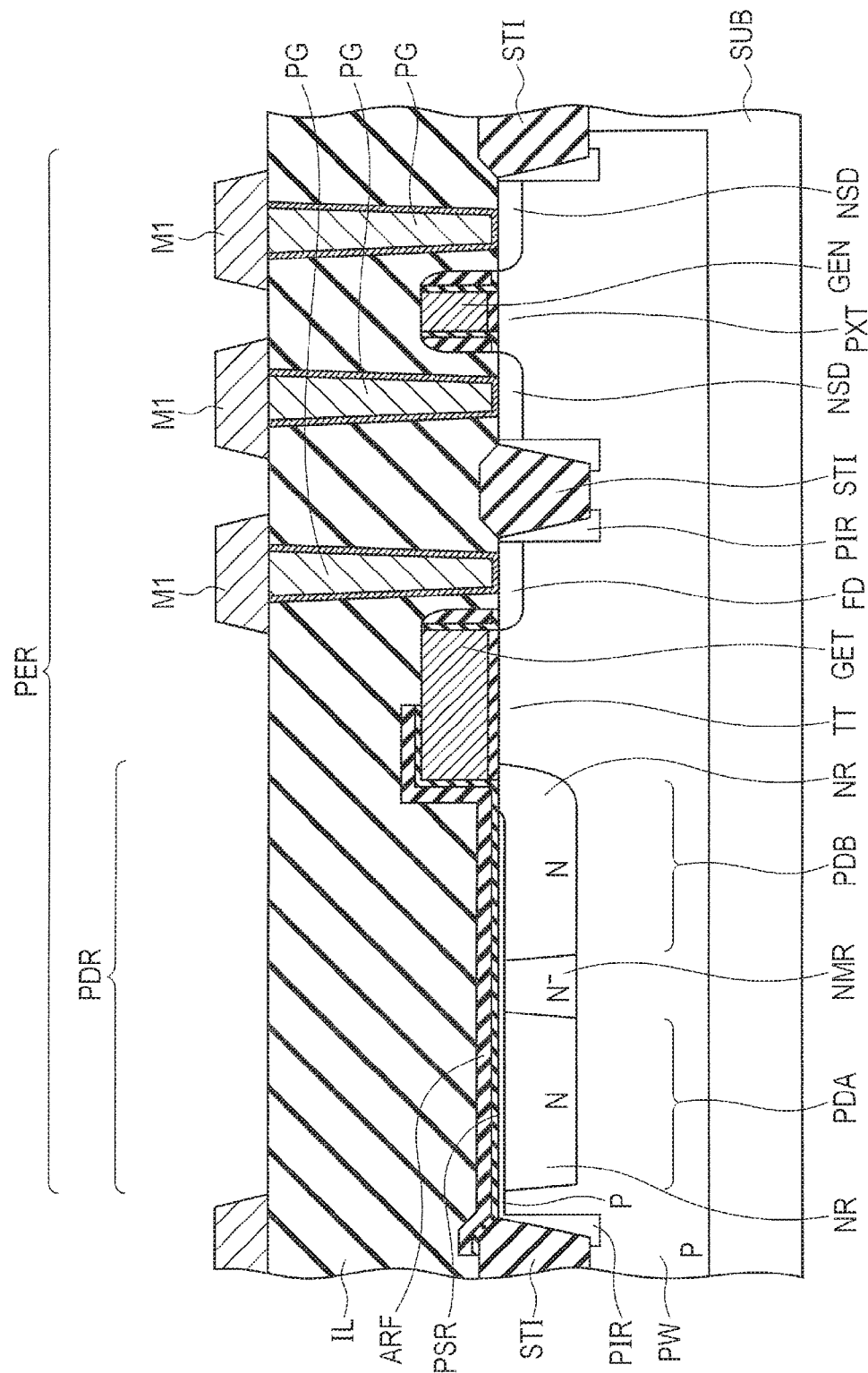
FIG. 13 is a sectional view illustrating a step performed after the step illustrated in FIG. 12, in First Embodiment.

Subsequently, the first interlayer insulating film IL is formed, for example, by a silicon oxide film, or the like, so as to cover the photodiodes PDA and PDB, the transfer transistor TT, and the like, as illustrated in FIG. 13. Subsequently, the plugs PG each penetrating the first interlayer insulating film IL are formed. The first wiring M1 to be coupled to the plugs PG are formed over the surface of the first interlayer insulating film IL. Thereafter, main parts of the imaging device illustrated in FIGS. 2 and 3 are completed by forming a plurality of interlayer insulating films, a plurality of wiring, a passivation film, a color filter, a microlens, and the like (neither is illustrated).

In the aforementioned imaging device, the n-type impurity region NMR is formed between the n-type impurity region NR of the photodiode PDA and that of the photodiode PDB. The impurity concentration of the n-type impurity region NMR is lower than those of the n-type impurity regions NR. Thereby, electrons can be prevented from leaking, for example, into the floating diffusion region FD from the photodiode formation region PDR, if the number of generated electrons becomes larger than the number of saturated electrons when a still picture is taken. This will be described in comparison with an imaging device according to a comparative example.

Figure 14:
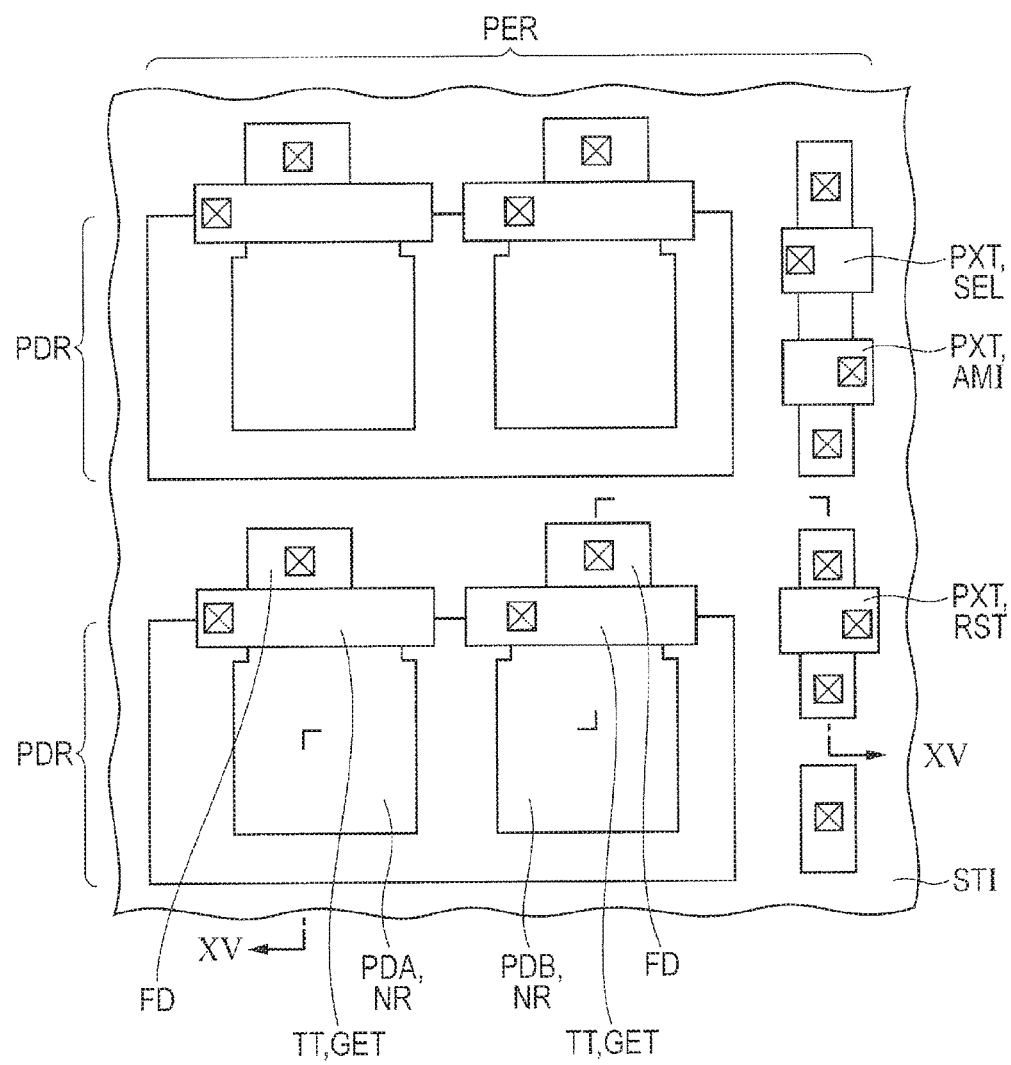
FIG. 14 is a plan view of an imaging device according to a comparative example.
Figure 15:
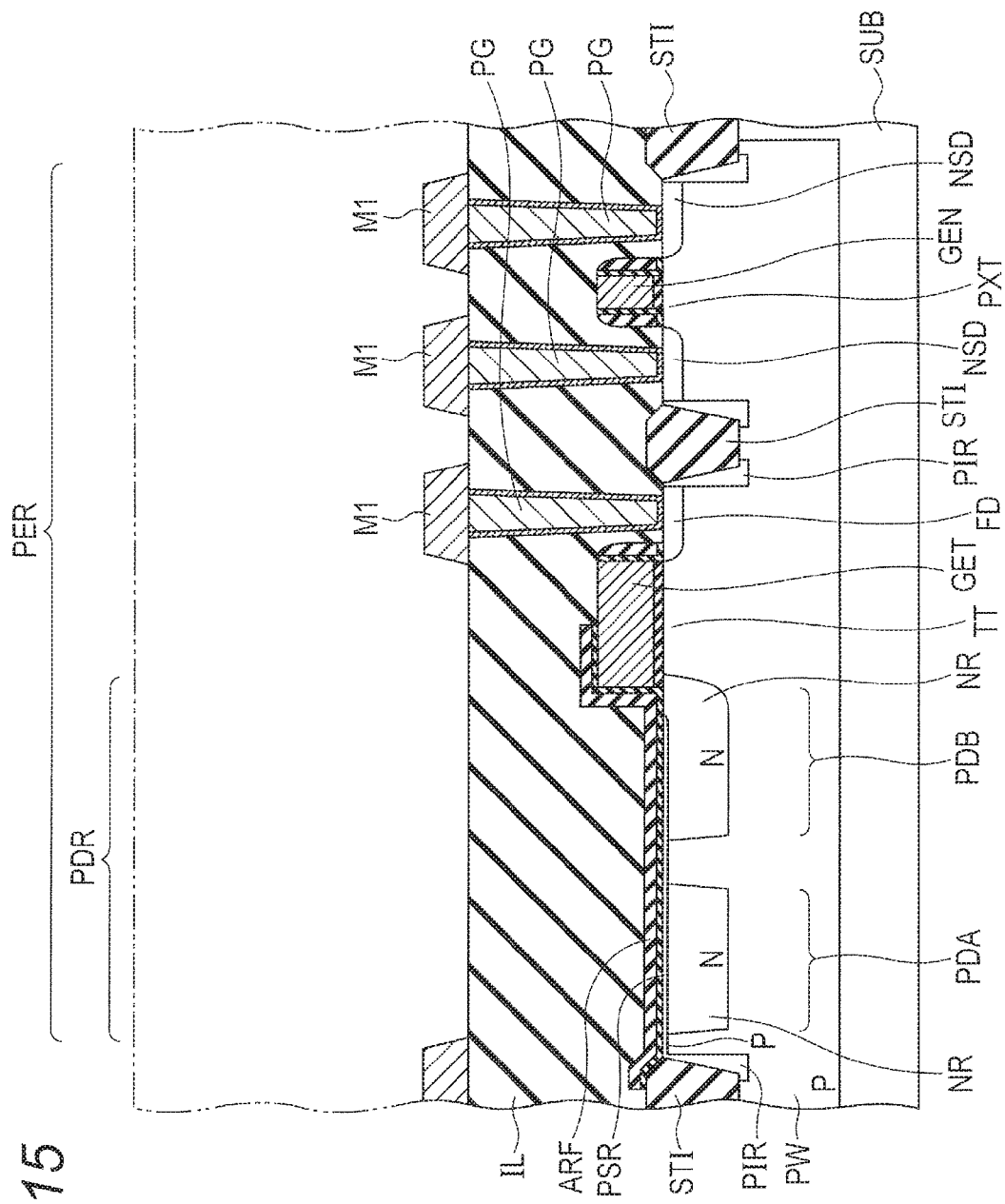
FIG. 15 is a sectional view taken along Sectional Line XV-XV illustrated in FIG. 14.

In an imaging device according to a comparative example, a portion of the p-type well PW is located between the n-type impurity region NR of the photodiode PDA and that of the photodiode PDB, as illustrated in FIGS. 14 and 15. Because the configurations other than this are similar to those of the imaging device illustrated in FIGS. 2 and 3, like members will be denoted with like reference numerals, and description thereof will not be repeated unless it is necessary.

Figure 16:
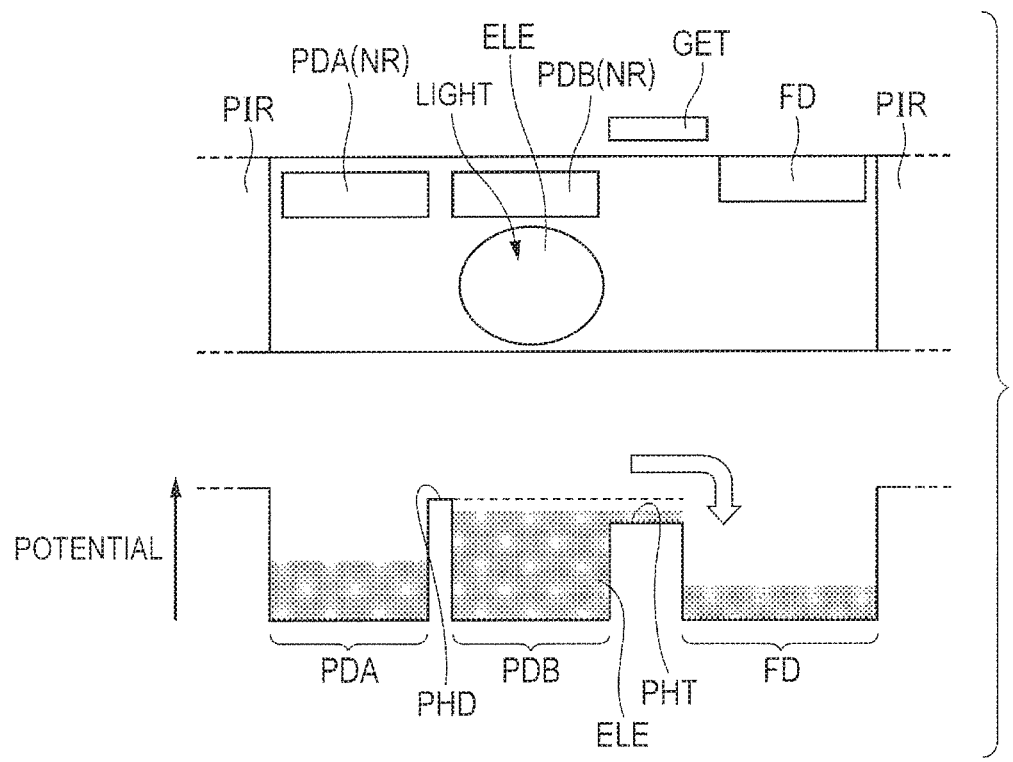
FIG. 16 is a view for explaining a problem in an imaging device according to a comparative example, in which both a structure of a region where a photodiode is formed and a potential corresponding to the structure are schematically illustrated.

FIG. 16 is sectional views schematically illustrating a photodiode in a state in which a still picture is being taken in the imaging device according to a comparative example, in which: the upper view is a sectional view schematically illustrating a situation in which an electron is generated when light enters; and the lower view is a sectional view schematically illustrating both a situation in which the generated electron is stored and the relationship with a potential.

When an electron is caused to be stored, a transfer transistor is in an off-state and a potential height PHT (potential barrier) of the region where the gate electrode GET is located is sufficiently high. On the other hand, when the stored electron is caused to be transferred, the transfer transistor is in an on-state and the potential height PHT becomes low, thereby allowing the electron to be transferred to the floating diffusion region FD.

Because a timing, at which the electrons generated in the photodiodes PDA and PDB are transported by the transfer transistor TT, is relatively long in a state where a still picture is being taken, the number of the electrons ELE generated, for example, in one photodiode PDB may easily reach the number of saturated electrons. At the time, a potential height PHD of the region located between the adjacent photodiodes PDA and PDB is higher than the potential height PHT of the region where the gate electrode GET of the transfer transistor TT in an off-state is located. Accordingly, the electrons, which are not included in the number of saturated electrons, are to flow into the floating diffusion region FD, as illustrated in the lower view of FIG. 16 (see the double-arrow). That is, the overflowing electrons are to leak into the floating diffusion region FD.

A still picture is taken based on the sum of the electrons generated in the two photodiodes PDA and PDB. Accordingly, if the overflowing electrons leak out, the data in the pixel cannot be used as data for still pictures, and hence the dynamic range of still pictures is decreased.

In the imaging device according to First Embodiment with respect to the imaging device according to the comparative example, the n-type impurity region NMR, having an impurity concentration lower than that of the n-type impurity region NR, is formed between the photodiode PDA and the photodiode PDB.

Figure 17:
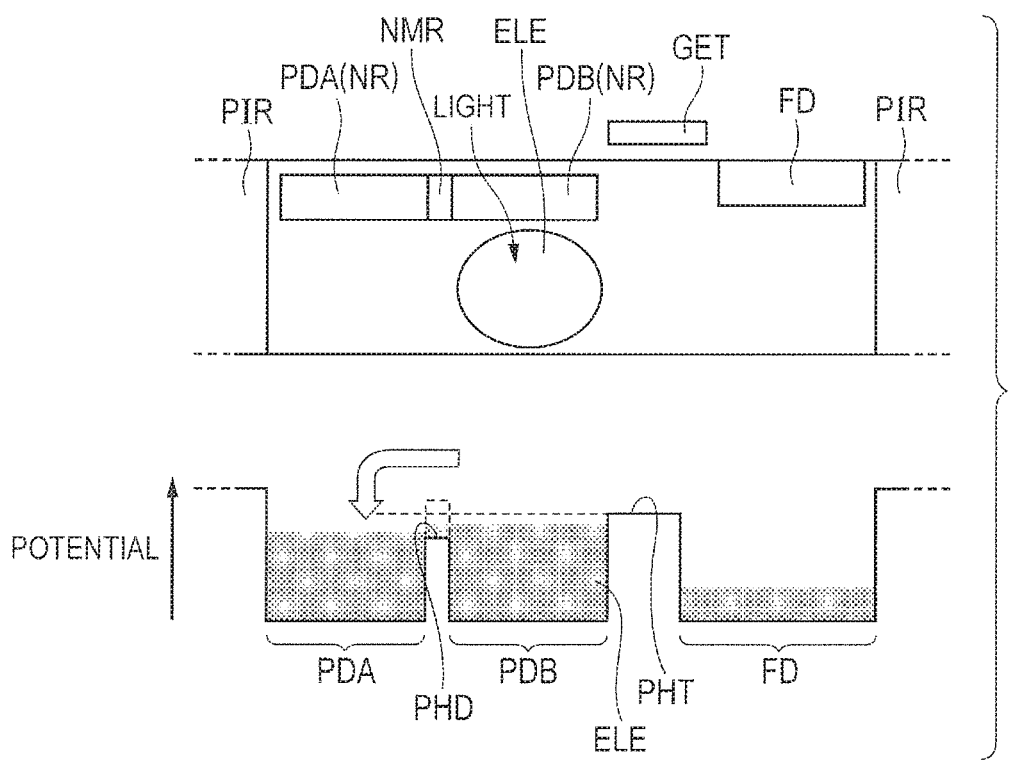
FIG. 17 is a view for explaining operations and effects, in which both a structure of a region where a photodiode is formed and a potential corresponding to the structure are schematically illustrated, in First Embodiment.

FIG. 17 is a sectional view schematically illustrating, in the imaging device according to First Embodiment, both a photodiode in a state where a still picture is being taken and the periphery thereof, in which: the upper view is a sectional view schematically illustrating a situation in which an electron is generated when light enters; and the lower view is a sectional view schematically illustrating both a situation in which the generated electron is stored and the relationship with a potential.

In the imaging device according to First Embodiment, the n-type impurity region NMR is formed, and hence the potential height PHD of the region located between the photodiode PDA and the photodiode PDB becomes lower than the potential height PHT of the region where the gate electrode GET of the transfer transistor TT in an off-state is located, as illustrated in FIG. 17.

Accordingly, even if the number of the electrons ELE generated, for example, in one photodiode PDB easily reaches the number of saturated electrons, the electrons, which are not included in the number of saturated electrons, are to flow from one photodiode PDB into the other photodiode PDA because the potential height PHD becomes lower than the potential height PHT (see the double-arrow).

So, the total of the generated electrons is hardly changed even if the electrons overflowing one photodiode PDB have flowed into the other photodiode PDA. Thereby, the overflowing electrons can be used as the data for still pictures taken based on the sum of the electrons generated in the two photodiodes PDA and PDB, whereby the dynamic range of still pictures can be prevented from being decreased.

In the aforementioned imaging device, when the n-type impurity region NMR is formed, the photoresist pattern PR1, in which the opening KC continuously exposing the region AR where the photodiode PDA is to be formed, the region BR where the photodiode PDB is to be formed, and the region CR located between the region AR and the region BR is formed, is formed as injection mask.

Thereby, a variation in the potential, which may be caused by a positional displacement (alignment displacement) of the n-type impurity region NMR with respect to the n-type impurity region NR of the photodiode PDA and that of the photodiode PDB, the n-type impurity regions NR being finally formed by further injecting n-type impurities with the use of the photoresist pattern PR2 as an injection mask, can be avoided, in comparison with the case where the n-type impurity region NMR is formed by using, as an injection mask, a photoresist pattern in which an opening exposing only the region CR located between the region AR and the region BR is formed.

The inventors have further found that a concentration ratio (concentration B/concentration A) of the impurity concentration (concentration B) of the n-type impurity region NR to the impurity concentration (concentration A) of the n-type impurity region NMR is desirably 1.5 to 2.5. If the concentration ratio is higher than 2.5, a reduction in the potential height is not sufficient and it becomes difficult for electrons to flow from one photodiode PDA (PDB) to the other photodiode PDB (PDA), and hence they cannot be used as data for still pictures.

If the concentration ratio is lower than 1.5, the potential height is decreased too much, and hence crosstalk is caused between the two photodiodes PDA and PDB. Accordingly, auto focusing cannot be achieved. Also, they cannot be used as data for moving pictures.

Further, still pictures and moving pictures are taken and auto focusing is achieved by the two photodiodes including the photodiode PDA and the photodiode PDB. Accordingly, when the number of saturated electrons in one pixel is equal, the amount of the n-type impurities injected into one photodiode can be reduced. Thereby, dark current or white spots in dark, which may be caused by a defect caused when n-type impurities are injected, can also be reduced.

Further, a depletion potential is reduced by reducing the amount of n-type impurities, whereby the on-state voltage of the transfer transistor TT can be suppressed, and finally a power supply voltage can be suppressed, which can also contribute to a reduction in power consumption.

Second Embodiment

Herein, a second example of an imaging device will be described, the imaging device being provided, between two photodiodes, with an n-type impurity region having a relatively low impurity concentration.

Figure 18:
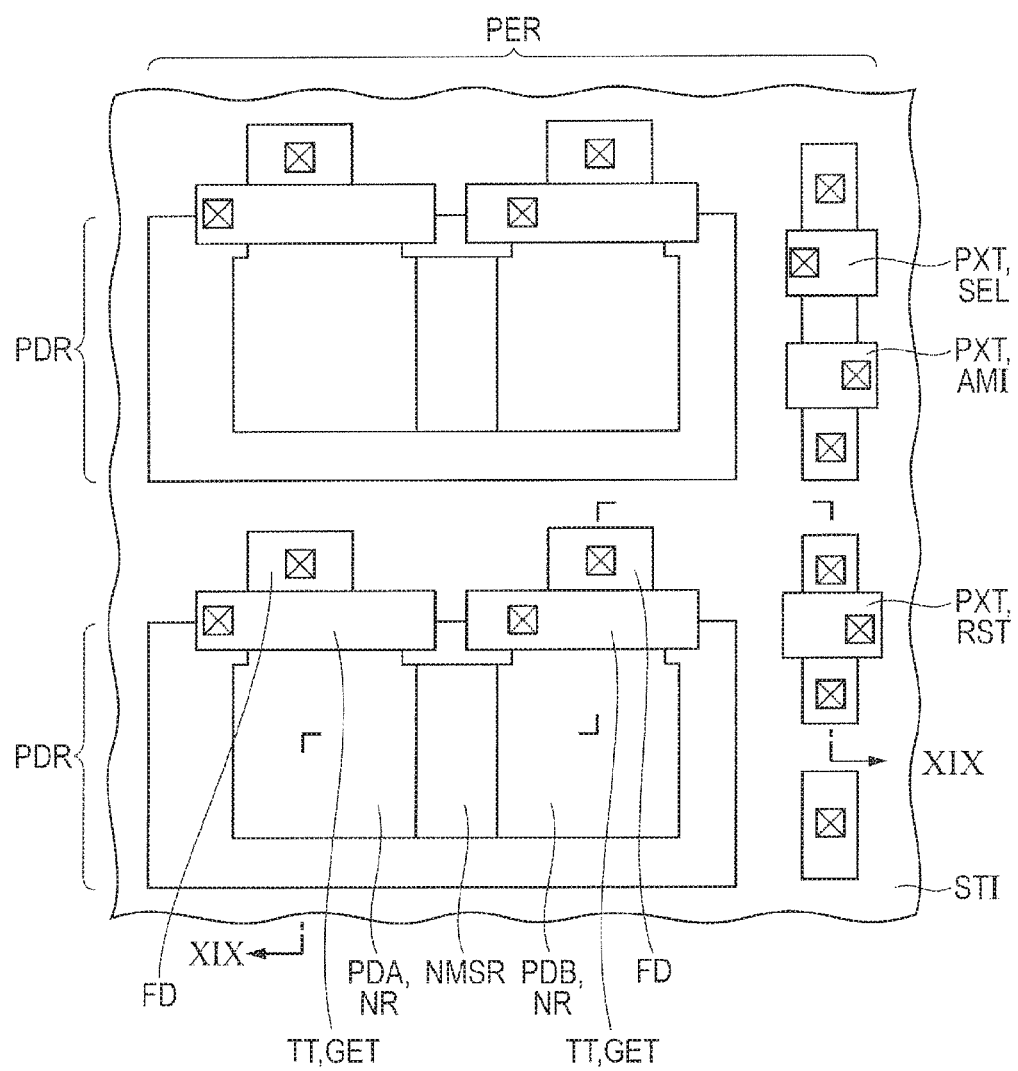
FIG. 18 is a plan view of an imaging device according to Second Embodiment.
Figure 19:
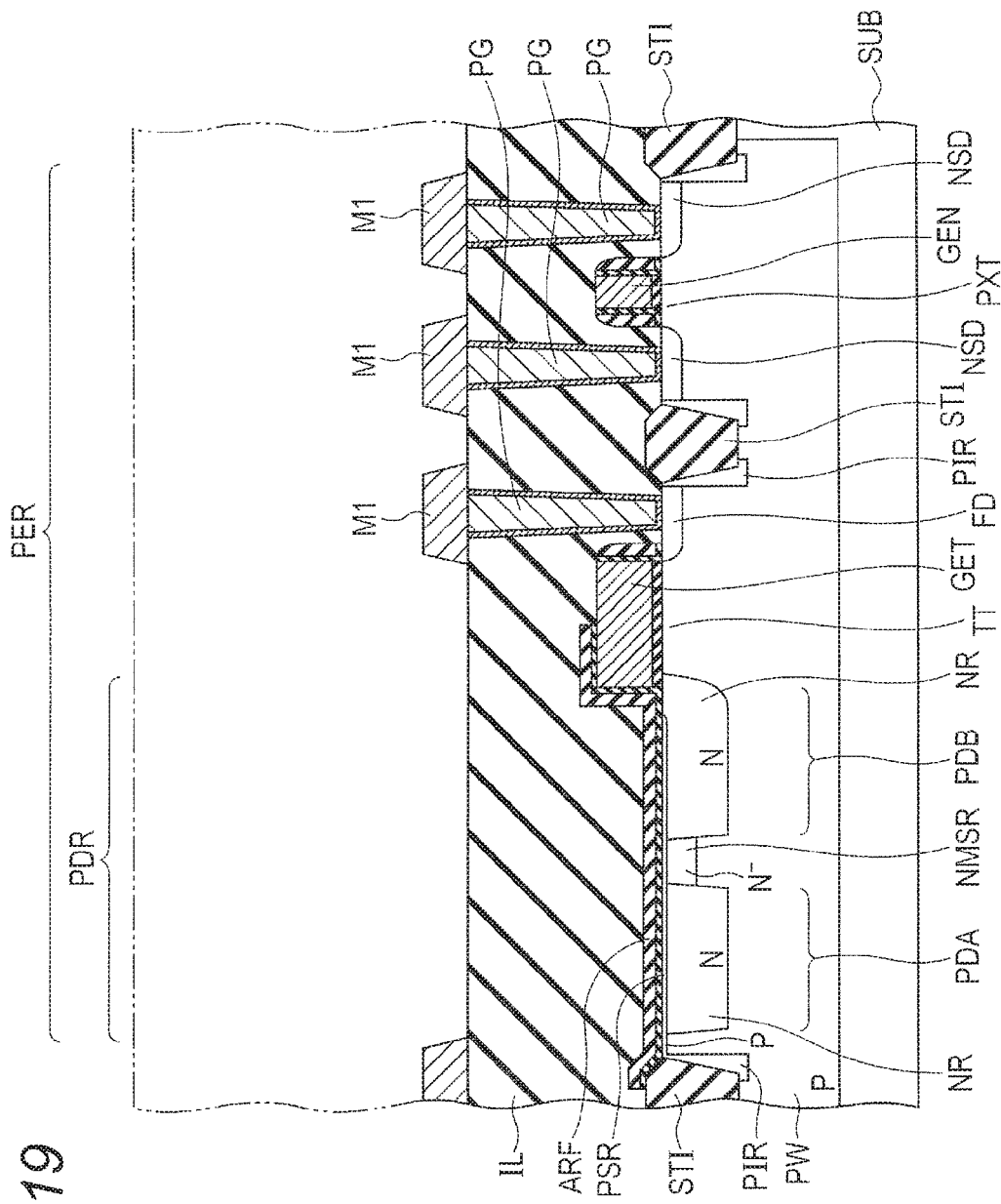
FIG. 19 is a sectional view taken along Sectional Line XIX-XIX illustrated in FIG. 18, in Second Embodiment.

As illustrated in FIGS. 18 and 19, an n-type impurity region NMSR is formed in a portion of the p-type well PW located between the photodiode PDA and the photodiode PDB. The n-type impurity region NMSR is formed to contact each of the n-type impurity region NR on one side and that on the other side. The impurity concentration of the n-type impurity region NMSR is lower than that of the n-type impurity region NR. The depth between the surface of the p-type well PW and the bottom of the n-type impurity region NMSR is smaller than that between the surface of the p-type well PW and the bottom of the n-type impurity region NR. Because the configurations other than those are similar to those of the imaging device illustrated in FIGS. 2 and 3, like members will be denoted with like reference numerals, and description thereof will not be repeated unless it is necessary.

Figure 20:
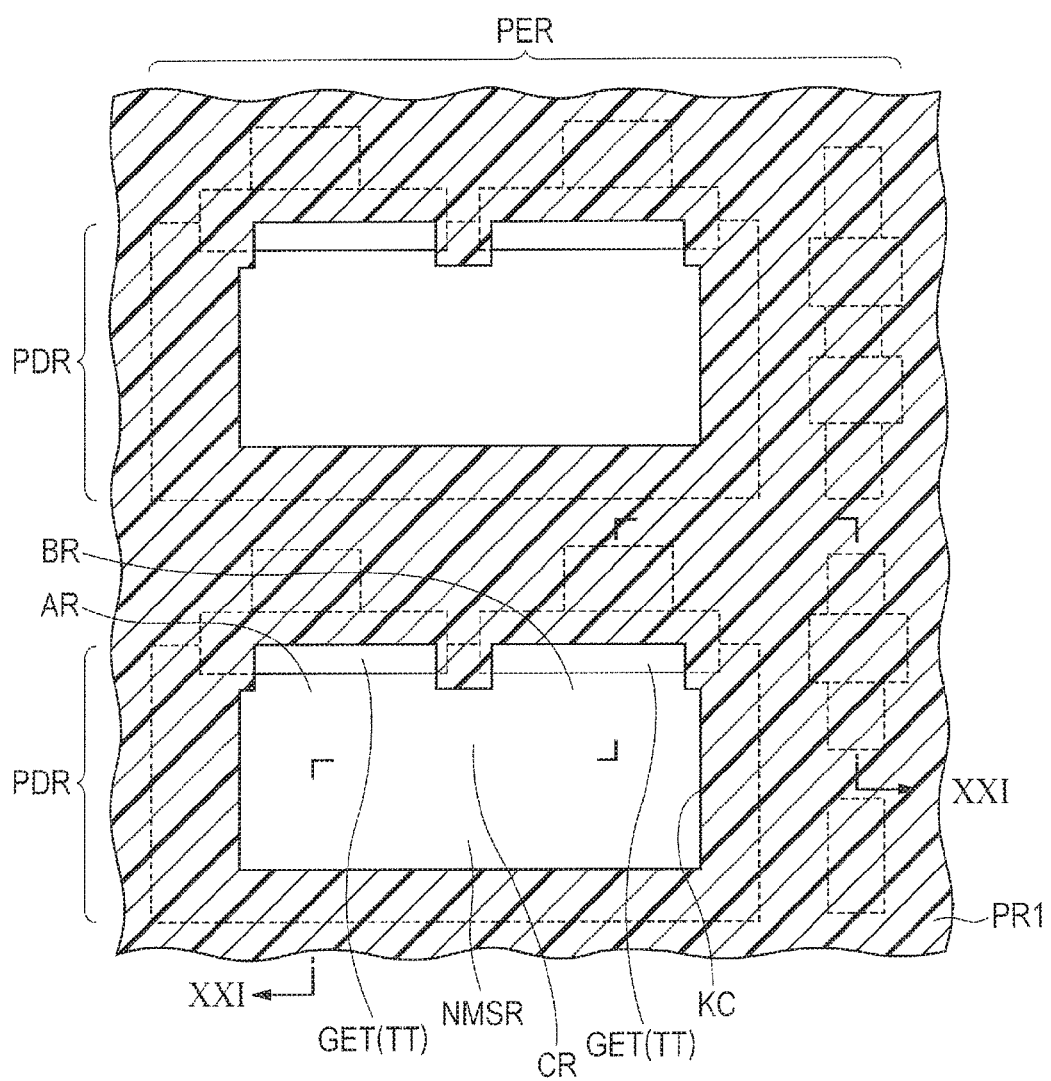
FIG. 20 is a plan view illustrating one step of a manufacturing method of an imaging device, in Second Embodiment.
Figure 21:
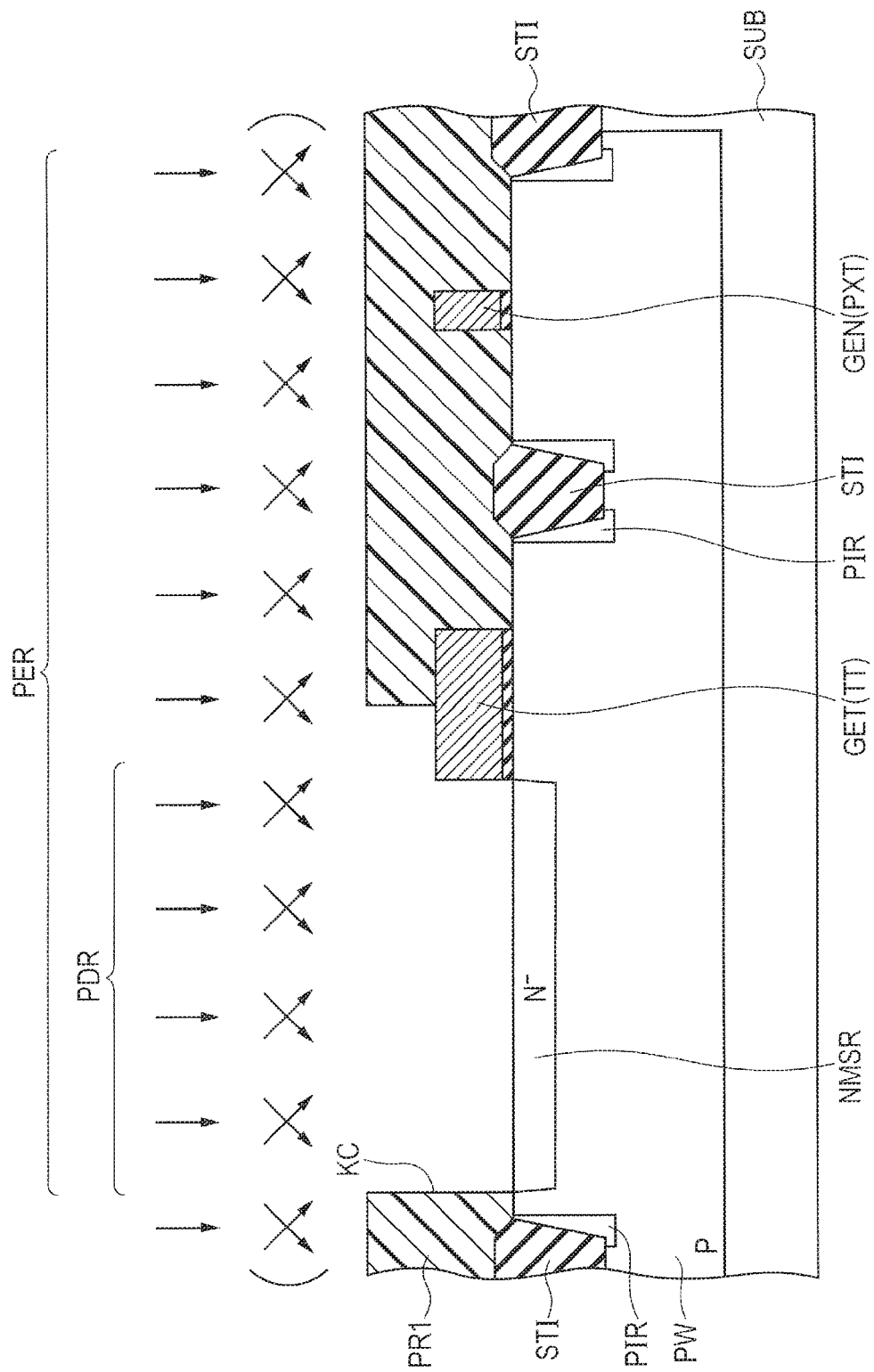
FIG. 21 is a sectional view taken along Sectional Line XXI-XXI illustrated in FIG. 20, in Second Embodiment.

Subsequently, an example of a manufacturing method of the aforementioned imaging device will be described. As illustrated in FIGS. 20 and 21, the photoresist pattern PR1 is formed by performing steps similar to those illustrated in FIGS. 4 to 7. Subsequently, n-type impurities are injected with relatively low injection energy (first injection energy) by using the photoresist pattern PR1 as an injection mask. Thereby, the relatively shallow n-type impurity region NMSR is formed in the exposed p-type wells PW (region AR, region BR, region CR). In this case, the relatively shallow n-type impurity region NMSR can be formed also by obliquely injecting n-type impurities. Thereafter, the photoresist pattern PR1 is removed.

Figure 22:
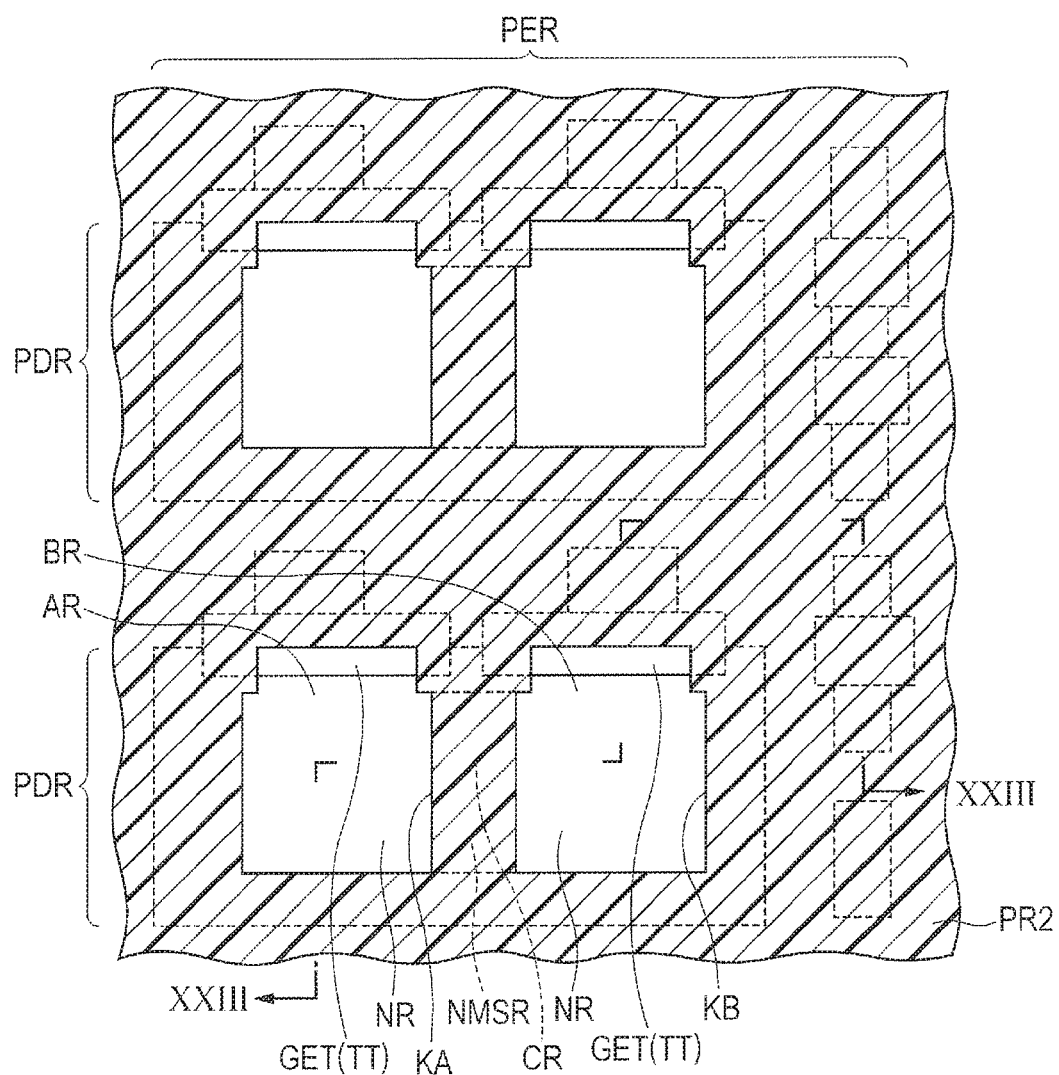
FIG. 22 is a plan view illustrating a step performed after the step illustrated in FIGS. 20 and 21, in Second Embodiment.
Figure 23:
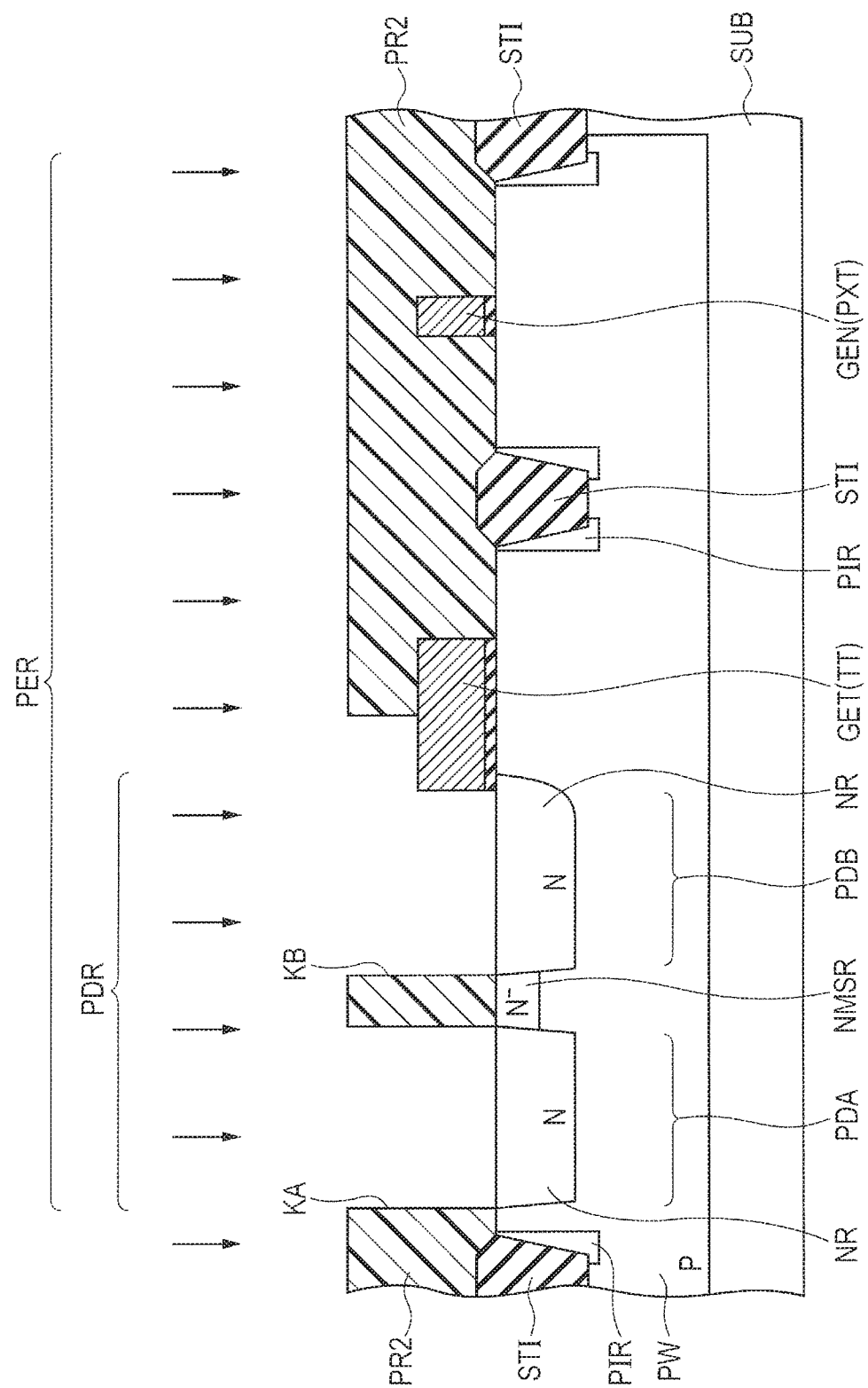
FIG. 23 is a sectional view taken along Sectional Line XXIII-XXIII illustrated in FIG. 22, in Second Embodiment.

Subsequently, the photoresist pattern PR2 is formed by performing a predetermined photoengraving process, as illustrated in FIGS. 22 and 23. Subsequently, n-type impurities are injected with injection energy higher than the first injection energy by using the photoresist pattern PR2 as an injection mask. Thereby, the n-type impurity region NR is formed in each of the exposed p-type wells PW (region AR, region BR) in conjunction with the first injection. The impurity concentration of the n-type impurity region NR becomes higher than that of the n-type impurity region NMR. Additionally, the depth between the surface of the p-type well PW and the bottom of the n-type impurity region NR is larger than that between the surface of the p-type well PW and the bottom of the n-type impurity region NMSR.

Alternatively, the step, in which n-type impurities are injected by using the photoresist pattern PR1 as an injection mask, may be performed after the step, in which n-type impurities are injected by using the photoresist pattern PR2 as an injection mask, is performed.

After the n-type impurity region NMSR is formed, the photoresist pattern PR2 is removed. Subsequently, main parts of the imaging device illustrated in FIGS. 18 and 19 are completed by performing steps similar to those illustrated in FIGS. 11 to 13.

If an n-type impurity region is formed in the portion of the p-type well PW located between the photodiode PDA and the photodiode PDB, electrons are likely to be generated in this n-type impurity region, etc., and the generated electrons are to flow into the photodiode PDA or the photodiode PDB.

Accordingly, the electrons generated in the aforementioned n-type impurity region, etc., may flow into the photodiode PDA or the photodiode PDB, although a focus should essentially be adjusted based on the electrons generated in the photodiode PDA and those generated in the photodiode PDB. That is, crosstalk may be caused, whereby the accuracy of auto focusing may be affected. Shooting of a moving picture may also be affected.

In the aforementioned imaging device, the following effects can be obtained in addition to an effect in which the dynamic range of still pictures can be prevented from being decreased. That is, in the imaging device described above, the bottom of the n-type impurity region NMSR is located at a position shallower than the position at which the bottom of the n-type impurity region NMR of the imaging device described previously is located. Thereby, the number of the electrons to be generated in the n-type impurity region NMSR, etc., can be suppressed and crosstalk can be suppressed, which can contribute to an improvement in the accuracy of focusing. Further, shooting of a moving picture is less likely to be adversely affected.

Third Embodiment

Herein, an example of an imaging device, provided with n-type impurity regions each corresponding to a red pixel, a green pixel, and a blue pixel, will be described as a third example of an imaging device provided, between two photodiodes, with an n-type impurity region having a relatively low impurity concentration.

Figure 24:
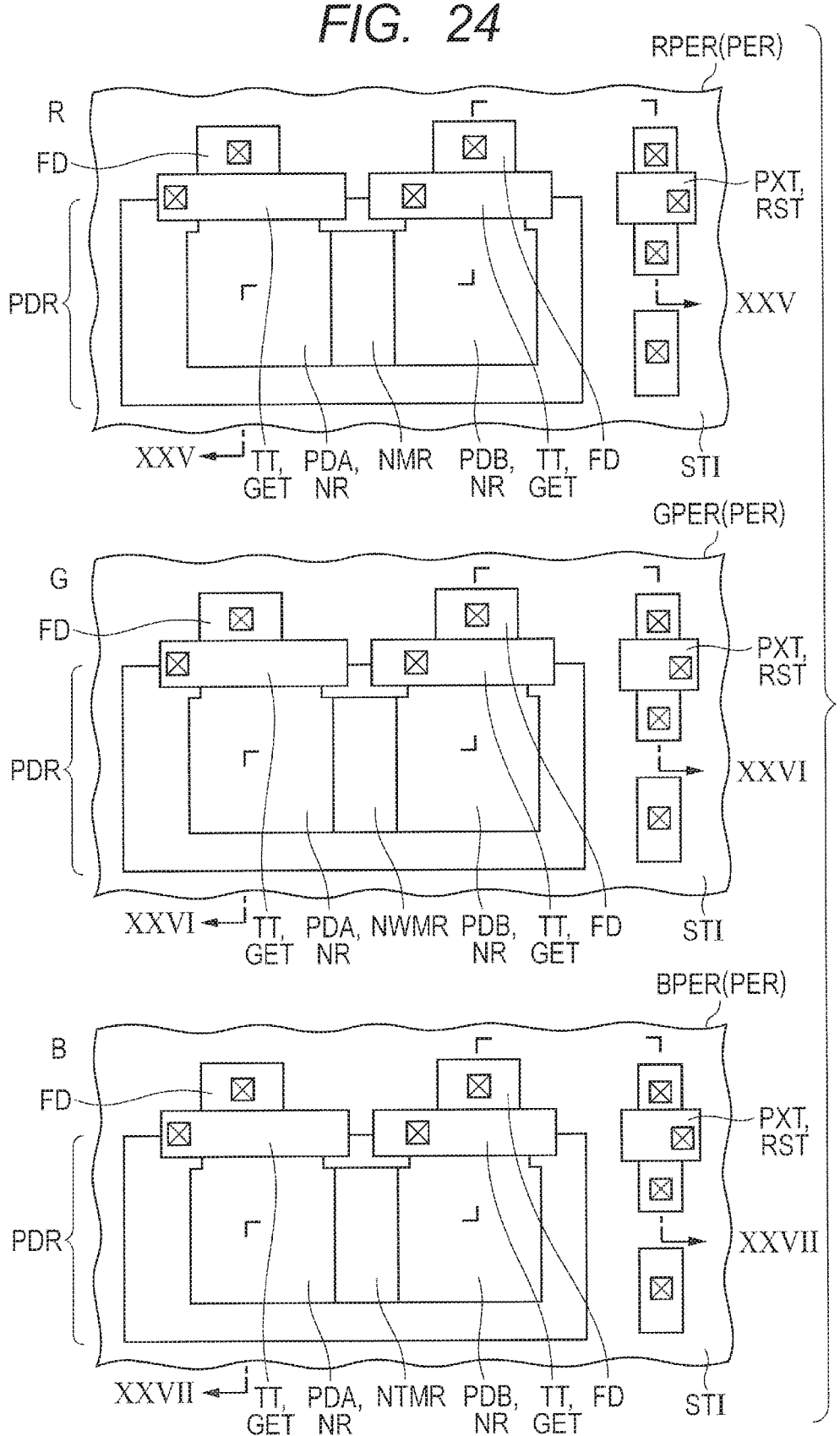
FIG. 24 is a plan view of an imaging device according to Third Embodiment.
Figure 25:
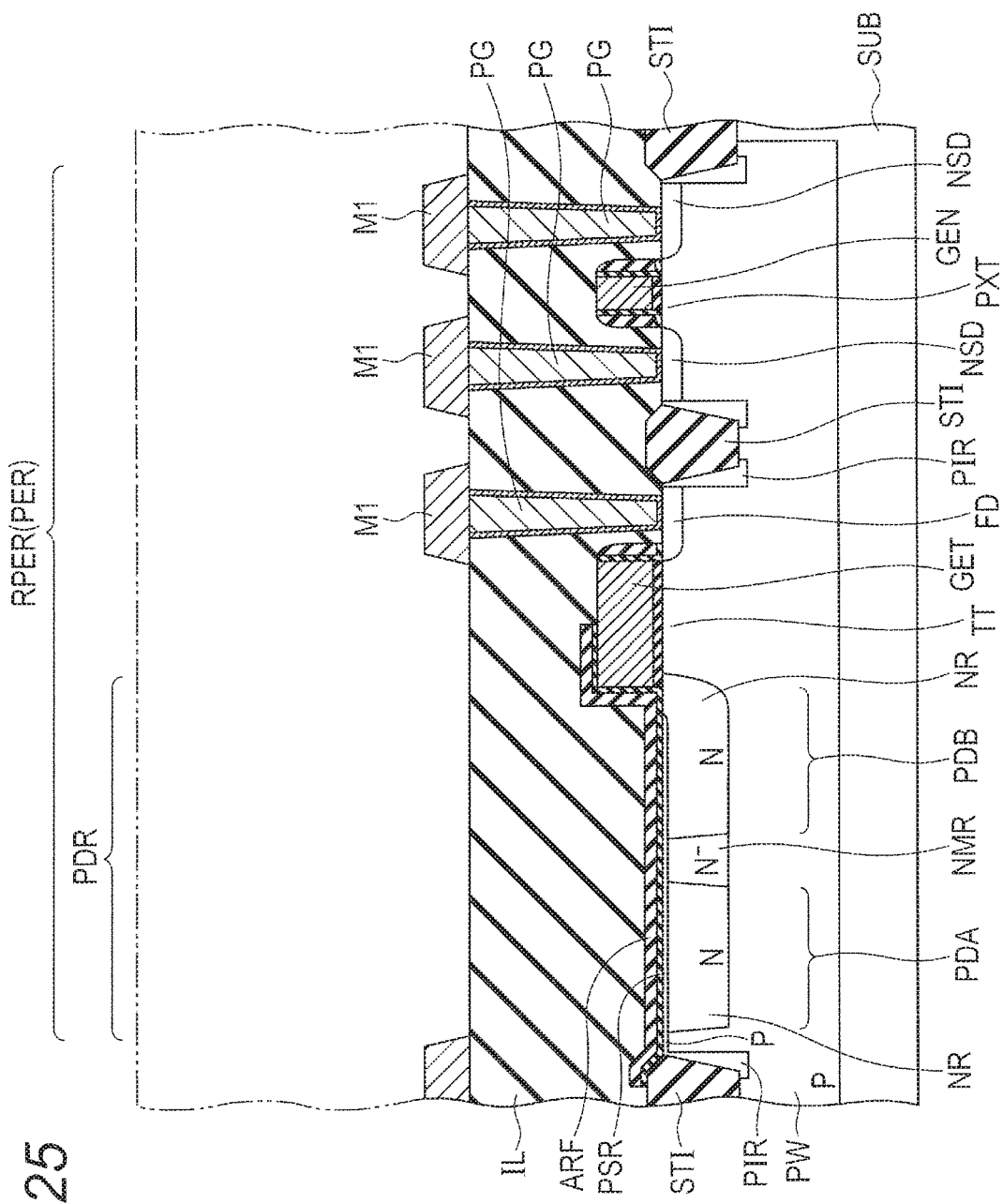
FIG. 25 is a sectional view taken along Sectional Line XXV-XXV illustrated in FIG. 24, in Third Embodiment.

First, in a red pixel region RPER, an n-type impurity region NMR (N$^-$ type) is formed in the portion of the p-type well PW located between the photodiode PDA and the photodiode PDB, as illustrated in FIGS. 24 and 25. The n-type impurity region NMR is formed to contact each of the n-type impurity region NR on one side and that on the other side. The impurity concentration of the n-type impurity region NMR is lower than that of the n-type impurity region NR.

Figure 26:
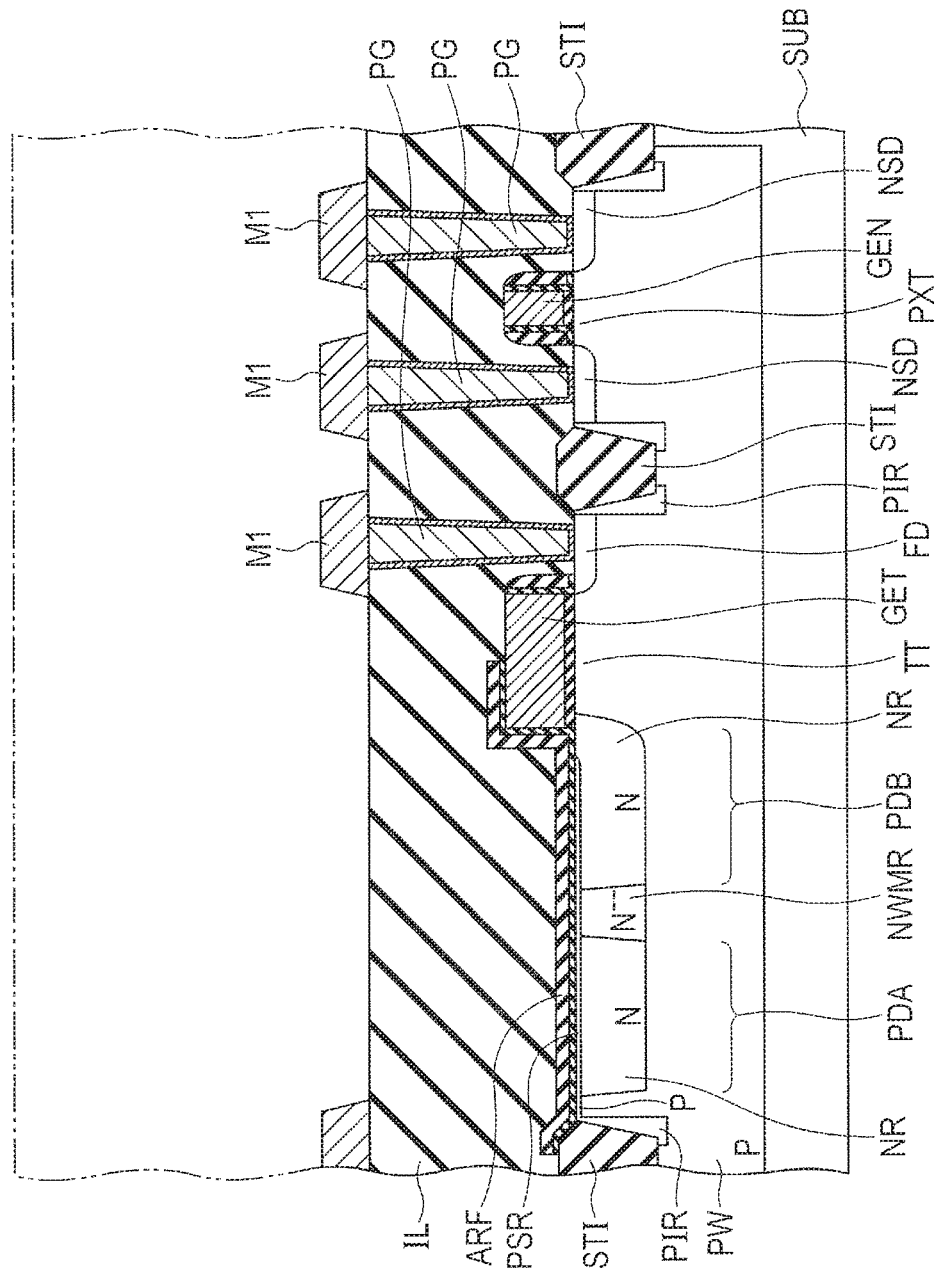
FIG. 26 is a sectional view taken along Sectional Line XXVI-XXVI illustrated in FIG. 24, in Third Embodiment.

Next, in a green pixel region GPER, an n-type impurity region NWMR (N$^{--}$ type) is formed in the portion of the p-type well PW located between the photodiode PDA and the photodiode PDB, as illustrated in FIGS. 24 and 26. The n-type impurity region NWMR is formed to contact each of the n-type impurity region NR on one side and that on the other side. The impurity concentration of the n-type impurity region NWMR is lower than that of the n-type impurity region NR and lower than that of the n-type impurity region NMR.

Figure 27:
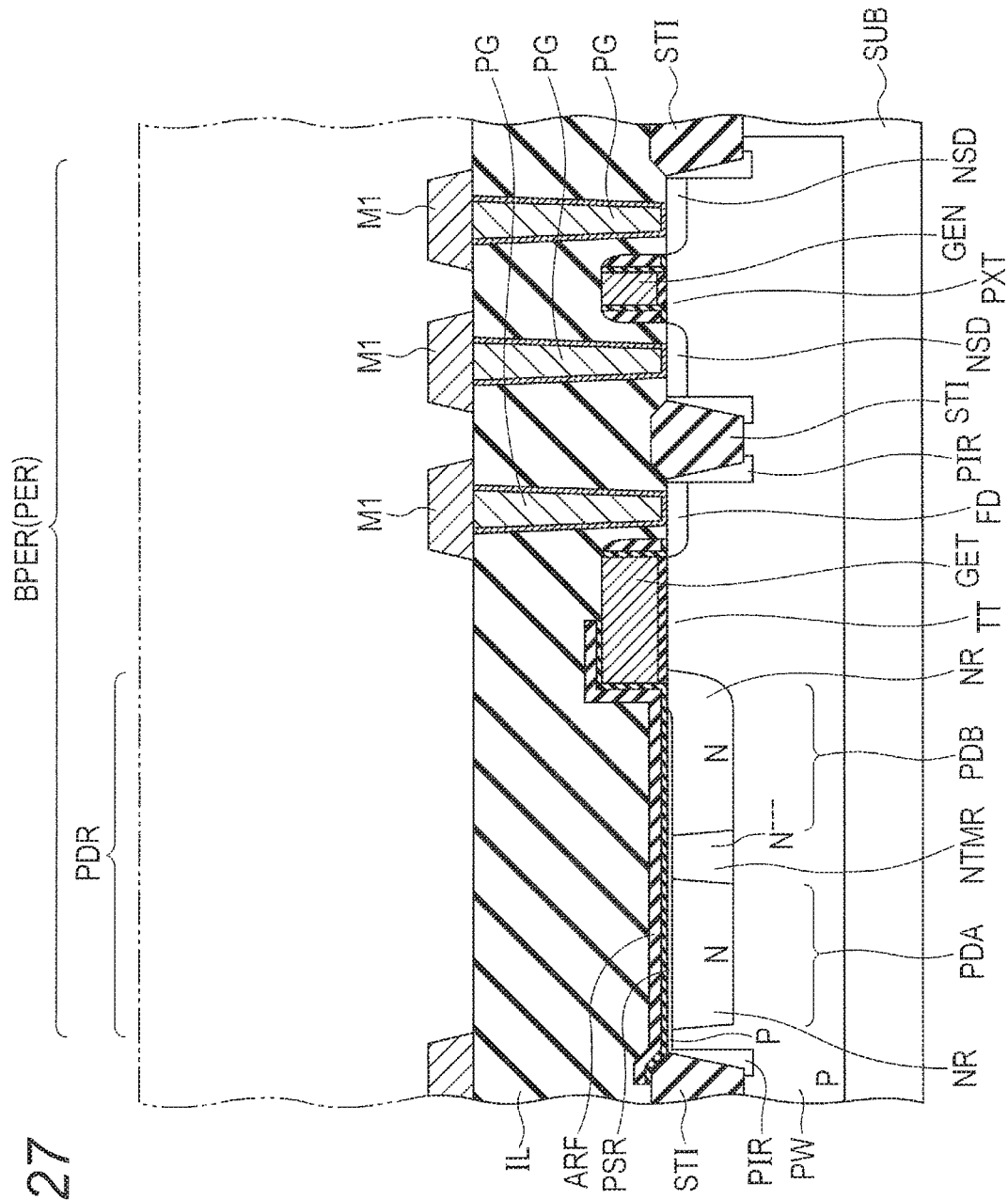
FIG. 27 is a sectional view taken along Sectional Line XXVII-XXVII illustrated in FIG. 24, in Third Embodiment.

Next, in a blue pixel region BPER, an n-type impurity region NTMR (N$^{---}$ type) is formed in the portion of the p-type well PW located between the photodiode PDA and the photodiode PDB, as illustrated in FIGS. 24 and 27. The n-type impurity region NTMR is formed to contact each of the n-type impurity region NR on one side and that on the other side. The impurity concentration of the n-type impurity region NTMR is lower than that of the n-type impurity region NR and lower than that of the n-type impurity region NWMR.

Figure 28:
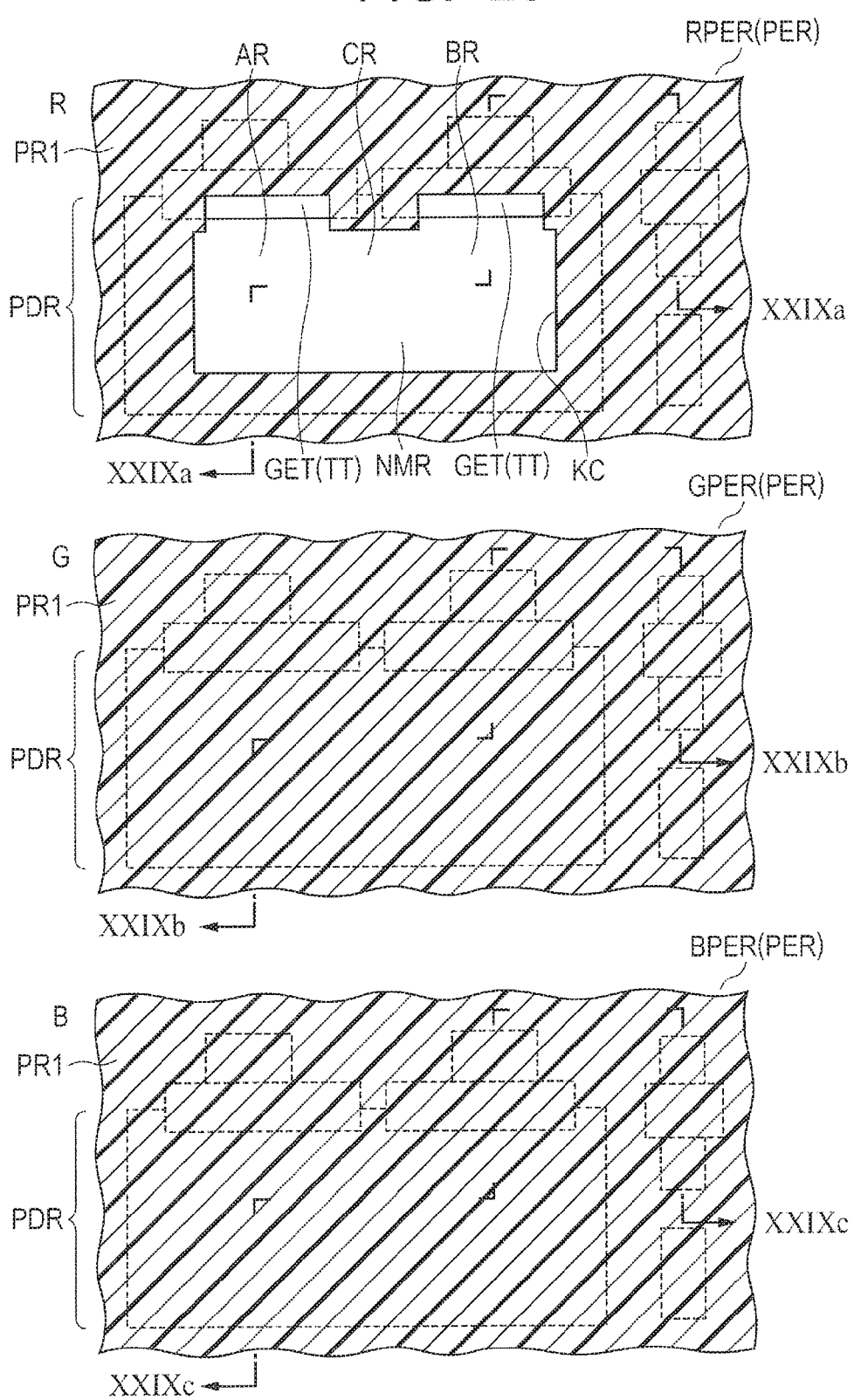
FIG. 28 is a plan view illustrating one step of a manufacturing method of an imaging device, in Third Embodiment.
Figure 29:
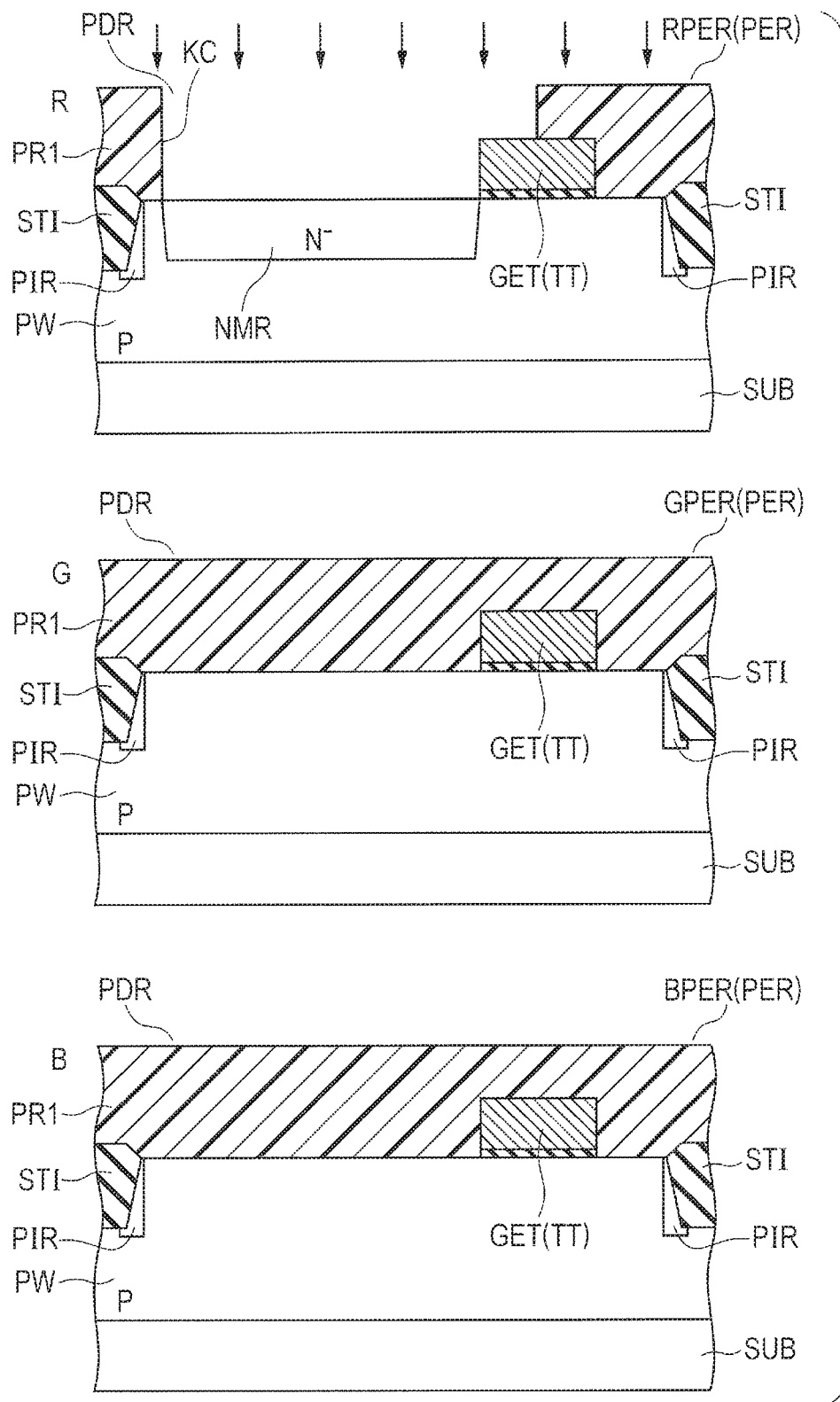
FIG. 29 are sectional views taken along Sectional Lines XXIXa-XXIXa, XXIXb-XXIXb, and XXIXc-XXIXc illustrated in FIG. 28, respectively, in Third Embodiment.

Subsequently, an example of a manufacturing method of the aforementioned imaging device will be described. As illustrated in FIGS. 28 and 29, the photoresist pattern PR1 is first formed by performing steps similar to those illustrated in FIGS. 4 to 7 followed by a predetermined photoengraving process. An opening KC is formed in the photoresist pattern PR1, the opening KC covering the green pixel region GPER and the blue pixel region BPER and exposing the region AR, the region BR, and the region CR in the red pixel region RPER.

Subsequently, a predetermined injection amount of n-type impurities are injected by using the photoresist pattern PR1 as an injection mask. Thereby, the n-type impurity region NMR is formed in the exposed p-type wells PW (region AR, region BR, and region CR). Thereafter, the photoresist pattern PR1 is removed.

Figure 30:
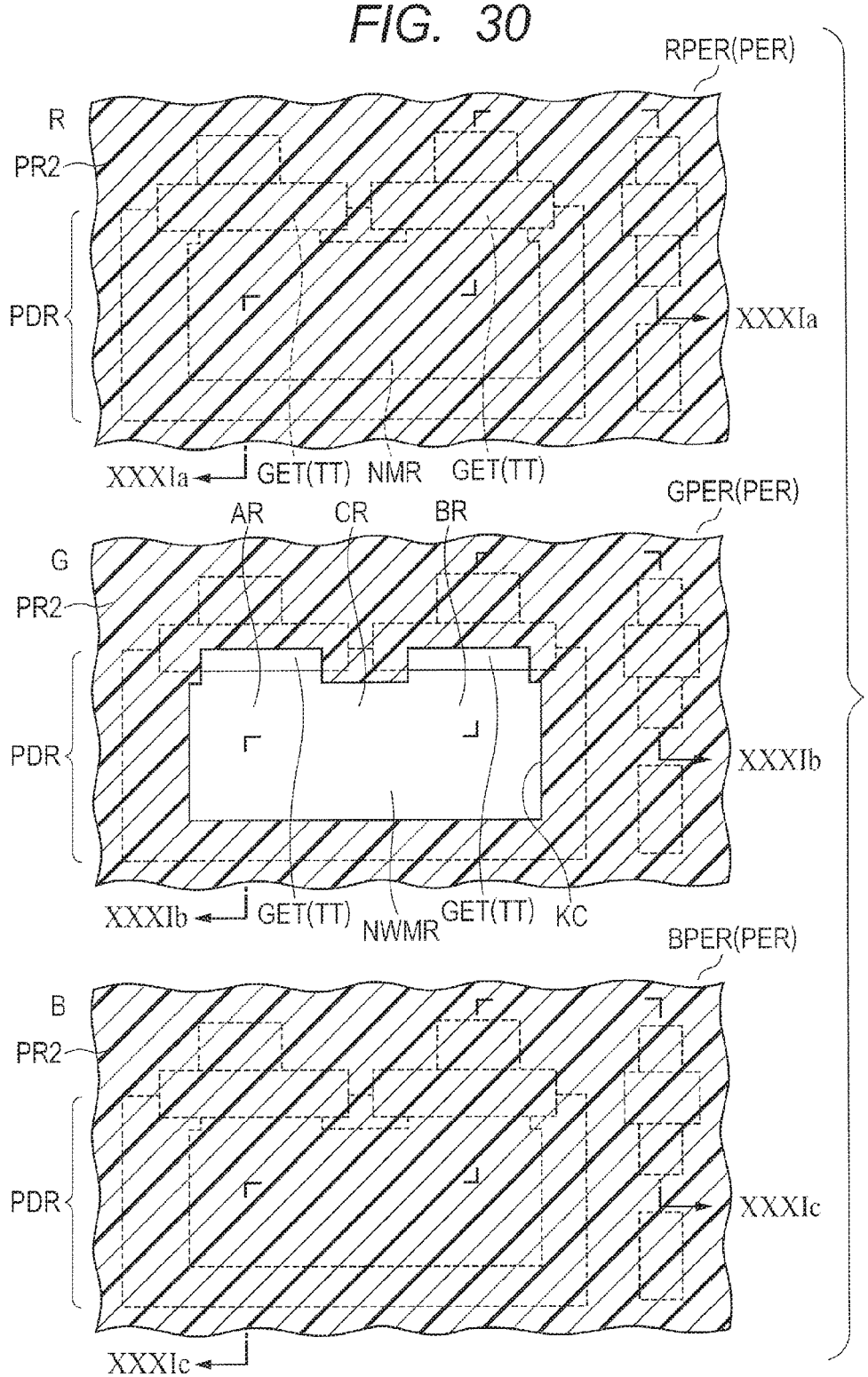
FIG. 30 is a plan view illustrating a step performed after the step illustrated in FIGS. 28 and 29, in Third Embodiment.
Figure 31:
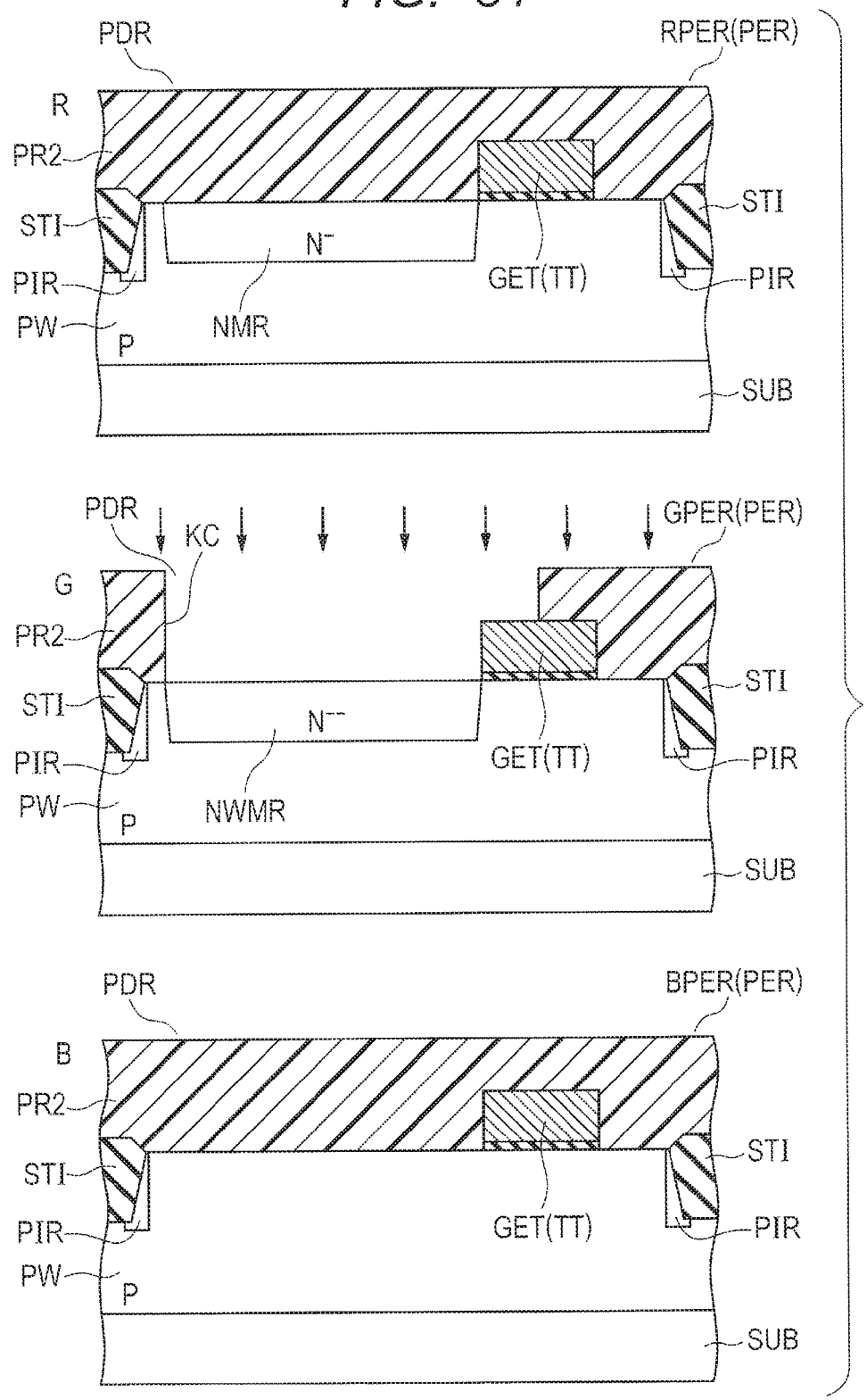
FIG. 31 are sectional views taken along Sectional Lines XXXIa-XXXIa, XXXIb-XXXIb, and XXXIc-XXXIc illustrated in FIG. 30, respectively, in Third Embodiment.

Subsequently, the photoresist pattern PR2 is formed by performing a predetermined photoengraving process, as illustrated in FIGS. 30 and 31. An opening KC is formed in the photoresist pattern PR2, the opening KC covering the red pixel region RPER and the blue pixel region BPER and exposing the region AR, the region BR, and the region CR in the green pixel region GPER.

Subsequently, a predetermined injection amount of n-type impurities are injected by using the photoresist pattern PR2 as an injection mask. Thereby, the n-type impurity region NWMR is formed in the exposed p-type wells PW (region AR, region BR, and region CR). The impurity concentration of the n-type impurity region NWMR is lower than that of the n-type impurity region NMR. Thereafter, the photoresist pattern PR2 is removed.

Figure 32:
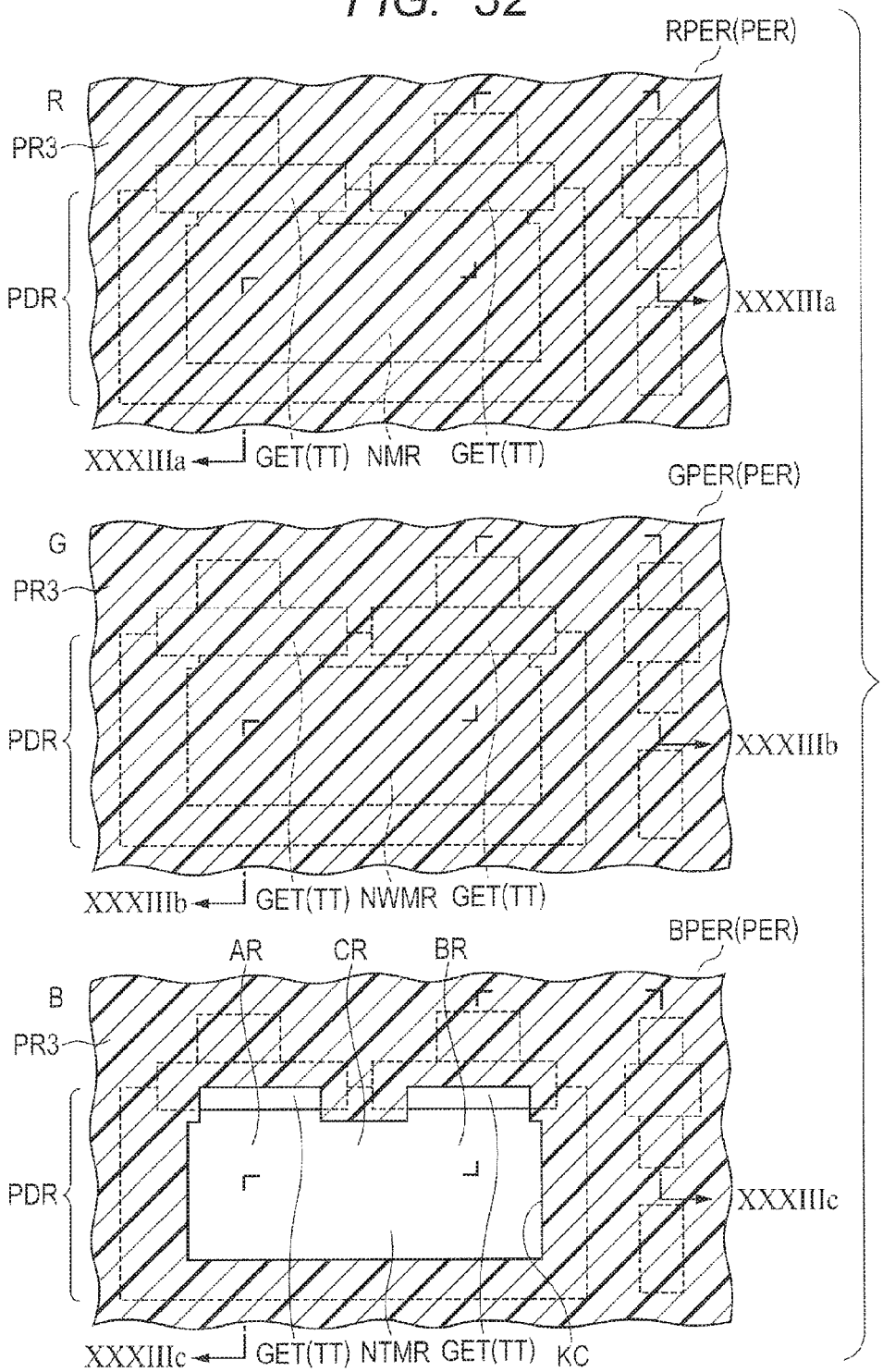
FIG. 32 is a plan view illustrating a step performed after the step illustrated in FIGS. 30 and 31, in Third Embodiment.
Figure 33:
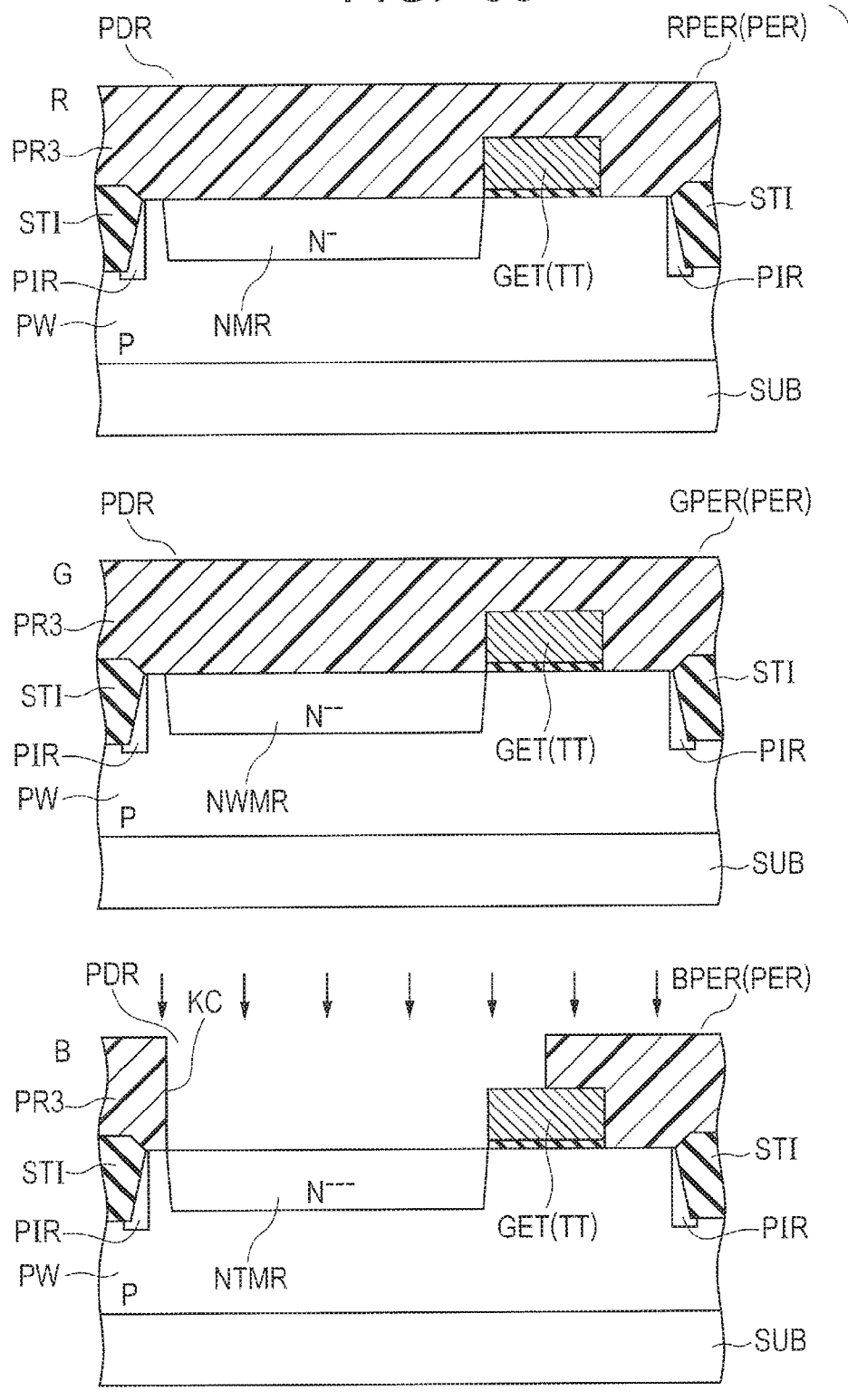
FIG. 33 are sectional views taken along Sectional Lines XXXIIIa-XXXIIIa, XXXIIIb-XXXIIIb, and XXXIIIc-XXXIIIc illustrated in FIG. 32, respectively, in Third Embodiment.

Subsequently, a photoresist pattern PR3 is formed by performing a predetermined photoengraving process, as illustrated in FIGS. 32 and 33. An opening KC is formed in the photoresist pattern PR3, the opening KC covering the red pixel region RPER and the green pixel region GPER and exposing the region AR, the region BR, and the region CR in the blue pixel region BPER.

Subsequently, a predetermined injection amount of n-type impurities are injected by using the photoresist pattern PR3 as an injection mask. Thereby, the n-type impurity region NTMR is formed in the exposed p-type wells PW (region AR, region BR, and region CR). The impurity concentration of the n-type impurity region NTMR is lower than that of the n-type impurity region NWMR. Thereafter, the photoresist pattern PR3 is removed.

Figure 34:
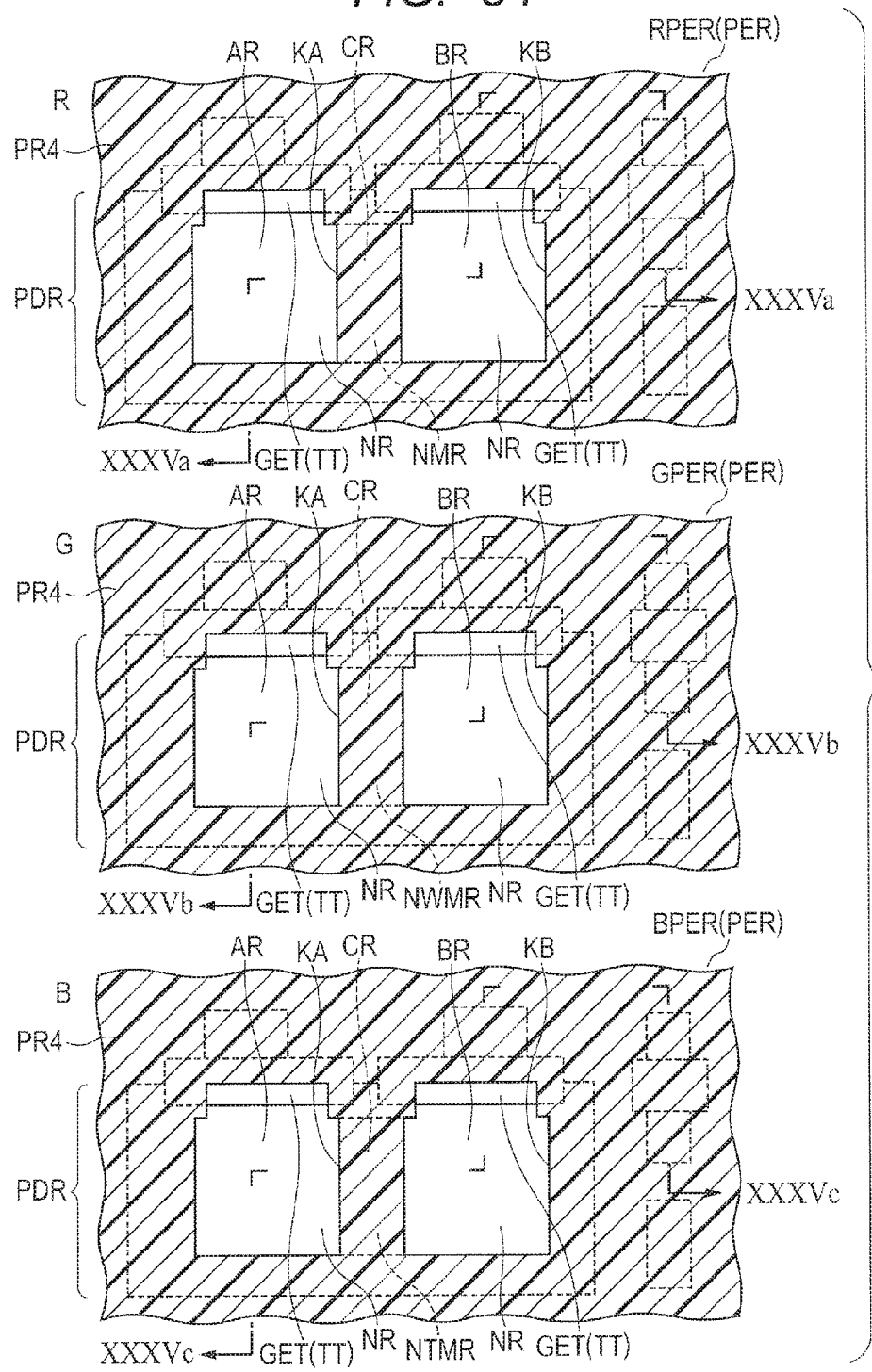
FIG. 34 is a plan view illustrating a step performed after the step illustrated in FIGS. 32 and 33, in Third Embodiment.
Figure 35:
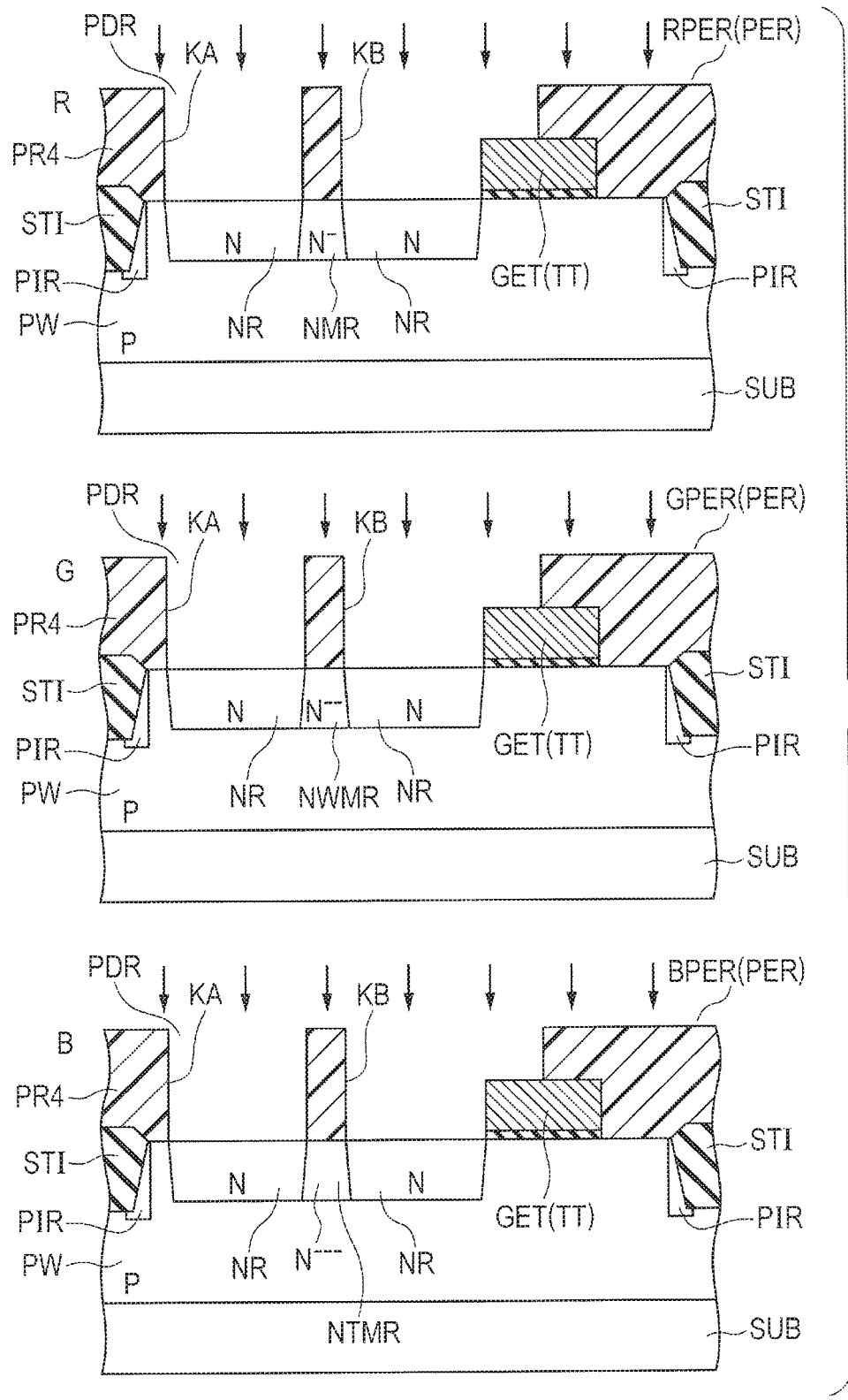
FIG. 35 are sectional views taken along Sectional Lines XXXVa-XXXVa, XXXVb-XXXVb, and XXXVc-XXXVc illustrated in FIG. 34, respectively, in Third Embodiment.

Subsequently, a photoresist pattern PR4 is formed by performing a predetermined photoengraving process, as illustrated in FIGS. 34 and 35. In the photoresist pattern PR4, the opening KA exposing the region AR where the photodiode PDA is to be formed and the opening KB exposing the region BR where the photodiode PDB is to be formed are formed to be spaced apart from each other in each of the red pixel region RPER, the green pixel region GPER, and the blue pixel region BPER.

Subsequently, a predetermined injection amount of n-type impurities are injected by using the photoresist pattern PR4 as an injection mask. Thereby, the n-type impurity region NR is formed in each of the exposed p-type wells PW (region AR, region BR) in conjunction with the injection performed until now. The impurity concentration of the n-type impurity region NR becomes higher than that of the n-type impurity region NMR. Alternatively, the step, in which n-type impurities are injected by using the photoresist pattern PR4 as an injection mask, may be performed, for example, before the step in which n-type impurities are injected by using the photoresist pattern PR1 as an injection mask.

After the n-type impurity region NR is formed, the photoresist pattern PR4 is removed. Thereafter, main parts of the imaging device illustrated in FIGS. 24 to 27 are completed by performing steps similar to those illustrated in FIGS. 11 to 13.

In the aforementioned imaging device, the following effects can be obtained in addition to an effect in which the dynamic range of still pictures can be prevented from being decreased.

First, the amount of the electrons generated in a relatively shallow region of a photodiode is dependent on a wavelength, and it becomes larger as a wavelength becomes shorter. In an imaging device in which the red pixel region RPER, the green pixel region GPER, and the blue pixel region BPER are formed, the amount of the electrons generated in the blue pixel region BPER is largest. The amount of the electrons generated in the green pixel region GPER is second largest. The amount of the electrons generated in the red pixel region RPER is smallest.

Herein, it is assumed that the injection conditions, under which an n-type impurity amount region is formed, are the same as each other for the red pixel region RPER, the green pixel region GPER, and the blue pixel region BPER. That is, it is assumed that the impurity concentrations of the n-type impurity regions formed in each of the red pixel region RPER, the green pixel region GPER, and the blue pixel region BPER are equal to each other. In this case, the accuracy of auto focusing is most adversely affected in the blue pixel region BPER by crosstalk caused with the electrons generated in the n-type impurity region, etc., flowing into the photodiode PDA or the photodiode PDB; the accuracy thereof is second most adversely affected in the green pixel region GPER; and the accuracy thereof is least adversely affected in the red pixel region RPER.

In the aforementioned imaging device, the impurity concentration of the n-type impurity region NTMR formed in the blue pixel region BPER is lowest; that of the n-type impurity region NWMR formed in the green pixel region GPER is second lowest; and that of the n-type impurity region NWR formed in the red pixel region RPER is highest. That is, the impurity concentrations of the n-type impurity regions NMR, NWR, and NTMR are gradually lower in the order of the red pixel region RPER, the green pixel region GPER, and the blue pixel region BPER, in which the accuracy of auto focusing is more likely to be affected in this order. Thereby, the number of the electrons flowing into the photodiode PDA or the photodiode PDB (crosstalk) can be suppressed, and hence the accuracy of auto focusing can be suppressed from being deteriorated.

Fourth Embodiment

Herein, another example of an imaging device, provided with n-type impurity regions each corresponding to a red pixel, a green pixel, and a blue pixel, will be described as a fourth example of an imaging device provided, between two photodiodes, with an n-type impurity region having a relatively low impurity concentration.

Figure 36:
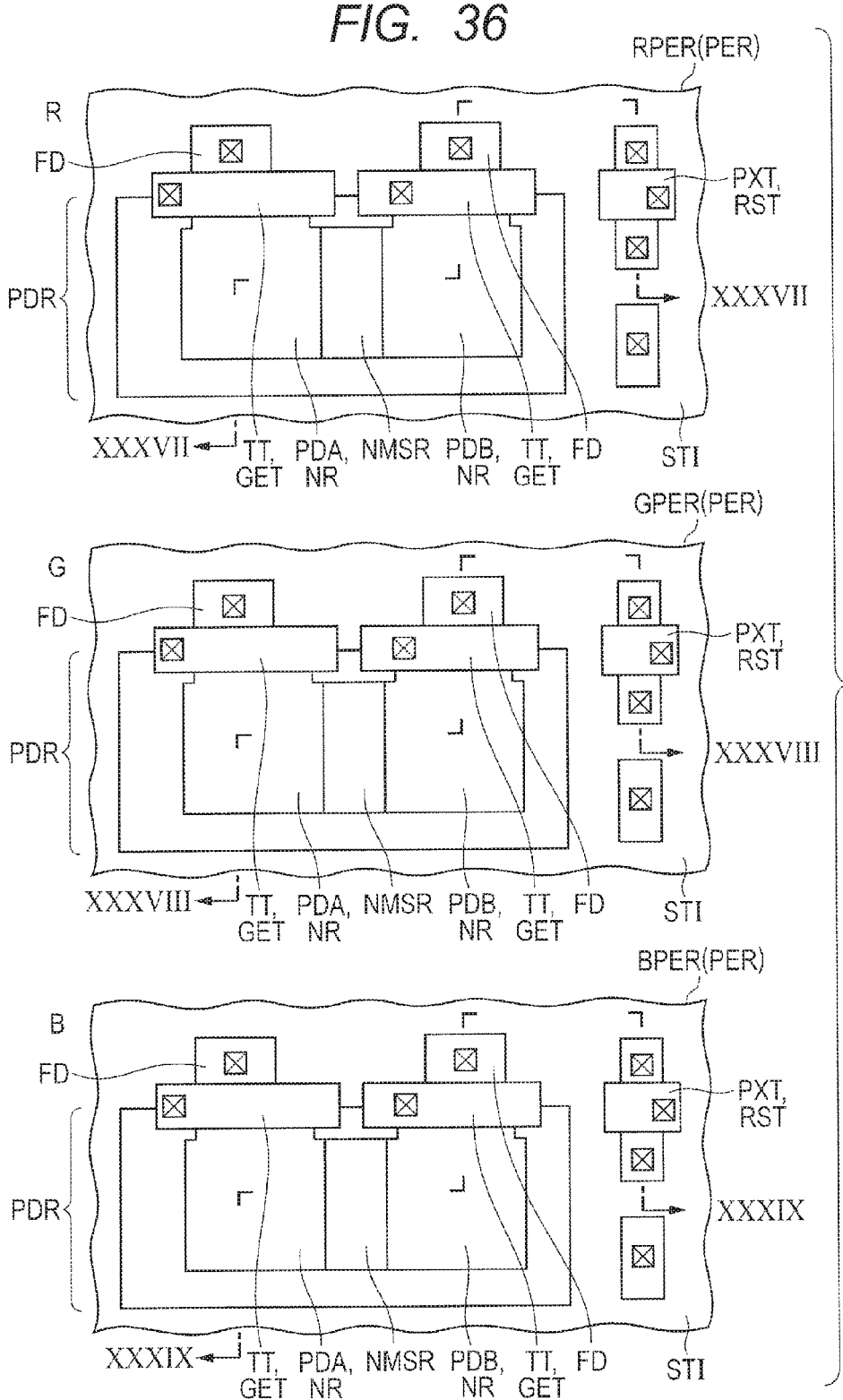
FIG. 36 is a plan view of an imaging device according to Fourth Embodiment.
Figure 37:
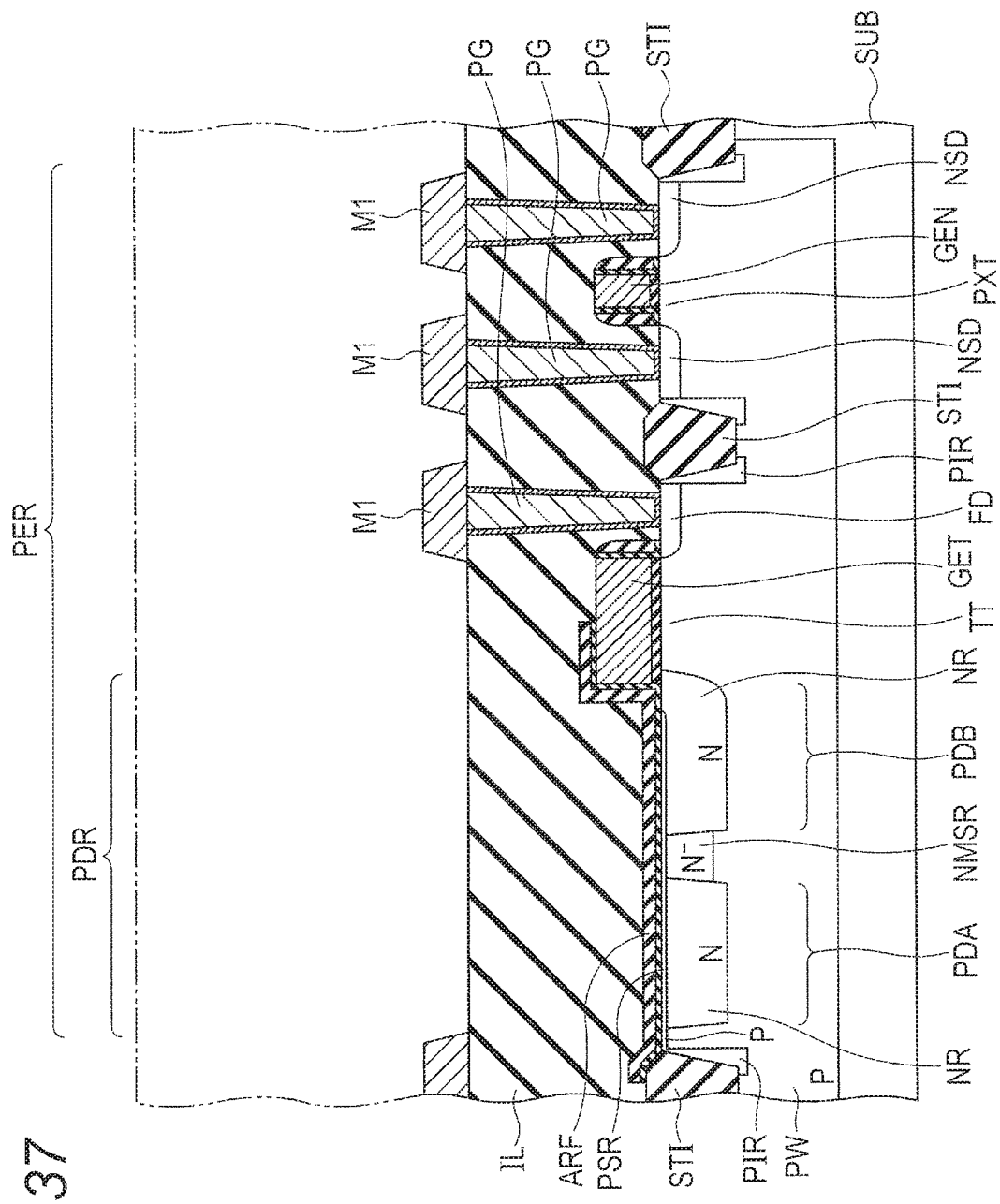
FIG. 37 is a sectional view taken along Sectional Line XXXVII-XXXVII illustrated in FIG. 36, in Fourth Embodiment.

First, the n-type impurity region NMSR (N⁻ type) is formed in the portion of the p-type well PW located between the photodiode PDA and the photodiode PDB in the red pixel region RPER, as illustrated in FIGS. 36 and 37. The n-type impurity region NMSR is formed to contact each of the n-type impurity region NR on one side and that on the other side. The impurity concentration of the n-type impurity region NMSR is lower than that of the n-type impurity region NR. The depth (first depth) between the surface of the p-type well PW and the bottom of the n-type impurity region NMSR is smaller than that between the surface of the p-type well PW and the bottom of the n-type impurity region NR.

Figure 38:
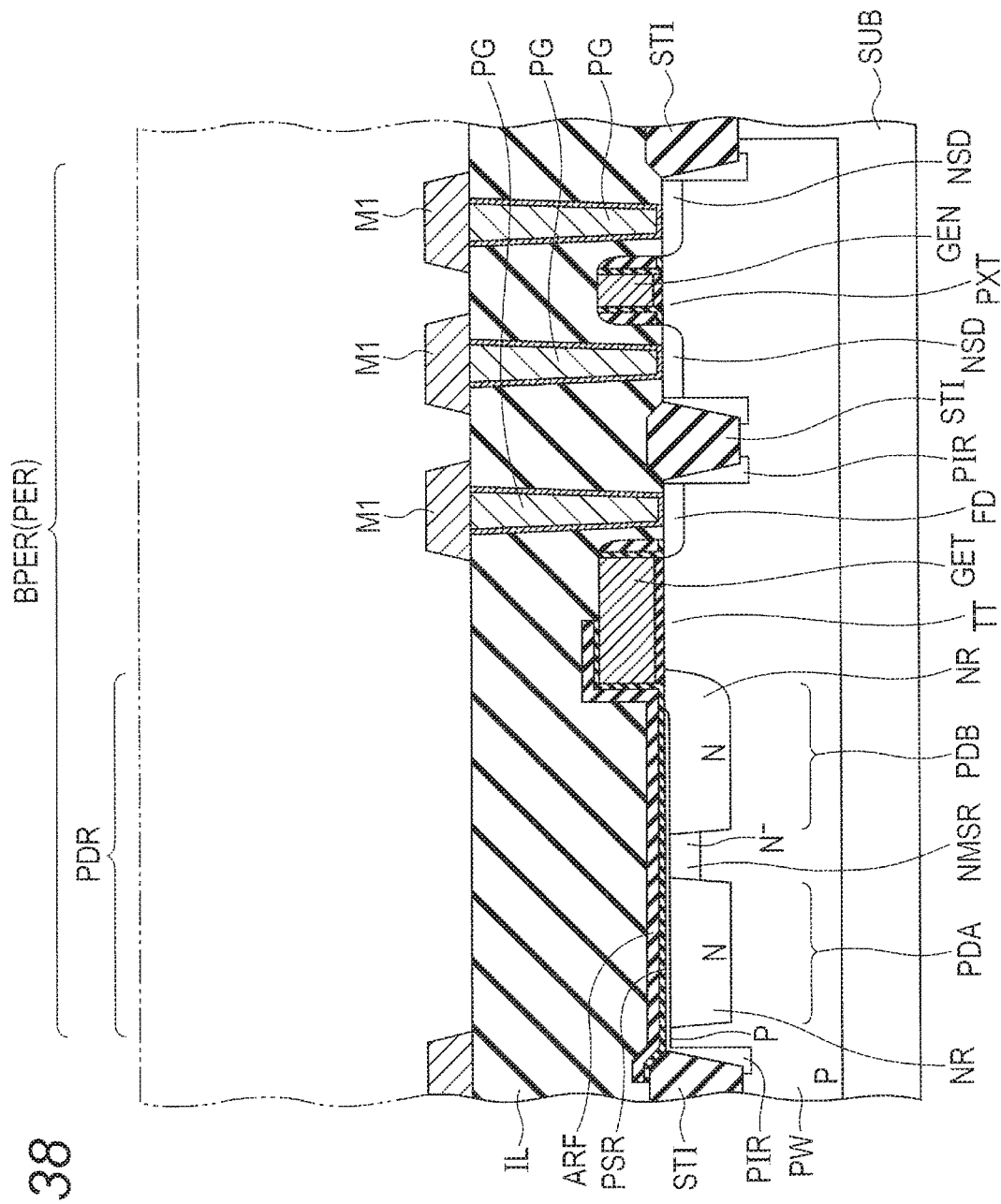
FIG. 38 is a sectional view taken along Sectional Line XXXVIII-XXXVIII illustrated in FIG. 36, in Fourth Embodiment.

Next, the n-type impurity region NMSR (N⁻ type) is formed in the portion of the p-type well PW located between the photodiode PDA and the photodiode PDB in the green pixel region GPER, as illustrated in FIGS. 36 and 38. The n-type impurity region NMSR is formed to contact each of the n-type impurity region NR on one side and that on the other side. The impurity concentration of the n-type impurity region NMSR is lower than that of the n-type impurity region NR. The depth (second depth) between the surface of the p-type well and the bottom of the n-type impurity region NMSR is smaller than that between the surface of the p-type well PW and the bottom of the n-type impurity region NR, and further smaller than the first depth in the red pixel region RPER.

Figure 39:
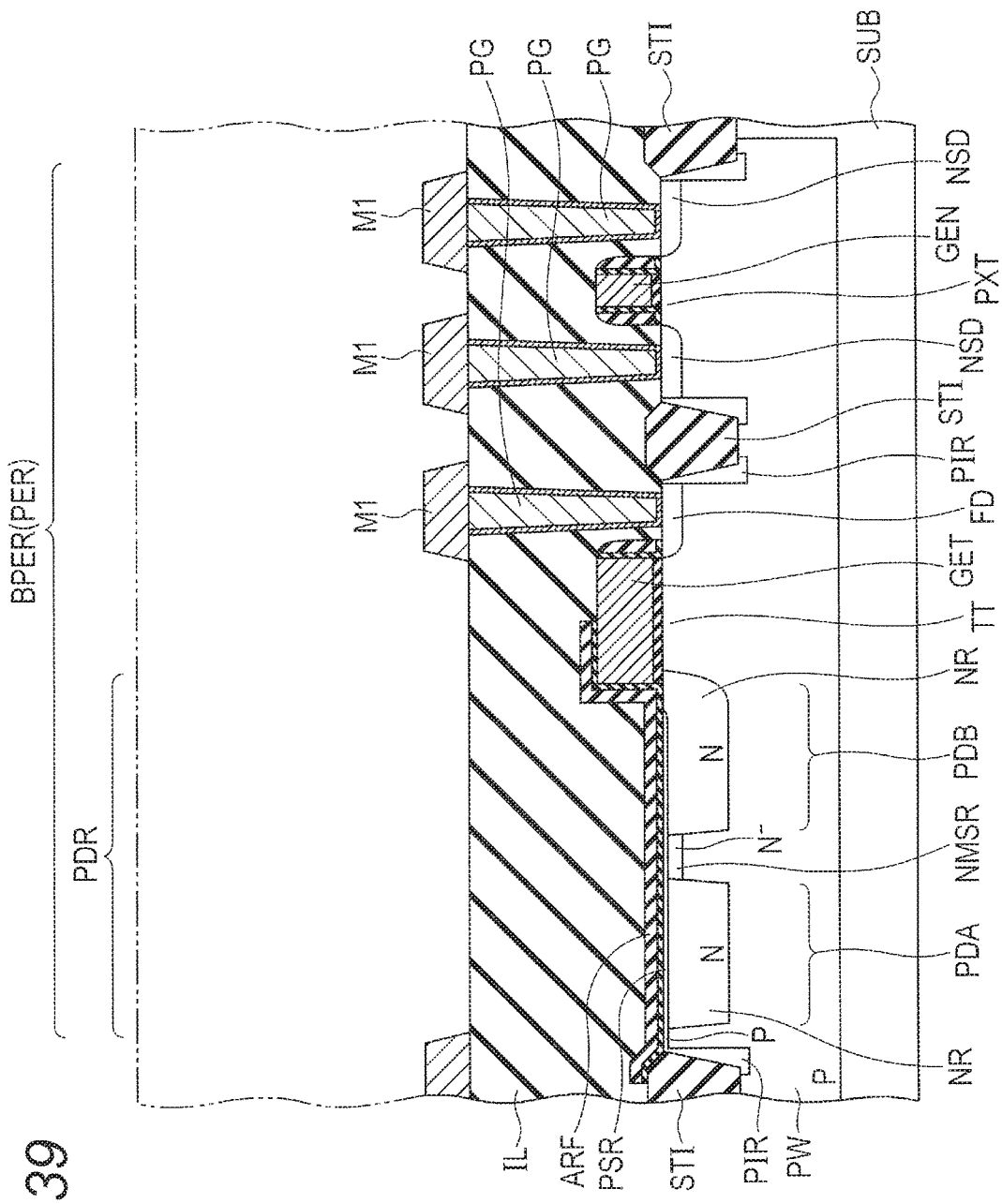
FIG. 39 is a sectional view taken along Sectional Line XXXIX-XXXIX illustrated in FIG. 36, in Fourth Embodiment.

Next, the n-type impurity region NMSR (N⁻ type) is formed in the portion of the p-type well PW located between the photodiode PDA and the photodiode PDB in the blue pixel region BPER, as illustrated in FIGS. 36 and 39. The n-type impurity region NMSR is formed to contact each of the n-type impurity region NR on one side and that on the other side. The impurity concentration of the n-type impurity region NMSR is lower than that of the n-type impurity region NR. The depth (third depth) between the surface of the p-type well and the bottom of the n-type impurity region NMSR is smaller than that between the surface of the p-type well PW and the bottom of the n-type impurity region NR, and further smaller than the second depth in the green pixel region GPER.

Because the configurations other than those are similar to those of the imaging device illustrated in FIGS. 24 to 27, like members will be denoted with like reference numerals, and description thereof will not be repeated unless it is necessary.

The aforementioned imaging device is fundamentally manufactured by applying the manufacturing method described in Second Embodiment to each of a red pixel, a green pixel, and a blue pixel. It is particularly assumed that: the injection energy, with which the n-type impurity region NMSR is formed in the red pixel region RPER, is referred to as injection energy A; the injection energy, with which the n-type impurity region NMSR is formed in the green pixel region GPER, is referred to as injection energy B; and the injection energy, with which the n-type impurity region NMSR is formed in the blue pixel region BPER, is referred to as injection energy C.

In this case, by setting the respective injection energy to satisfy the injection energy C<the injection energy B<the injection energy A, the second depth of the n-type impurity region NWMR formed in the green pixel region GPER becomes smaller than the first depth of the n-type impurity region NMR formed in the red pixel region RPER. The third depth of the n-type impurity region NTMR formed in the blue pixel region BPER becomes smaller than the second depth of the n-type impurity region NWMR formed in the green pixel region GPER.

In the aforementioned imaging device, the following effects can be obtained in addition to an effect in which the dynamic range of still pictures can be prevented from being decreased.

Similarly to the aforementioned description, crosstalk is more likely to be caused and hence the accuracy of auto focusing is more likely to be affected in the order of the red pixel region RPER, the green pixel region GPER, and the blue pixel region BPER, if the injection conditions, under which the n-type impurity region NMSR is formed in each of the red pixel region RPER, the green pixel region GPER, and the blue pixel region BPER, are the same as each other.

In the aforementioned imaging device, the depths of the n-type impurity regions NMSR are gradually smaller in the order of the red pixel region RPER, the green pixel region GPER, and the blue pixel region BPER, in which the accuracy of auto focusing is more likely to be affected in this order. Thereby, the number of the electrons flowing into the photodiode PDA or the photodiode PDB (crosstalk) can be suppressed, and hence the accuracy of auto focusing can be suppressed from being deteriorated.

Fifth Embodiment

Herein, a fifth example of an imaging device will be described, the imaging device being provided, between two photodiodes, with an n-type impurity region having a relatively low impurity concentration.

Figure 40:
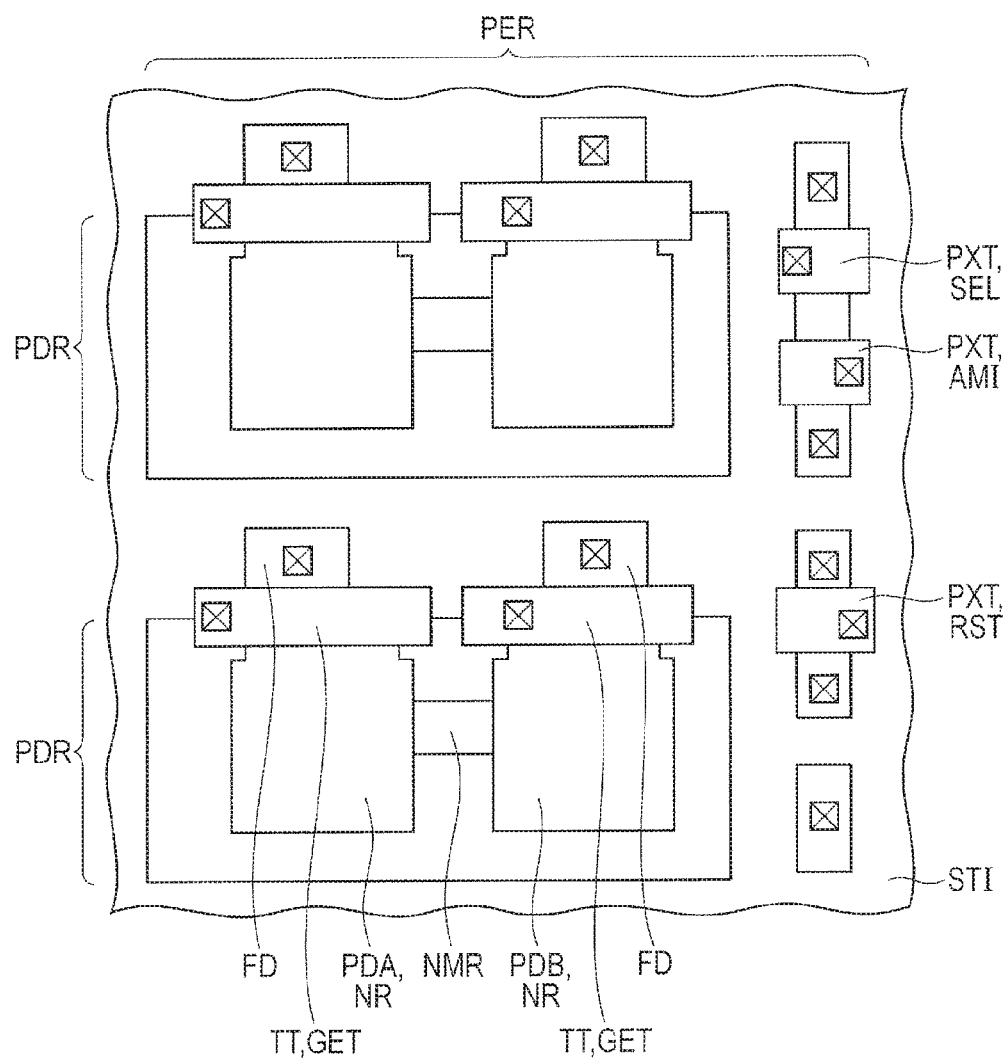
FIG. 40 is a plan view of an imaging device according to Fifth Embodiment.

As illustrated in FIG. 40, the n-type impurity region NMR is formed in the portion of the p-type well PW located between the photodiode PDA and the photodiode PDB. The n-type impurity region NMR is formed to contact each of the n-type impurity region NR on one side and that on the other side. The impurity concentration of the n-type impurity region NMR is lower than that of the n-type impurity region NR. The area (layout area) of the n-type impurity region NMR, obtained in plan view, is smaller than that of the n-type impurity region NMR illustrated, for example, in FIG. 2, obtained in plan view.

Specifically, the length of the n-type impurity region NMR extending in a direction (second direction), the second direction being almost perpendicular to a direction (first direction) in which the n-type impurity region NR on one side and that on the other side are spaced apart from each other, is smaller than the length of the n-type impurity region NR extending in the second direction. Herein, a sectional view taken along a sectional line crossing the n-type impurity region NMR is the same as the sectional view illustrated in FIG. 3. Because the configurations other than this are similar to those of the imaging device illustrated in FIG. 2, like members will be denoted with like reference numerals, and description thereof will not be repeated unless it is necessary.

Figure 41:
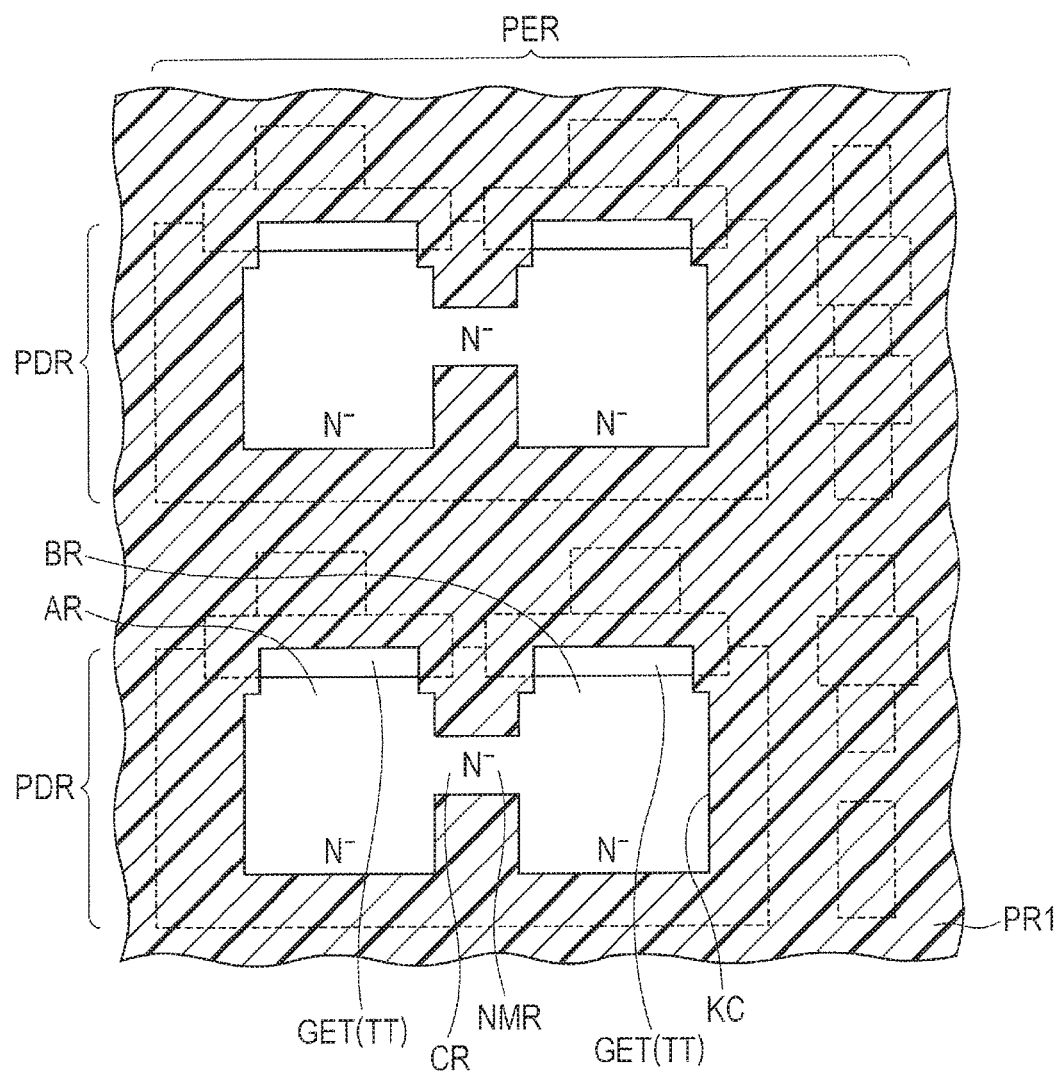
FIG. 41 is a plan view illustrating one step of a manufacturing method of an imaging device, in Fifth Embodiment.

Subsequently, an example of a manufacturing method of the aforementioned imaging device will be described. The photoresist pattern PR1 is first formed by performing steps similar to those illustrated in FIGS. 4 to 7 followed by a predetermined photoengraving process, as illustrated in FIG. 41. The opening KC exposing the region AR, the region BR, and part of the region CR is formed in the photoresist pattern PR1. Subsequently, a predetermined injection amount (second injection amount) of n-type impurities are injected by using the photoresist pattern PR1 as an injection mask.

Thereby, the n-type impurity region NMR is formed in the exposed p-type wells PW (region AR, region BR, and part of region CR). Thereafter, the photoresist pattern PR1 is removed.

Figure 42:
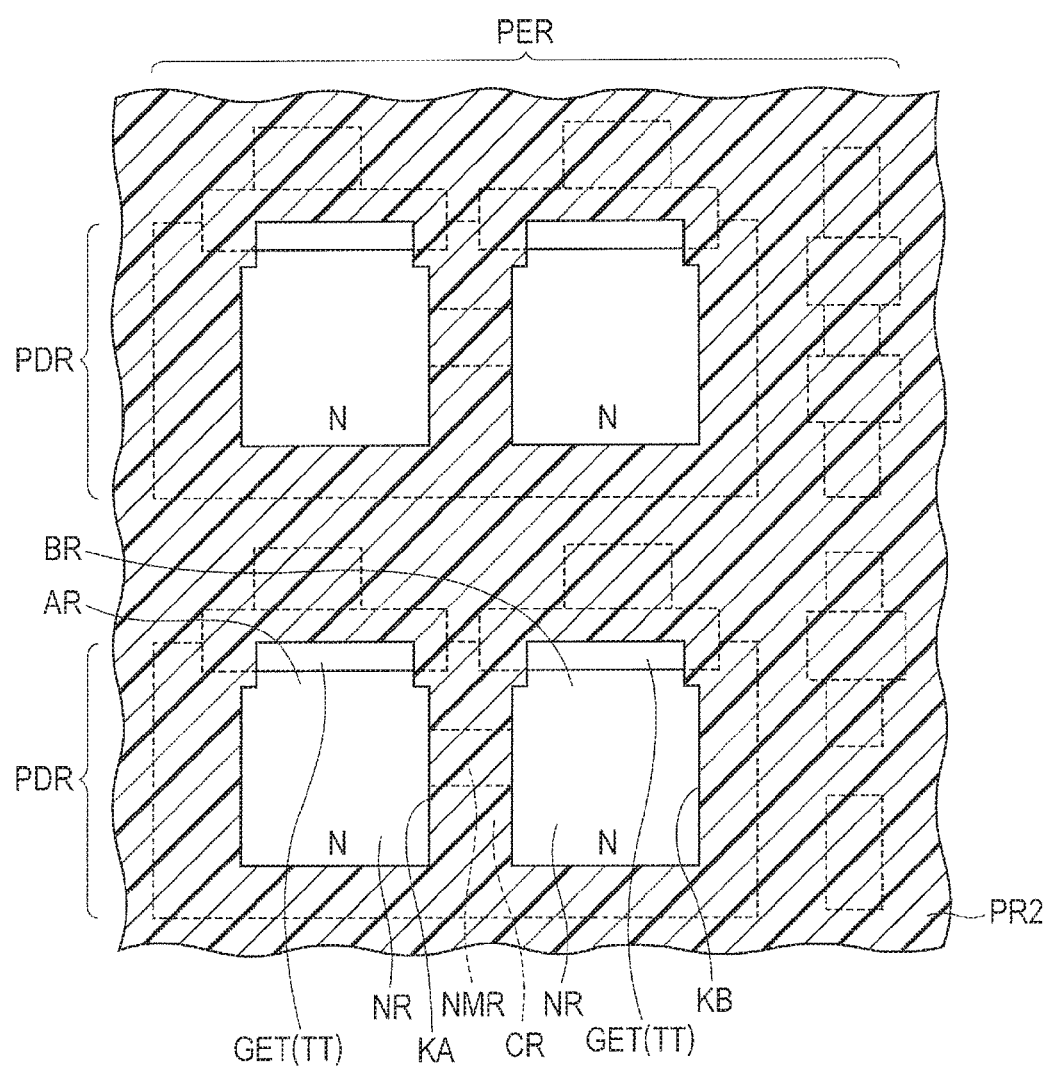
FIG. 42 is a plan view illustrating a step performed after the step illustrated in FIG. 41, in Fifth Embodiment.

Subsequently, the photoresist pattern PR2 is formed by performing a predetermined photoengraving process, as illustrated in FIG. 42. The opening KA exposing the region AR and the opening KB exposing the region BR are formed to be spaced apart from each other in the photoresist pattern PR2. Subsequently, another predetermined injection amount (first injection amount) of n-type impurities are injected by using the photoresist pattern PR2 as an injection mask. Thereby, the n-type impurity region NR is formed in each of the exposed p-type wells PW (region AR, region BR) in conjunction with the first injection. The impurity concentration of the n-type impurity region NR becomes higher than that of the n-type impurity region NMR.

Alternatively, the step, in which n-type impurities are injected by using the photoresist pattern PR1 as an injection mask, may be performed after the step, in which n-type impurities are injected by using the photoresist pattern PR2 as an injection mask, is performed.

After the n-type impurity region NR is formed, the photoresist pattern PR2 is removed. Thereafter, main parts of the imaging device illustrated in FIG. 40 are completed by performing steps similar to those illustrated in FIGS. 11 to 13.

In the aforementioned imaging device, the following effects can be obtained in addition to an effect in which the dynamic range of still pictures can be prevented from being decreased. That is, in the aforementioned imaging device, the length of the n-type impurity region NMR extending in the second direction is smaller than that of the n-type impurity region NR extending in the second direction, and the layout area of the n-type impurity region NMR is smaller than that of the n-type impurity region NMR of the imaging device illustrated, for example, in FIG. 2. Thereby, the number of the electrons generated in the n-type impurity region NMR, etc., can be suppressed and crosstalk can be suppressed, which can contribute to an improvement in the accuracy of focusing. Further, shooting of a moving picture is less likely to be adversely affected.

Sixth Embodiment

Herein, a sixth example of an imaging device will be described, the imaging device being provided, between two photodiodes, with an n-type impurity region having a relatively low impurity concentration.

Figure 43:
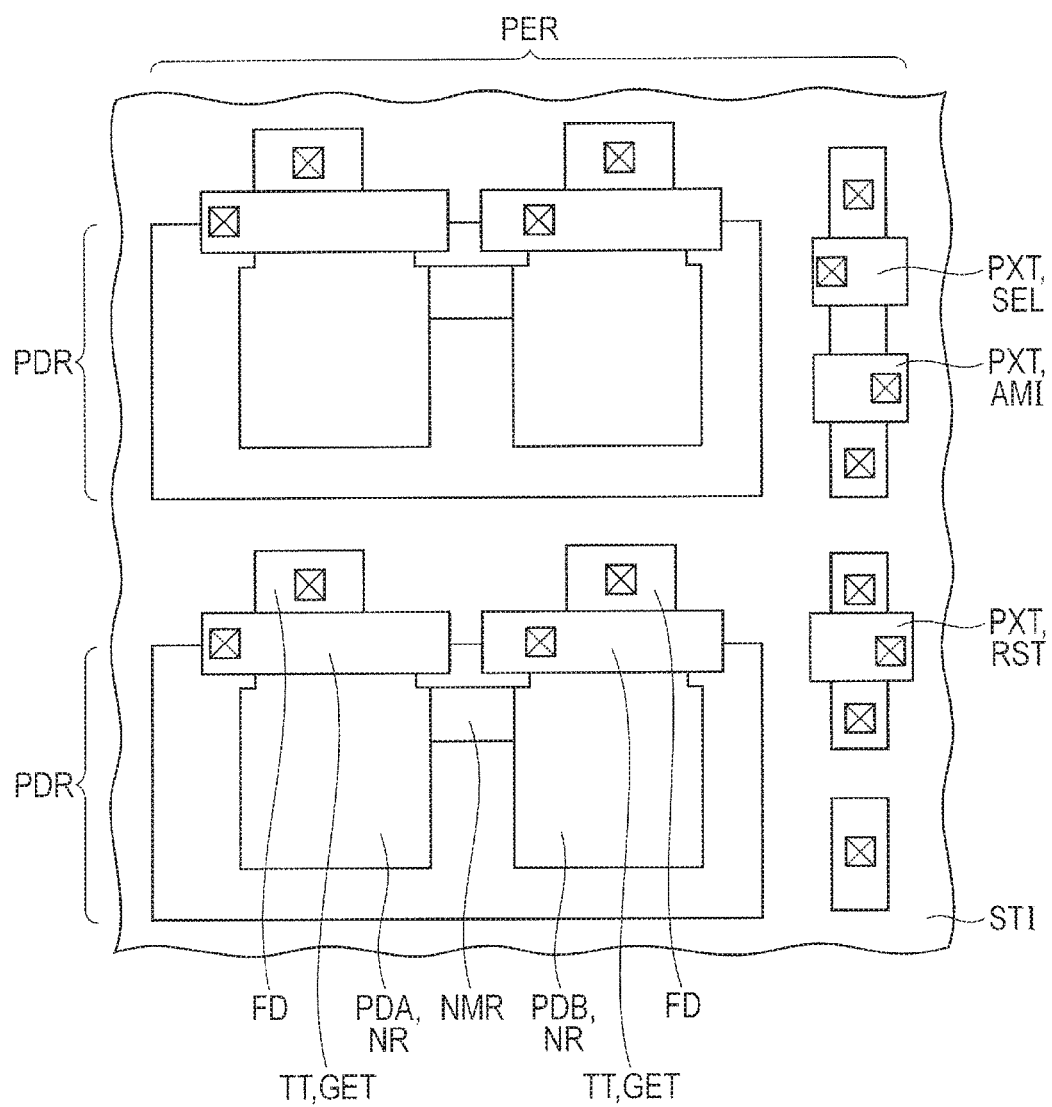
FIG. 43 is a plan view of an imaging device according to Sixth Embodiment.

As illustrated in FIG. 43, the n-type impurity region NMR is formed in the portion of the p-type well PW located between the photodiode PDA and the photodiode PDB. The n-type impurity region NMR is formed to contact each of the n-type impurity region NR on one side and that on the other side. The impurity concentration of the n-type impurity region NMR is lower than that of the n-type impurity region NR. The layout area of the n-type impurity region NMR is smaller than that of the n-type impurity region NMR illustrated, for example, in FIG. 2. The n-type impurity region NMR is formed on the side where the gate electrode GET of the transfer transistor TT is arranged.

Herein, a sectional view taken along a sectional line crossing the n-type impurity region NMR is the same as the sectional view illustrated in FIG. 3. Because the configurations other than this are similar to those of the imaging device illustrated in FIG. 2, like members will be denoted with like reference numerals, and description thereof will not be repeated unless it is necessary.

The aforementioned imaging device can be formed by applying the manufacturing method described in Fifth Embodiment in which the opening pattern of the photoresist pattern PR1 is only changed. That is, a photoresist pattern, in which, of the openings exposing the regions AR, BR, and CR (see FIG. 41), the portion of the opening exposing the region CR is located on the side of the gate electrode GET, is formed as the photoresist pattern PR1. N-type impurities are injected by using the photoresist pattern as an injection mask, and the n-type impurity region NMR is finally formed on the side of the gate electrode GET of the transfer transistor TT.

In the aforementioned imaging device, the following effects can be obtained in addition to an effect in which the dynamic range of still pictures can be prevented from being decreased. That is, in the aforementioned imaging device, the layout area of the n-type impurity region NMR is smaller than that of the n-type impurity region NMR of the imaging device illustrated, for example, in FIG. 2. Thereby, the number of the electrons generated in the n-type impurity region NMR, etc., can be suppressed and crosstalk can be suppressed, which can contribute to an improvement in the accuracy of focusing. Further, shooting of a moving picture is less likely to be adversely affected.

Further, the n-type impurity region NMR is formed on the side where the gate electrode GET of the transfer transistor TT is arranged. Thereby, it becomes easier to transfer the electrons generated in the n-type impurity region NMR, etc., to the floating diffusion region FD, which can improve transfer characteristics.

Seventh Embodiment

Herein, a seventh example of an imaging device will be described, the imaging device being provided, between two photodiodes, with an n-type impurity region having a relatively low impurity concentration.

Figure 44:
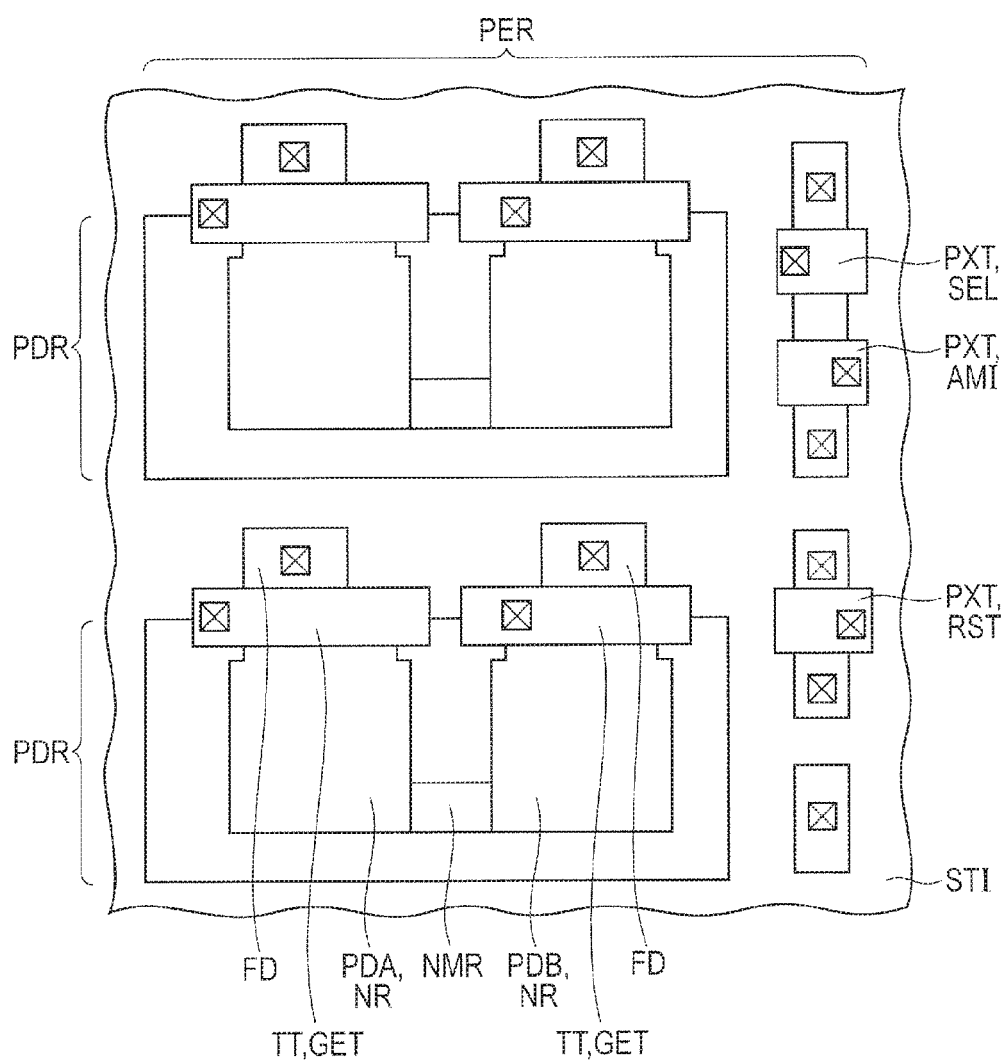
FIG. 44 is a plan view of an imaging device according to Seventh Embodiment.

As illustrated in FIG. 44, the n-type impurity region NMR is formed in the portion of the p-type well PW located between the photodiode PDA and the photodiode PDB. The n-type impurity region NMR is formed to contact each of the n-type impurity region NR on one side and that on the other side. The impurity concentration of the n-type impurity region NMR is lower than that of the n-type impurity region NR. The layout area of the n-type impurity region NMR is smaller than that of the n-type impurity region NMR illustrated, for example, in FIG. 2. The n-type impurity region NMR is formed on the side opposite to the side where the gate electrode GET of the transfer transistor TT is arranged.

Herein, a sectional view taken along a sectional line crossing the n-type impurity region NMR is the same as the sectional view illustrated in FIG. 3. Because the configurations other than this are similar to those of the imaging device illustrated in FIG. 2, like members will be denoted with like reference numerals, and description thereof will not be repeated unless it is necessary.

The aforementioned imaging device can be formed by applying the manufacturing method described in Fifth Embodiment in which the opening pattern of the photoresist pattern PR1 is only changed. That is, a photoresist pattern, in which, of the openings exposing the regions AR, BR, and CR (see FIG. 41), the opening exposing the region CR is located on the side opposite to the side where the gate electrode GET is arranged, is formed as the photoresist pattern PR1. N-type impurities are injected by using the photoresist pattern as an injection mask, and the n-type impurity region NMR is finally formed on the side opposite to the side where the gate electrode GET of the transfer transistor TT is arranged.

In the aforementioned imaging device, the following effects can be obtained in addition to an effect in which the dynamic range of still pictures can be prevented from being decreased. That is, in the aforementioned imaging device, the layout area of the n-type impurity region NMR is smaller than that of the n-type impurity region NMR of the imaging device illustrated, for example, in FIG. 2. Thereby, the number of the electrons generated in the n-type impurity region NMR, etc., can be suppressed and crosstalk can be suppressed, which can contribute to an improvement in the accuracy of focusing. Further, shooting of a moving picture is less likely to be adversely affected.

Also, the n-type impurity region NMR is formed on the side opposite to the side where the gate electrode GET of the transfer transistor TT is arranged. Because the impurity concentration of the P-type impurity region PSR is likely to become low in a portion directly below the side surface of the gate electrode GET, dark current or white spots in dark may be caused in the portion. Accordingly, the n-type impurity region NMR can be made less likely to be affected by dark current, etc., by separating it from a portion where such dark current, etc., may be caused.

Eighth Embodiment

Herein, another example of an imaging device, provided with n-type impurity regions each corresponding to a red pixel, a green pixel, and a blue pixel, will be described as a seventh example of an imaging device provided, between two photodiodes, with an n-type impurity region having a relatively low impurity concentration.

Figure 45:
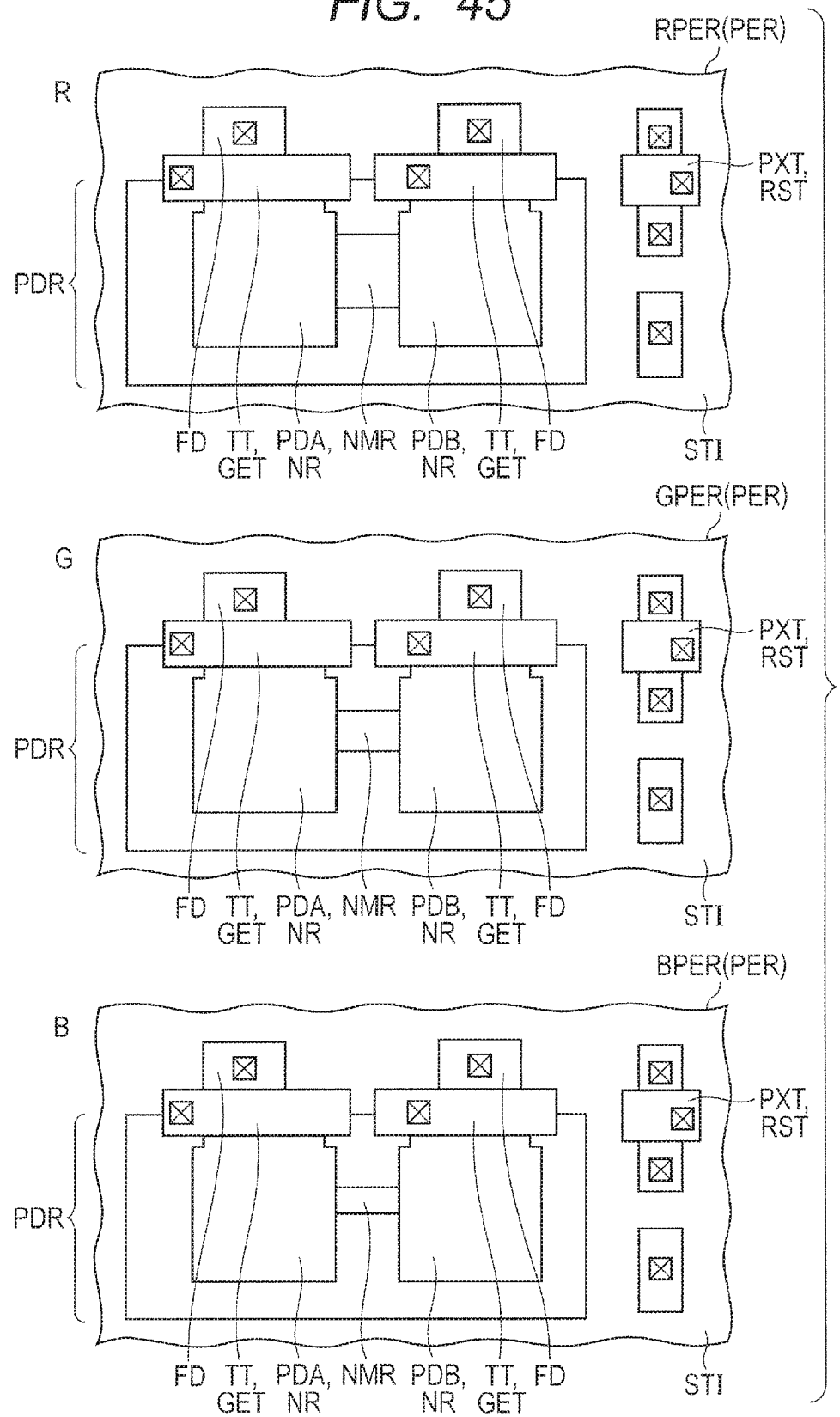
FIG. 45 is a plan view of an imaging device according to Eighth Embodiment.

First, the n-type impurity region NMR (N⁻ type) is formed in the portion of the p-type well PW located between the photodiode PDA and the photodiode PDB in the red pixel region RPER, as illustrated in FIG. 45. The impurity concentration of the n-type impurity region NMR is lower than that of the n-type impurity region NR (see FIG. 3). Also, the layout area of the n-type impurity region NMR is smaller than that of the n-type impurity region NMR illustrated, for example, in FIG. 2.

Next, the n-type impurity region NMR (N⁻ type) is formed in the portion of the p-type well PW located between the photodiode PDA and the photodiode PDB in the green pixel region GPER. The impurity concentration of the n-type impurity region NMR is lower than that of the n-type impurity region NR (see FIG. 3). Also, the layout area of the n-type impurity region NMR is smaller than that of the n-type impurity region NMR in the red pixel region RPER.

Next, the n-type impurity region NMR (N⁻ type) is formed in the portion of the p-type well PW located between the photodiode PDA and the photodiode PDB in the blue pixel region BPER. The impurity concentration of the n-type impurity region NMR is lower than that of the n-type impurity region NR (see FIG. 3). Also, the layout area of the n-type impurity region NMR is smaller than that of the n-type impurity region NMR in the green pixel region GPER.

In each of the red pixel region RPER, the green pixel region GPER, and the blue pixel region BPER, a sectional view taken along a sectional line crossing the n-type impurity region NMR is the same as the sectional view illustrated in FIG. 3. Because the configurations other than this are similar to those of the imaging device illustrated in FIG. 19, like members will be denoted with like reference numerals, and description thereof will not be repeated unless it is necessary.

Subsequently, an example of a manufacturing method of the aforementioned imaging device will be described. A photoresist pattern (not illustrated) is first formed by performing steps similar to those illustrated in FIGS. 4 to 6 followed by a step corresponding to the step illustrated in FIG. 7. In this case, a photoresist pattern, having openings each exposing the region CR located between the region AR where the photodiode PDA is to be formed and the region BR where the photodiode PDB is to be formed, is formed, in which the areas of the openings are smaller in the order of the red pixel region RPER, the green pixel region GPER, and the blue pixel region BPER. Subsequently, n-type impurities are injected by using the photoresist pattern as an injection mask. Thereby, the n-type impurity region NMR (see FIG. 8 or FIG. 45) is formed in the exposed p-type wells PW (region AR, region BR, region CR).

Subsequently, n-type impurities are injected into each of the region AR where the photodiode PDA is to be formed and the region BR where the photodiode PDB is to be formed, by steps corresponding to the steps illustrated in FIGS. 9 and 10. Thereby, the n-type impurity region NR (see FIG. 10) is formed in the exposed p-type wells PW (region AR, region BR) in conjunction with the first injection. Thereafter, main parts of the imaging device illustrated in FIG. 45 are completed by performing steps similar to those illustrated in FIGS. 11 to 13.

In the aforementioned imaging device, the following effects can be obtained in addition to an effect in which the dynamic range of still pictures can be prevented from being decreased.

As already described, if the injection conditions, under which the n-type impurity region NMR is formed in each of the red pixel region RPER, the green pixel region GPER, and the blue pixel region BPER, are the same as each other, the accuracy of auto focusing is more likely to be affected by crosstalk in the order of the red pixel region RPER, the green pixel region GPER, and the blue pixel region BPER.

In the aforementioned imaging device, the layout areas of the n-type impurity region NMR are gradually smaller in the order of the red pixel region RPER, the green pixel region GPER, and the blue pixel region BPER, in which the accuracy of auto focusing is more likely to be affected in this order. Thereby, the number of the electrons generated in the n-type impurity region NMR, etc., can be gradually suppressed and crosstalk can be suppressed, and hence the accuracy of auto focusing can be suppressed from being deteriorated. Further, shooting of a moving picture is less likely to be adversely affected.

Ninth Embodiment

Herein, an imaging device, the manufacturing method of which is added with a heat treatment step, will be described as a ninth example of an imaging device provided, between two photodiodes, with an n-type impurity region having a relatively low impurity concentration.

Figure 46:
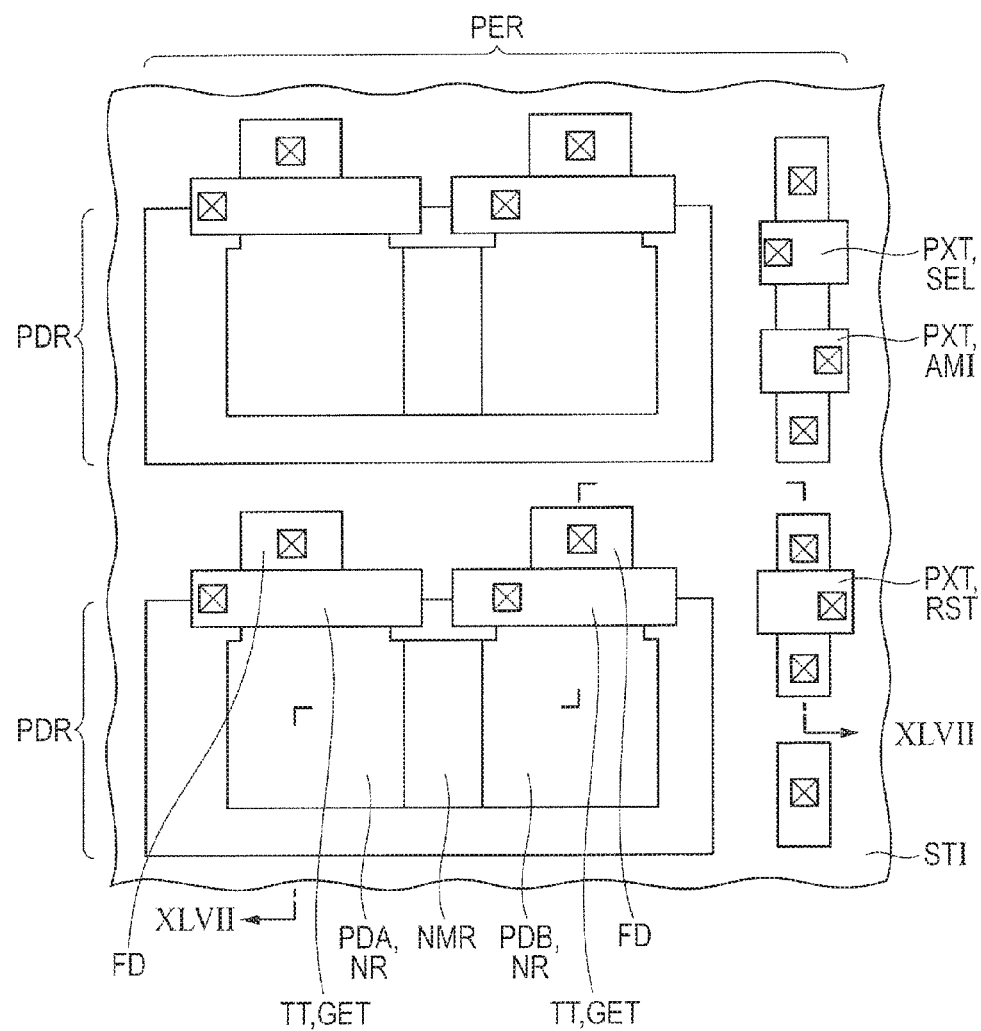
FIG. 46 is a plan view of an imaging device according to Ninth Embodiment.
Figure 47:
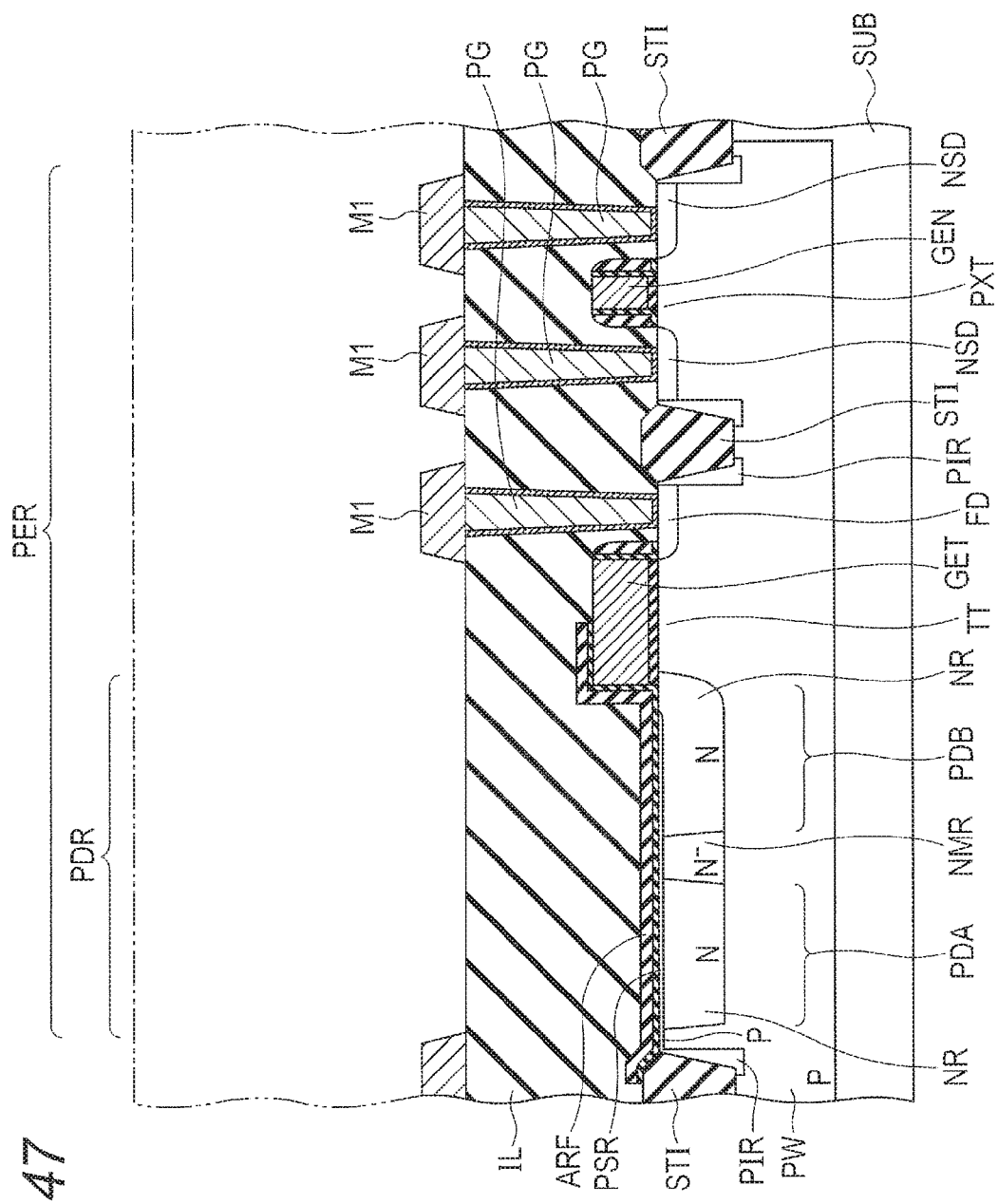
FIG. 47 is a sectional view taken along Sectional Line XLVII-XLVII illustrated in FIG. 46, in Ninth Embodiment.

As illustrated in FIGS. 46 and 47, the n-type impurity region NMR is formed in the portion of the p-type well PW located between the photodiode PDA and the photodiode PDB, and the impurity concentration of the n-type impurity region NMR is lower than that of the n-type impurity region NR. The configuration of an imaging device is basically the same as that of the imaging device described in First Embodiment, and the same members as those of the imaging device illustrated in FIGS. 2 and 3 will be denoted with like reference numerals, and description thereof will not be repeated unless it is necessary.

Subsequently, an example of a manufacturing method of the aforementioned imaging device will be described. The photoresist pattern PR1 (see FIG. 8) is first formed by performing steps similar to those illustrated in FIGS. 4 to 8. N-type impurities are injected by using the photoresist pattern PR1 as an injection mask. Thereby, the n-type impurity region NMR (see FIG. 8) is formed in the exposed p-type wells PW (region AR, region BR, region CR).

Figure 48:
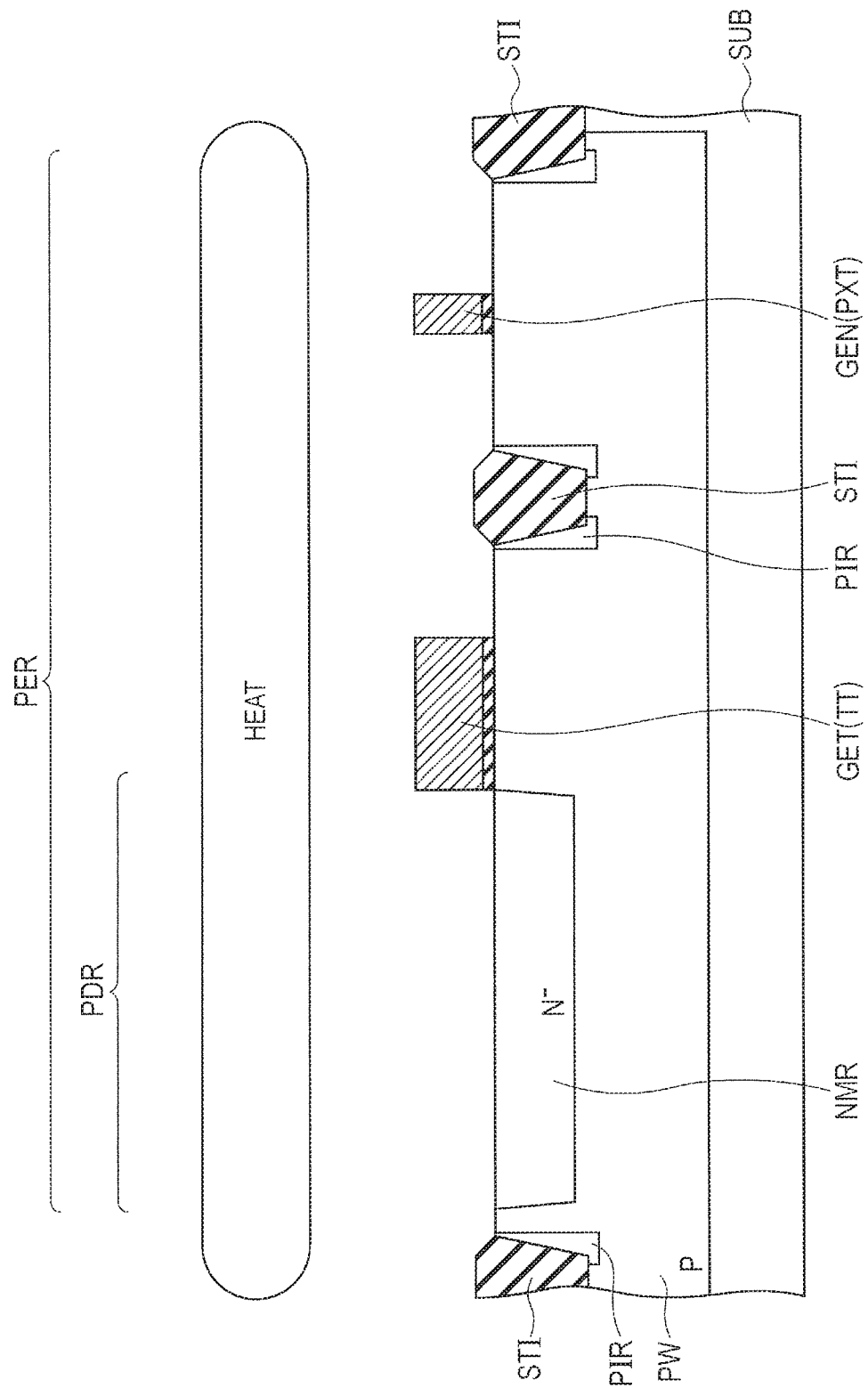
FIG. 48 is a sectional view illustrating one step of a manufacturing method of an imaging device, in Ninth Embodiment.

After the photoresist pattern PR1 (see FIG. 8) is removed, a heat treatment is performed as illustrated in FIG. 48. Herein, when a diffusion furnace is used, the heat treatment is performed, for example, under a temperature condition of 700° C. or higher. When a lamp annealing apparatus is used, the heat treatment is performed, for example, under a temperature condition of 1000° C. or higher.

Subsequently, the photoresist pattern PR2 (see FIG. 9) is formed by performing steps similar to those illustrated in FIGS. 8 and 9. N-type impurities are injected by using the photoresist pattern PR2 as an injection mask. Thereby, the n-type impurity region NR (see FIG. 9) is formed in each of the exposed p-type wells PW (region AR, region BR) in conjunction with the first injection.

Figure 49:
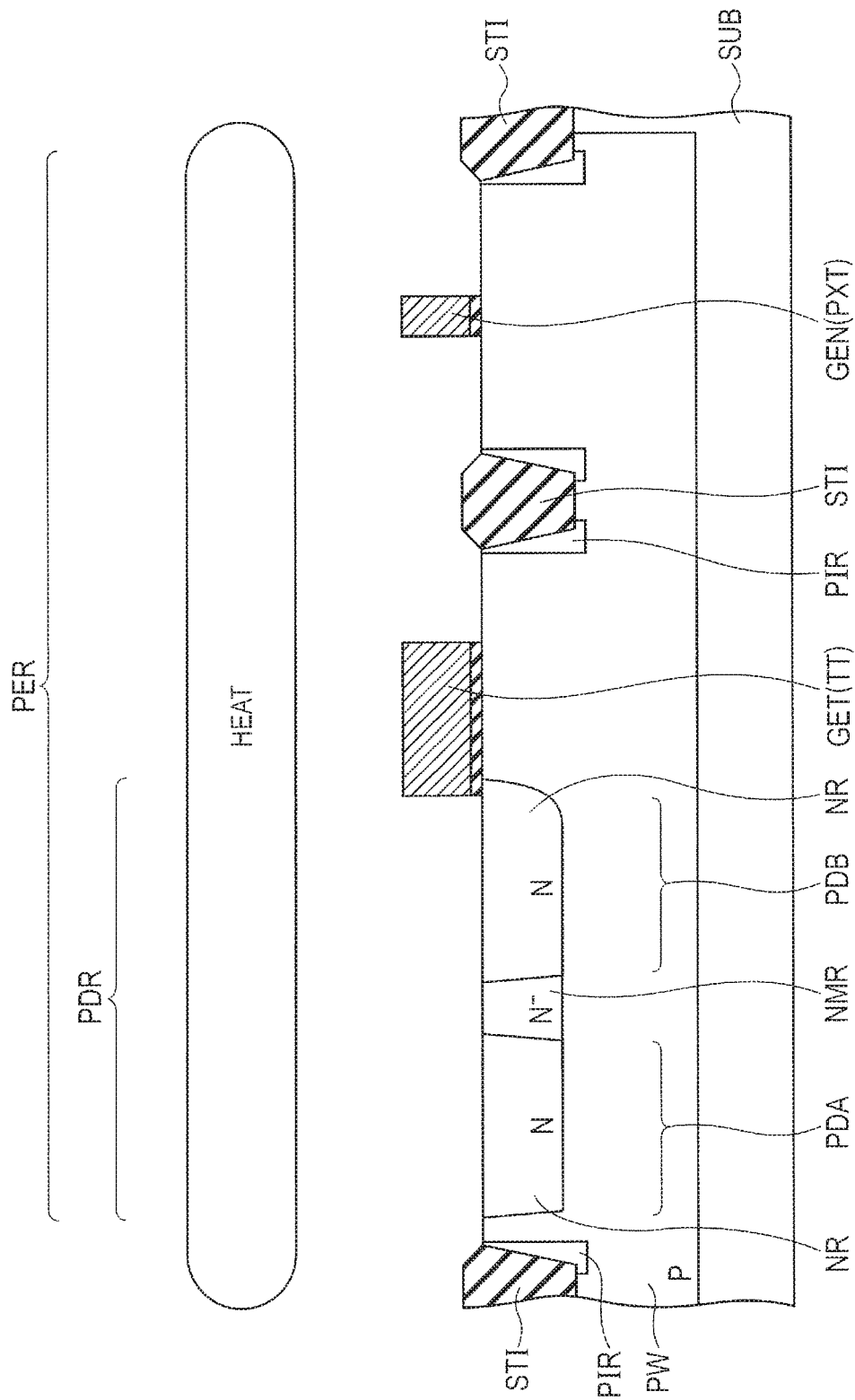
FIG. 49 is a sectional view illustrating a step performed after the step illustrated in FIG. 48, in Ninth Embodiment.

After the photoresist pattern PR2 (see FIG. 9) is removed, a heat treatment is performed as illustrated in FIG. 49. Also herein, when a diffusion furnace is used, the heat treatment is performed under a temperature condition of 700° C. or higher, or when a lamp annealing apparatus is used, the heat treatment is performed under a temperature condition of 1000° C. or higher. Thereafter, main parts of the imaging device illustrated in FIGS. 46 and 47 are completed by performing steps similar to those illustrated in FIGS. 11 to 13.

In the aforementioned imaging device, the following effects can be obtained in addition to an effect in which the dynamic range of still pictures can be prevented from being decreased.

A crystal defect may be caused in the p-type well PW by injecting impurities into the p-type well PW where the photodiodes PDA and PDB are to be formed. Dark current or white spots in dark may be caused by the crystal defect.

In a manufacturing method of the aforementioned imaging device, a heat treatment is performed after the n-type impurity region NMR is formed by injecting n-type impurities. A heat treatment is further performed after the n-type impurity region NR is formed by injecting n-type impurities. Thereby, even if a crystal defect is caused in the p-type well PW by the first injection of n-type impurities, the crystal defect can be recovered by the heat treatment.

Further, even if a crystal defect is caused in the p-type well PW by the second injection of n-type impurities, the crystal defect can be recovered by the heat treatment. Even if a crystal defect is caused in the p-type well PW by injecting impurities, the crystal defect can be thus recovered surely. As a result, dark current or white spots in dark can be surely reduced.

In the manufacturing method of the aforementioned imaging device, the case has been described, in which after the step of injecting n-type impurities by using the photoresist pattern PR1 as an injection mask is performed, the step of injecting n-type impurities by using the photoresist pattern PR2 as an injection mask is performed. Contrary to these steps, the step of injecting n-type impurities by using the photoresist pattern PR1 as an injection mask may be performed after the step of injecting n-type impurities by using the photoresist pattern PR2 as an injection mask is performed. A crystal defect can be surely recovered by performing a heat treatment after each of the steps, whereby dark current, etc., can be surely reduced.

Tenth Embodiment

Herein, an imaging device, in which an n-type impurity region is formed without adding an injection mask, will be described as a tenth example of an imaging device provided, between two photodiodes, with an n-type impurity region having a relatively low impurity concentration.

Figure 50:
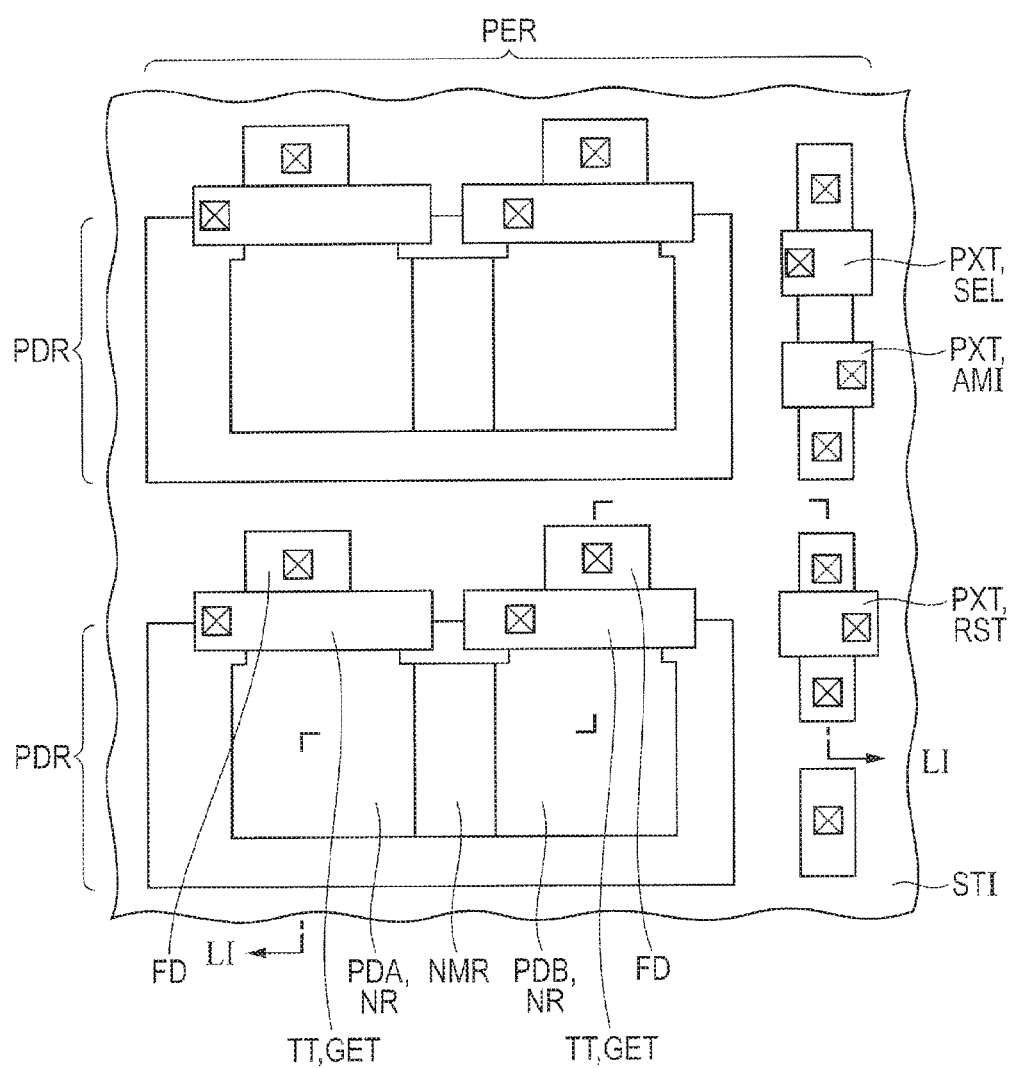
FIG. 50 is a plan view of an imaging device according to Tenth Embodiment.
Figure 51:
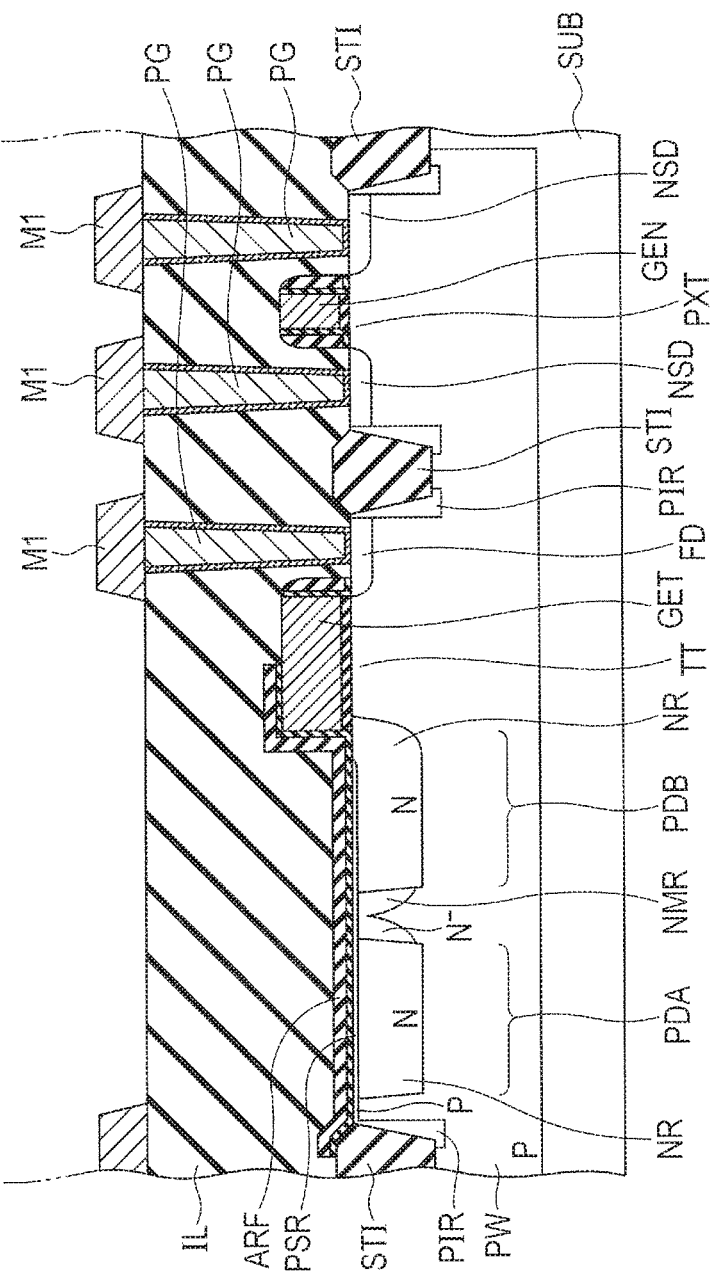
FIG. 51 is a sectional view taken along Sectional Line LI-LI illustrated in FIG. 50, in Tenth Embodiment.

As illustrated in FIGS. 50 and 51, the n-type impurity region NMR is formed in the portion of the p-type well PW located between the photodiode PDA and the photodiode PDB, and the impurity concentration of the n-type impurity region NMR is lower than that of the n-type impurity region NR. The n-type impurity region NMR is formed by obliquely injecting n-type impurities. Because the configurations other than this are similar to those of the imaging device illustrated in FIGS. 2 and 3, like members will be denoted with like reference numerals, and description thereof will not be repeated unless it is necessary.

Figure 52:
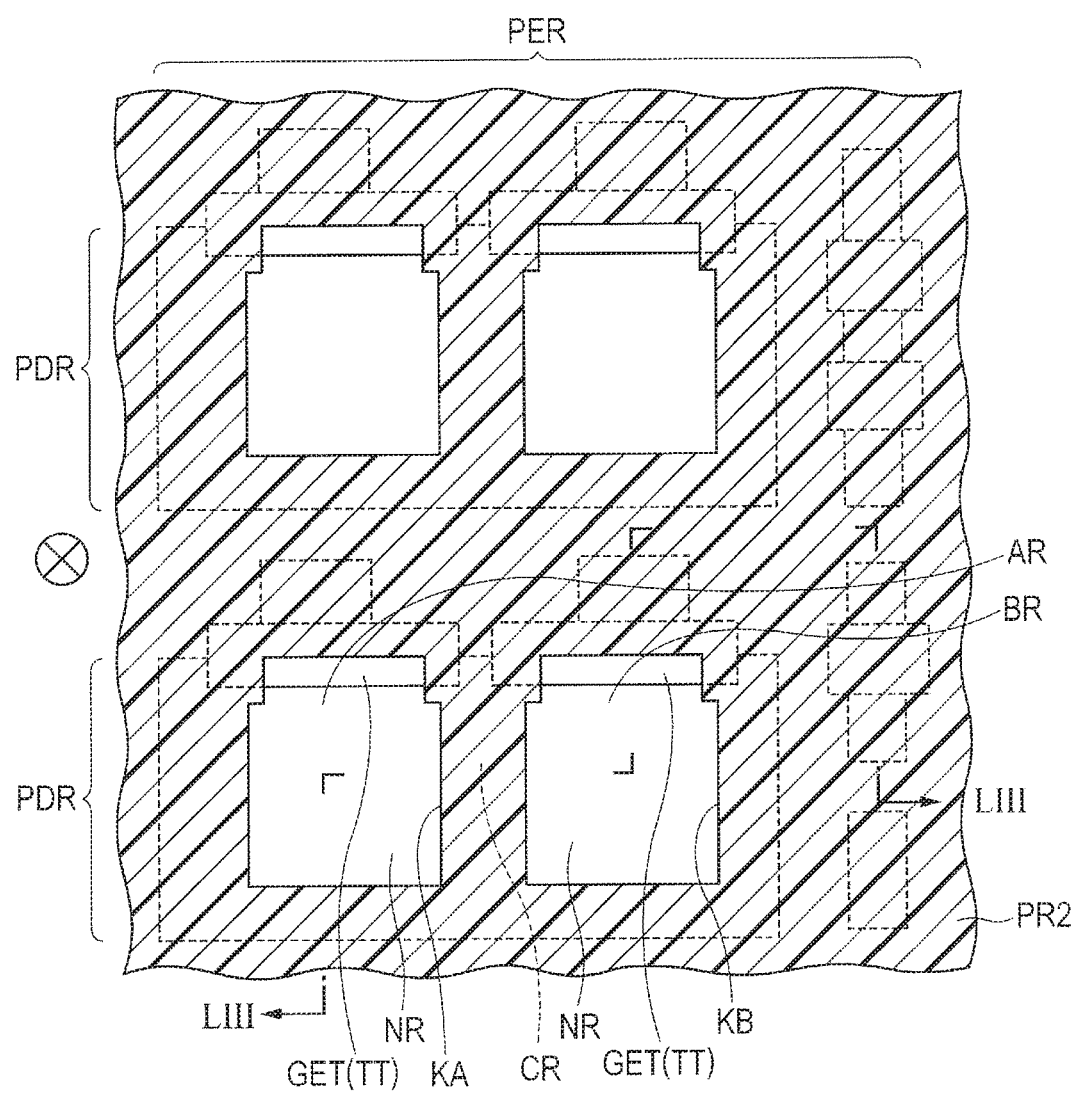
FIG. 52 is a plan view illustrating one step of a manufacturing method of an imaging device, in Tenth Embodiment.
Figure 53:
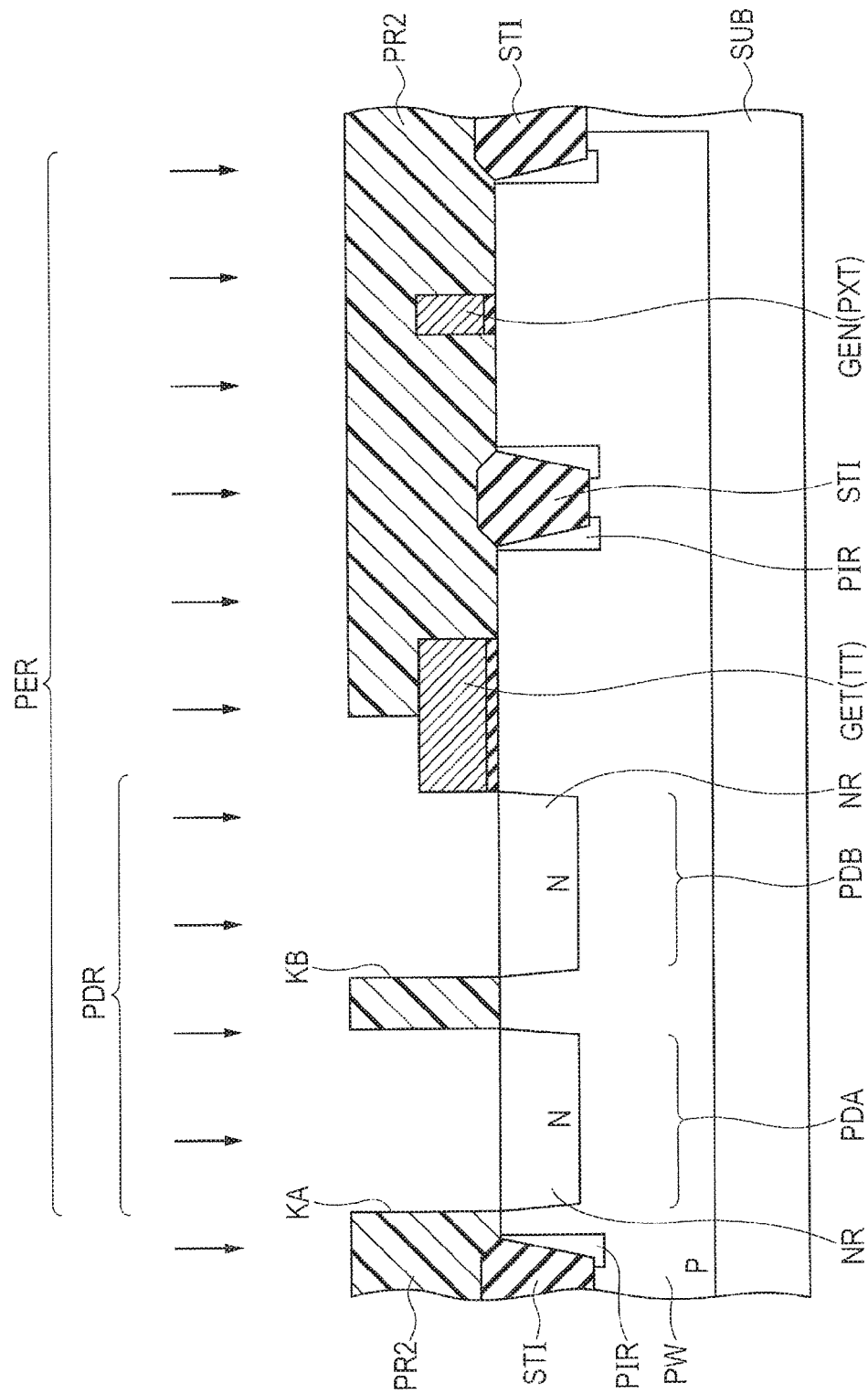
FIG. 53 is a sectional view taken along Sectional Line LIII-LIII illustrated in FIG. 52, in Tenth Embodiment.

Subsequently, a manufacturing method of the aforementioned imaging device will be described. The photoresist pattern PR2 is formed by performing steps similar to those illustrated in FIGS. 4 to 6 followed by a predetermined photoengraving process, as illustrated in FIGS. 52 and 53. The opening KA, exposing the region AR where the photodiode PDA is to be formed, and the opening KB, exposing the region BR where the photodiode PDB is to be formed, are formed to be spaced apart from each other in the photoresist pattern PR2.

Subsequently, n-type impurities are injected almost perpendicularly to the surface of the semiconductor substrate SUB (p-type well PW) by using the photoresist pattern PR2 as an injection mask (see the reference numerals at the tails of the arrows). Thereby, the n-type impurity region NR is formed in the exposed p-type wells PW (region AR, region BR).

Figure 54:
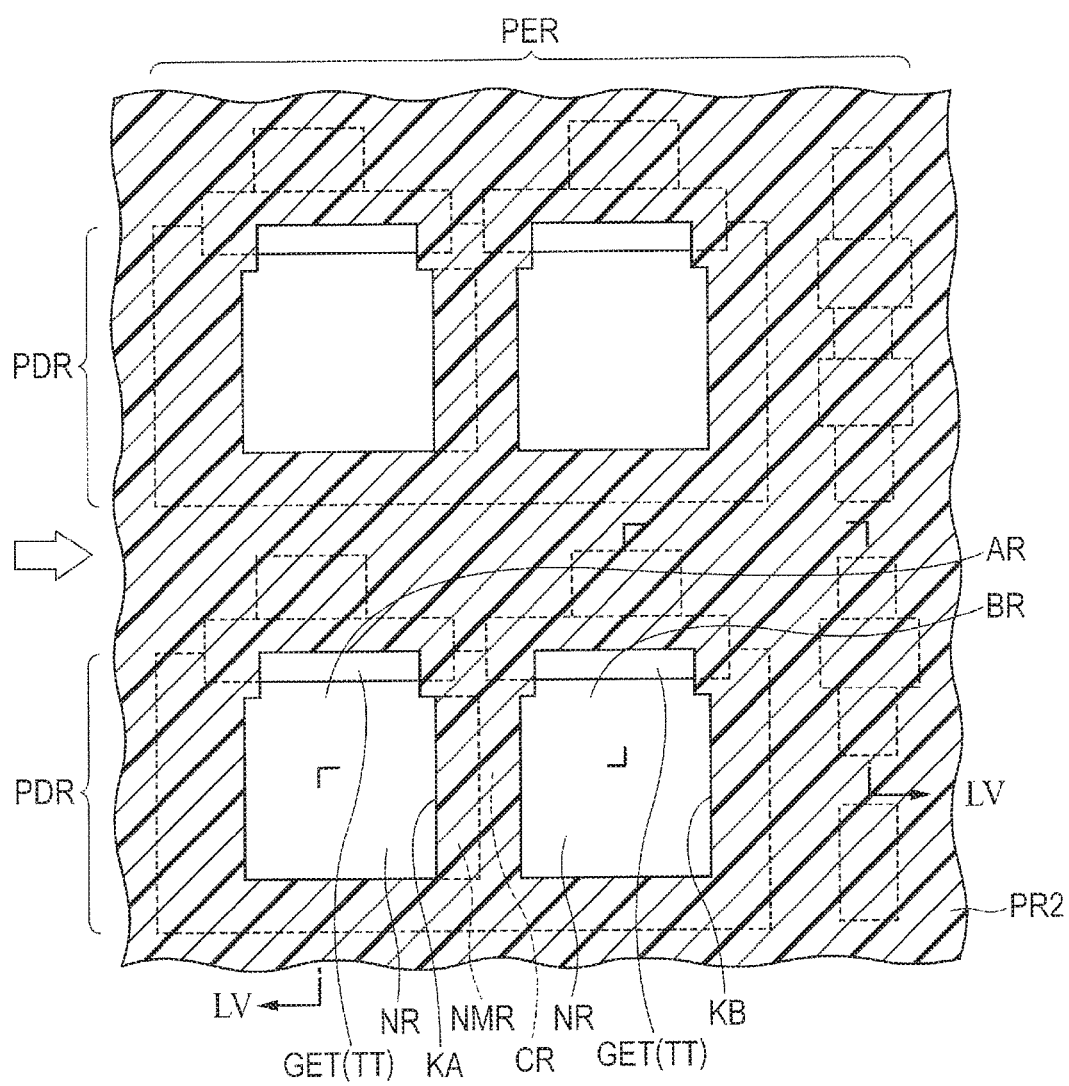
FIG. 54 is a plan view illustrating a step performed after the step illustrated in FIGS. 52 and 53, in Tenth Embodiment.
Figure 55:
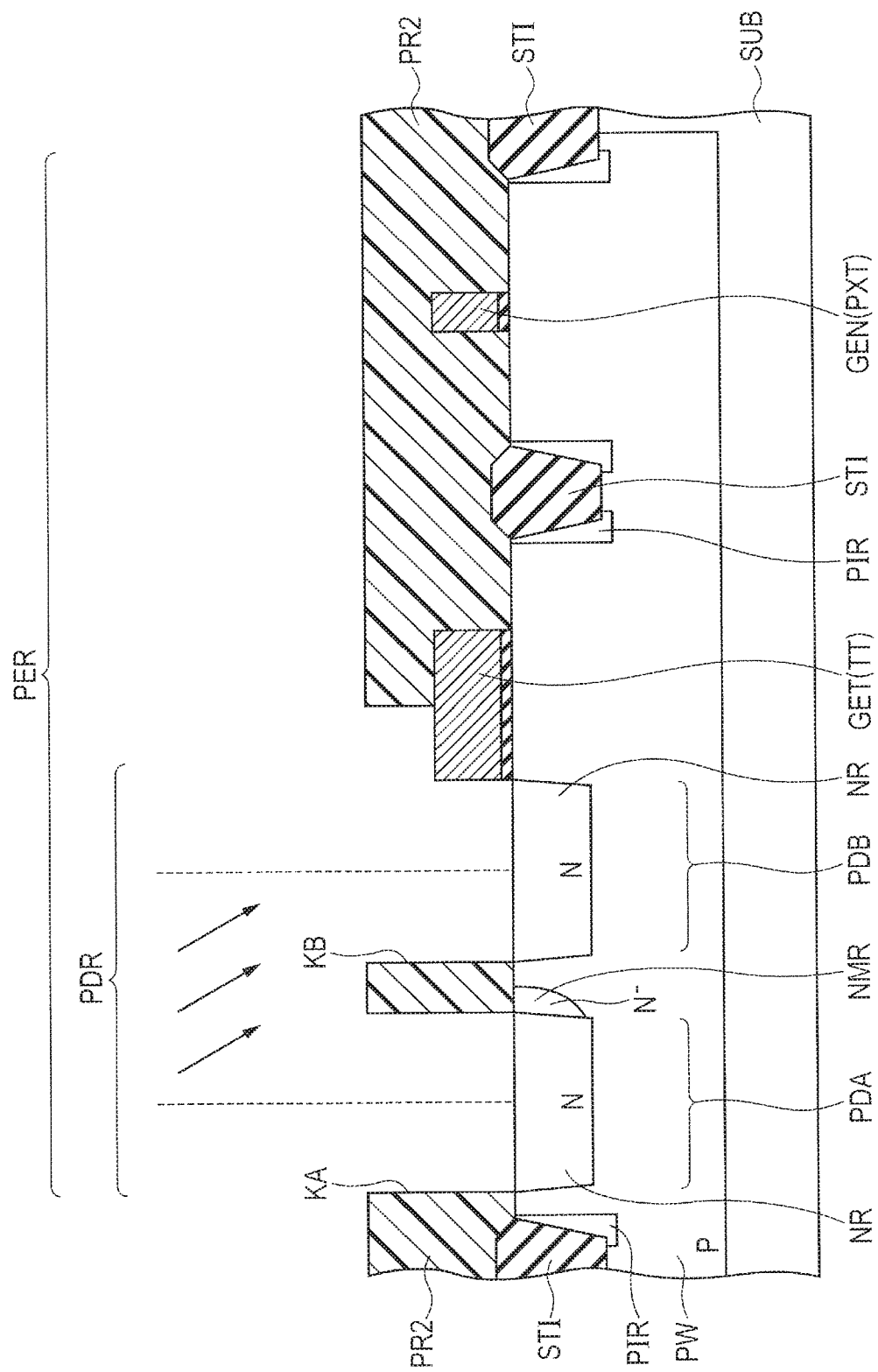
FIG. 55 is a sectional view taken along Sectional Line LV-LV illustrated in FIG. 54, in Tenth Embodiment.

Subsequently, n-type impurities are obliquely injected into the portion of the p-type well PW located directly below the portion of the photoresist pattern PR2 covering the space between the opening KA and the opening KB. That is, n-type impurities are injected at a predetermined angle with respect to the perpendicular of the surface of the semiconductor substrate SUB (p-type well PW). As illustrated in FIGS. 54 and 55, n-type impurities are injected at an injection angle having a component (see the bold arrow) in a direction almost perpendicular (right direction with respect to the plane of the paper) to a direction in which the portion of the photoresist pattern PR2 extends (up-down direction with respect to the plane of the paper). Thereby, part of the n-type impurity region NMR is formed from the region AR where the photodiode PDA is to be formed toward the portion of the p-type well PW located directly below the portion of the photoresist pattern PR2.

Figure 56:
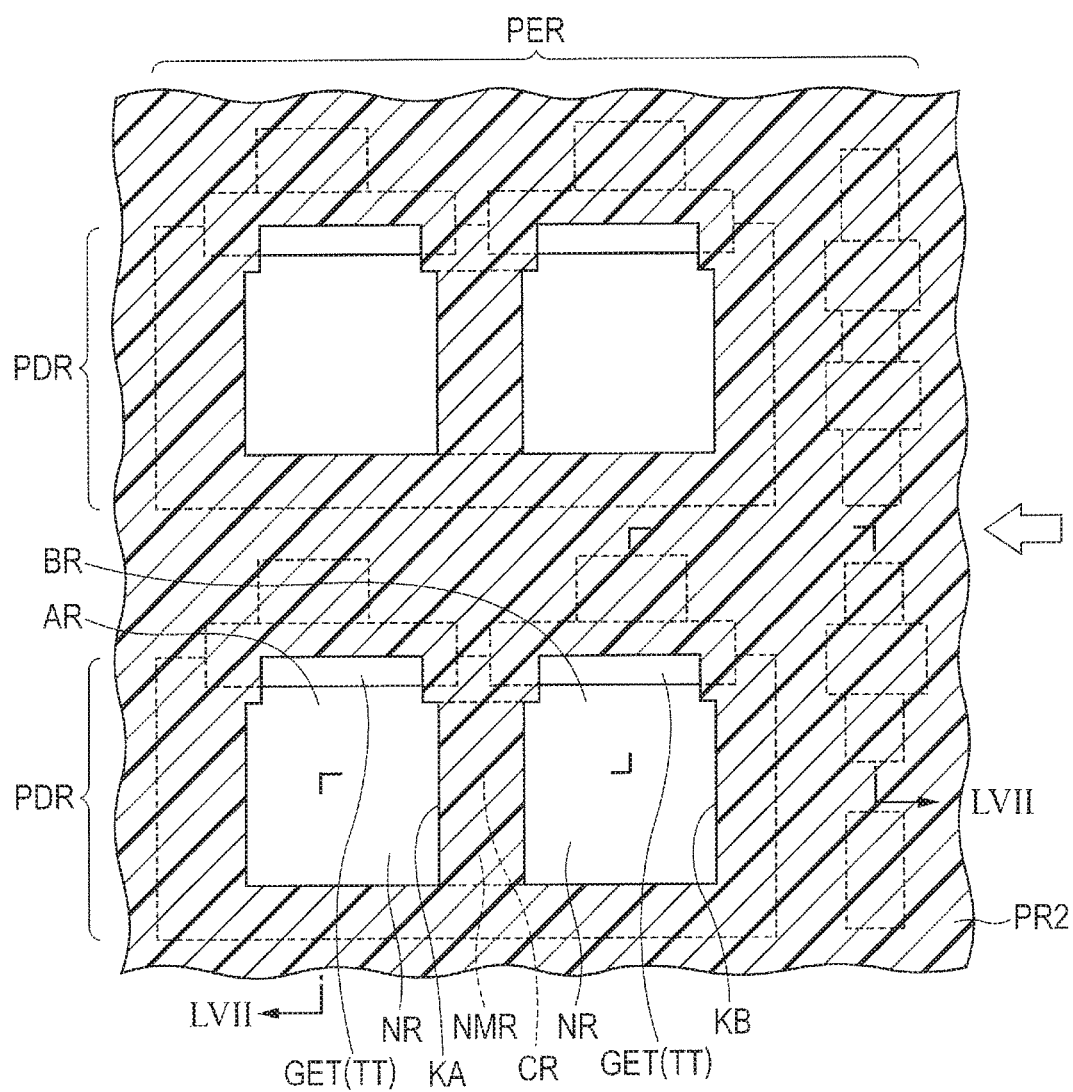
FIG. 56 is a plan view illustrating a step performed after the step illustrated in FIGS. 54 and 55, in Tenth Embodiment.

Subsequently, n-type impurities are injected at an injection angle, having a component (see the bold arrow) in a direction almost perpendicular (left direction with respect to the plane of the paper) to a direction in which the portion of the photoresist pattern PR2 extends (up-down direction with respect to the plane of the paper), by changing a tilt angle or notch angle in an ion injection apparatus, as illustrated in FIGS. 56 and 57. Thereby, the remaining portion of the n-type impurity region NMR is formed from the region BR where the photodiode PDB is to be formed toward the portion of the p-type well PW located directly below the portion of the photoresist pattern PR2.

The n-type impurity region NMR is thus formed directly below the portion of the photoresist pattern PR2. The impurity concentration of the n-type impurity region NMR becomes lower than that of the n-type impurity region NR by the oblique injection. The n-type impurity region NMR is formed to contact each of the n-type impurity region NR on one side and that on the other side. Thereafter, main parts of the imaging device illustrated in FIGS. 50 and 51 are completed by performing steps similar to those illustrated in FIGS. 11 to 13.

In the aforementioned imaging device, the following effects can be obtained in addition to an effect in which the dynamic range of still pictures can be prevented from being decreased.

That is, in a manufacturing method of the aforementioned imaging device, the n-type impurity region NMR is formed by using the photoresist pattern PR2 that is formed as an injection mask when the n-type impurity region NR is formed. Accordingly, it is not necessary to newly form an injection mask (photoresist pattern) for forming the n-type impurity region NMR, whereby an increase in manufacturing cost can be suppressed.

The imaging device and the manufacturing method thereof described in each embodiment can be variously combined if necessary.

The invention made by the present inventors has been specifically described above based on preferred embodiments, but the invention should not be limited to the preferred embodiments, and it is needless to say that various modifications may be made to the invention within a range not departing from the gist of the invention.

Eighth Embodiment includes the following aspect.
[Additional Remarks 1]

A manufacturing method of an imaging device provided with a first photoelectric conversion first part, a first photoelectric conversion second part, a second photoelectric conversion first part, a second photoelectric conversion second part, a third photoelectric conversion first part, and a third photoelectric conversion second part, the manufacturing method including the steps of:

forming, in a semiconductor substrate, each of a first element formation region of a first conductivity type, a second element formation region of the first conductivity type, and a third element formation region of the first conductivity type;

forming a first mask member having a first opening exposing, in the first element formation region, a first region first part where the first photoelectric conversion first part is to be formed, a second opening exposing, in the first element formation region, a first region second part where the first photoelectric conversion second part is to be formed to be spaced apart from the first photoelectric conversion first part, a third opening exposing, in the second element formation region, a second region first part where the second photoelectric conversion first part is to be formed, a fourth opening exposing, in the second element formation region, a second region second part where the second photoelectric conversion second part is to be formed to be spaced apart from the second photoelectric conversion part first part, a fifth opening exposing, in the third element formation region, a third region first part where the third photoelectric conversion first part is to be formed, and a sixth opening exposing, in the third element formation region, a third region second part where the third photoelectric conversion second part is to be formed to be spaced apart from the third photoelectric conversion first part;

injecting a first injection amount of first impurities of a second conductivity type by using the first mask member as an injection mask;

forming a second mask member having a seventh opening continuously exposing, in the first element formation region, the first region first part, the first region second part, and a first region third part of the first element formation region located between the first region first part and the first region second part, an eighth opening continuously exposing, in the second element formation region, the second region first part, the second region second part, and a second region third part of the second element formation region located between the second region first part and the second region second part, and a ninth opening continuously exposing, in the third element formation region, the third region first part, the third region second part, and a third region third part of the third element formation region located between the third region first part and the third region second part; and injecting a second injection amount of second impurities of the second conductivity type by using the second mask member as an injection mask, wherein by the step of injecting the first impurities and the step of injecting the second impurities, a first impurity region first part of the second conductivity type is formed in the first region first part, a first impurity region second part of the second conductivity type is formed in the first region second part, a first impurity region third part of the second conductivity type, having an impurity concentration lower than those of the first impurity region first part and the first impurity region second part, is formed in the first region third part, a second impurity region first part of the second conductivity type is formed in the second region first part, a second impurity region second part of the second conductivity type is formed in the second region second part, a second impurity region third part of the second conductivity type, having an impurity concentration lower than those of the second impurity region first part and the second impurity region second part and being narrower than the first impurity region third part, is formed in the second region third part, a third impurity region first part of the second conductivity type is formed in the third region first part, a third impurity region second part of the second conductivity type is formed in the third region second part, and a third impurity region third part of the second conductivity type, having an impurity concentration lower than those of the third impurity region first part and the third impurity region second part and being narrower than the second impurity region third part, is formed in the third region third part.

Also, Tenth Embodiment includes the following aspect.
[Additional Remarks 2]

A manufacturing method of an imaging device provided with a photoelectric conversion first part and a photoelectric conversion second part, the manufacturing method including the steps of:

forming an element formation region of a first conductivity type in a semiconductor substrate;

forming a mask member having a first opening exposing, in the element formation region, a region first part where the photoelectric conversion first part is to be formed and a second opening exposing, in the element formation region, a region second part where the photoelectric conversion second part is to be formed to be spaced apart from the photoelectric conversion first part;

a first injection step of injecting first impurities of a second conductivity type perpendicularly to the surface of the semiconductor substrate by using the mask member as an injection mask;

a second injection step of injecting the first impurities obliquely from the first opening toward a region third part of the element formation region located between the region first part exposed at the first opening and the region second part exposed at the second opening, by using the mask member as an injection mask; and a third injection step of injecting the first impurities obliquely from the second opening toward the region third part by using the mask member as an injection mask, wherein by performing the first injection step, the second injection step, and the third injection step, an impurity region first part of the second conductivity type is formed in the region first part, an impurity region second part of the second conductivity type is formed in the region second part, and an impurity region third part of the second conductivity type, having an impurity concentration lower than those of the impurity region first part and the impurity region second part, is formed in the region third part.

What is claimed is:
1. An imaging device comprising:
an element formation region of a first conductivity type defined in a semiconductor substrate;
a photoelectric conversion first part including an impurity region first part of a second conductivity type formed in the element formation region;
a photoelectric conversion second part including an impurity region second part of the second conductivity type formed to be spaced apart from the photoelectric conversion first part in the element formation region; and
an impurity region third part of the second conductivity type formed between the photoelectric conversion first part and the photoelectric conversion second part so as to contact the impurity region first part and the impurity region second part,
wherein an impurity concentration of the impurity region third part is lower than those of the impurity region first part and the impurity region second part,
wherein the element formation region includes
a first element formation region,
a second element formation region, and
a third element formation region, and
wherein the photoelectric conversion first part includes
a first photoelectric conversion first part corresponding to light of a first wavelength, formed in the first element formation region,
a second photoelectric conversion first part corresponding to light of a second wavelength shorter than the first wavelength, formed in the second element formation region, and
a third photoelectric conversion first part corresponding to light of a third wavelength shorter than the second wavelength, formed in the third element formation region, and
wherein the photoelectric conversion second part includes
a first photoelectric conversion second part corresponding to light of the first wavelength, formed in the first element formation region,
a second photoelectric conversion second part corresponding to light of the second wavelength, formed in the second element formation region, and
a third photoelectric conversion second part corresponding to light of the third wavelength, formed in the third element formation region, and
wherein the impurity region third part includes
a first impurity region third part formed in the first element formation region,
a second impurity region third part formed in the second element formation region, and
a third impurity region third part formed in the third element formation region.

2. The imaging device according to claim 1,
wherein an impurity concentration of the second impurity region third part is lower than that of the first impurity region third part, and
wherein an impurity concentration of the third impurity region third part is lower that of the second impurity region third part.

3. The imaging device according to claim 1,
wherein the first photoelectric conversion first part includes a first impurity region first part as the impurity region first part, and
wherein the second photoelectric conversion first part includes a second impurity region first part as the impurity region first part, and
wherein the third photoelectric conversion first part includes a third impurity region first part as the impurity region first part, and
wherein the first photoelectric conversion second part includes a first impurity region second part as the impurity region second part, and
wherein the second photoelectric conversion second part includes a second impurity region second part as the impurity region second part, and
wherein the third photoelectric conversion second part includes a third impurity region second part as the impurity region second part, and
wherein a first depth between a surface of the element formation region and a bottom of the first impurity region third part is smaller than those between the surface of the element formation region and a bottom of the first impurity region first part and between the surface of the element formation region and a bottom of the first impurity region second part, and
wherein a second depth between the surface of the element formation region and a bottom of the second impurity region third part is smaller than those between the surface of the element formation region and a bottom of the second impurity region first part and between the surface of the element formation region and a bottom of the second impurity region second part, and
wherein a third depth between the surface of the element formation region and a bottom of the third impurity region third part is smaller than those between the surface of the element formation region and a bottom of the third impurity region first part and between the surface of the element formation region and a bottom of the third impurity region second part, and
wherein the second depth is smaller than the first depth, and
wherein the third depth is smaller than the second depth.

4. The imaging device according to claim 1,
wherein the first photoelectric conversion first part includes a first impurity region first part as the impurity region first part, and
wherein the second photoelectric conversion first part includes a second impurity region first part as the impurity region first part, and
wherein the third photoelectric conversion first part includes a third impurity region first part as the impurity region first part, and
wherein the first photoelectric conversion second part includes a first impurity region second part as the impurity region second part, and
wherein the second photoelectric conversion second part includes a second impurity region second part as the impurity region second part, and
wherein the third photoelectric conversion second part includes a third impurity region second part as the impurity region second part, and
wherein the first photoelectric conversion first part and the first photoelectric conversion second part are spaced apart from each other in a first direction, and each of them extends in a second direction crossing the first direction, and
wherein the second photoelectric conversion first part and the second photoelectric conversion second part are spaced apart from each other in the first direction, and each of them extends in the second direction, and
wherein the third photoelectric conversion first part and the third photoelectric conversion second part are spaced apart from each other in the first direction, and each of them extends in the second direction, and
wherein the first impurity region third part extends in the second direction in a state in which it contacts the first impurity region first part and the first impurity region second part, and
wherein the second impurity region third part extends in the second direction in a state in which it contacts the second impurity region first part and the second impurity region second part, and
wherein the third impurity region third part extends in the second direction in a state in which it contacts the third impurity region first part and the third impurity region second part, and
wherein a first length of the first impurity region third part extending in the second direction is smaller than lengths of the first photoelectric conversion first part and the first photoelectric conversion second part each extending in the second direction, and
wherein a second length of the second impurity region third part extending in the second direction is smaller than lengths of the second photoelectric conversion first part and the second photoelectric conversion second part each extending in the second direction, and
wherein a third length of the third impurity region third part extending in the second direction is smaller than lengths of the third photoelectric conversion first part and the third photoelectric conversion second part each extending in the second direction, and
wherein the second length is smaller than the first length, and
wherein the third length is smaller than the second length.

5. A manufacturing method of an imaging device provided with a photoelectric conversion first part and a photoelectric conversion second part, the manufacturing method comprising the steps of:
forming an element formation region of a first conductivity type in a semiconductor substrate;
forming a first mask member having a first opening exposing, in the element formation region, a region first part where the photoelectric conversion first part is to be formed and a second opening exposing, in the element formation region, a region second part where the photoelectric conversion second part is to be formed to be spaced apart from the photoelectric conversion first part;
injecting a first injection amount of first impurities of a second conductivity type by using the first mask member as an injection mask;
forming a second mask member having a third opening continuously exposing, in the element formation region, the region first part, the region second part, and a region third part of the element formation region located between the region first part and the region second part; and
injecting a second injection amount of second impurities of the second conductivity type by using the second mask member as an injection mask, and
wherein by the step of injecting the first impurities and the step of injecting the second impurities,
an impurity region first part of the second conductivity type is formed in the region first part,
an impurity region second part of the second conductivity type is formed in the region second part, and
an impurity region third part of the second conductivity type, having an impurity concentration lower than those of the impurity region first part and the impurity region second part, is formed in the region third part.

6. The manufacturing method of an imaging device according to claim 5,
wherein injection energy, with which the second impurities are injected into the region first part, the region second part, and the region third part, is lower than injection energy with which the first impurities are injected into the region first part and the region second part.

7. The manufacturing method of an imaging device according to claim 5,
wherein an injection angle, at which the second impurities are injected into the region first part, the region second part, and the region third part, is larger than an injection angle at which the first impurities are injected into the region first part and the region second part.

8. The manufacturing method of an imaging device according to claim 5, comprising the steps of:
performing a first heat treatment after the step of injecting the first impurities; and
performing a second heat treatment after the step of injecting the second impurities.

* * * * *